(12) United States Patent
Nagano et al.

(10) Patent No.: US 7,420,237 B2
(45) Date of Patent: Sep. 2, 2008

(54) CAPACITOR ELEMENT

(75) Inventors: Yoshihisa Nagano, Osaka (JP); Takumi Mikawa, Shiga (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 385 days.

(21) Appl. No.: 11/035,175

(22) Filed: Jan. 14, 2005

(65) Prior Publication Data

US 2005/0167725 A1    Aug. 4, 2005

(30) Foreign Application Priority Data

Jan. 29, 2004    (JP)    ............... 2004-022043

(51) Int. Cl.
*H01L 31/062*    (2006.01)
*H01L 31/113*    (2006.01)
*H01L 27/108*    (2006.01)
*H01L 29/76*     (2006.01)
*H01L 29/94*     (2006.01)

(52) U.S. Cl. .................. 257/295; 257/301; 257/310; 257/311

(58) Field of Classification Search ........... 257/295, 257/310–311, 303–304, 301
See application file for complete search history.

(56) References Cited

U.S. PATENT DOCUMENTS

| | | | |
|---|---|---|---|
| 5,498,562 A * | 3/1996 | Dennison et al. ........... | 438/253 |
| 6,380,579 B1 | 4/2002 | Nam et al. | |
| 6,395,612 B1 | 5/2002 | Amanuma | |
| 6,559,003 B2 * | 5/2003 | Hartner et al. .............. | 438/253 |
| 6,686,620 B2 * | 2/2004 | An et al. ..................... | 257/301 |
| 6,984,861 B2 * | 1/2006 | Yamada et al. ............. | 257/306 |
| 2002/0056864 A1 * | 5/2002 | Agarwal ...................... | 257/296 |
| 2003/0183936 A1 * | 10/2003 | Ito et al. ...................... | 257/758 |

FOREIGN PATENT DOCUMENTS

| | | |
|---|---|---|
| JP | 11-135736 | 5/1999 |
| JP | 2000-286254 | 10/2000 |
| JP | 2001-007303 A | 1/2001 |
| JP | 2003-086771 A | 3/2003 |

* cited by examiner

*Primary Examiner*—Shouxiang Hu
(74) *Attorney, Agent, or Firm*—McDermott Will & Emery LLP

(57) ABSTRACT

A capacitor element is provided which is composed of a lower electrode, an upper electrode formed in opposing relation to the lower electrode, and a capacitor dielectric film made of a ferroelectric material or a high dielectric material and formed between the lower and upper electrodes. The lower electrode, the capacitor dielectric film, and the upper electrode are formed in a region extending at least from within a hole provided in an interlayer insulating film having a first hydrogen barrier film disposed on the upper surface thereof toward a position above the hole. A second hydrogen barrier film in contact with the first hydrogen barrier film is disposed to cover the upper surface of the upper electrode and the side surface of the portion of the upper electrode which has been formed above the hole.

17 Claims, 21 Drawing Sheets

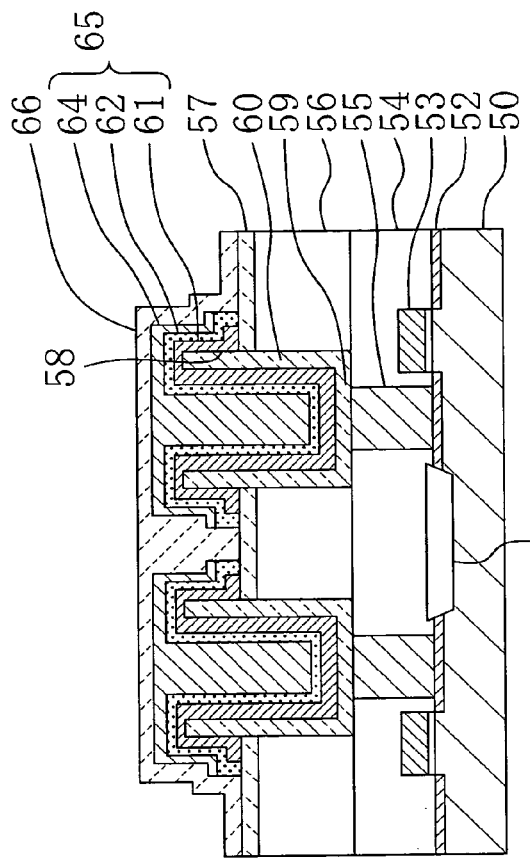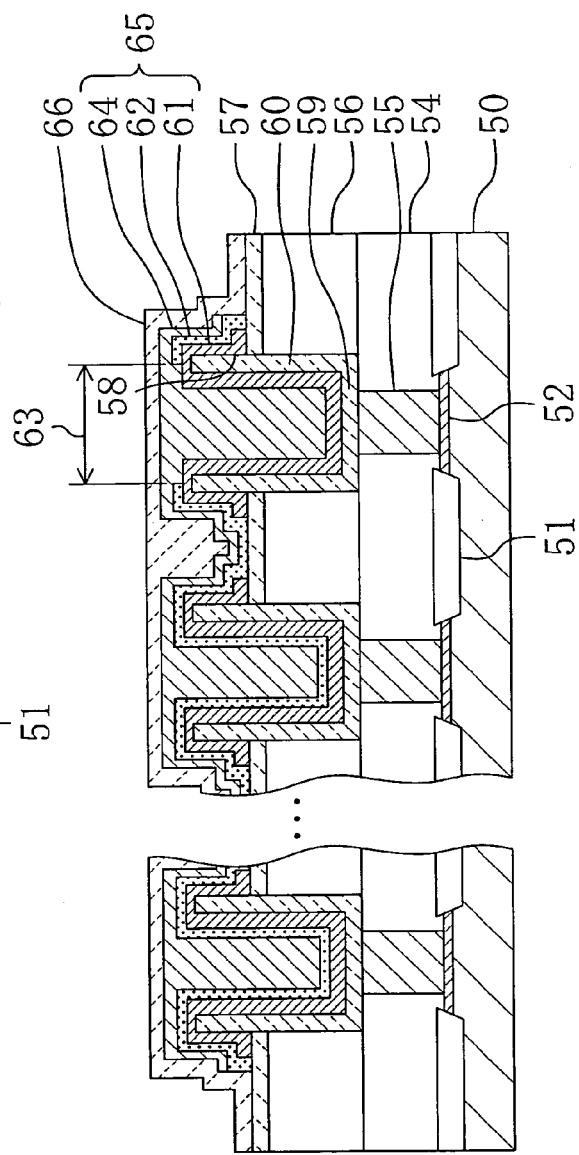
FIG. 12A
FIG. 12B

CAPACITOR ELEMENT

CROSS-REFERENCE TO RELATED APPLICATIONS

This application claims priority under 35 U.S.C. §119 on Patent Application No. 2004-022043 filed in Japan on Jan. 29, 2004, the entire contents of which are hereby incorporated by reference.

BACKGROUND OF THE INVENTION

The present invention relates to a capacitor element having a three-dimensional structure and using a capacitor dielectric film made of a ferroelectric material or a high dielectric material.

To commercialize a RAM which enables high-speed wiring and reading at an unprecedentedly low voltage, vigorous research and development has been made on a ferroelectric material having a characteristic of spontaneous polarization or a high dielectric material. To implement a megabit-class semiconductor memory device to be mounted on an LSI composed of a CMOS with design rules of 0.18 μm or below, in particular, a capacitor element having a three-dimensional structure capable of providing a large capacitance with a small area should be developed. A capacitor element having a three-dimensional structure has such a configuration as termed a depressed, projecting, or cylindrical type and has an extremely large height compared with the width thereof.

Because a ferroelectric or high dielectric material is a metal oxide, it has the problems of easy reduction by hydrogen and consequent degradation of the electric characteristics thereof. To solve the problems, a technology which covers a capacitor element with a hydrogen barrier film capable of preventing the diffusion of hydrogen has recently begun being studied widely.

In view of the foregoing, it is essential for the commercialization of a capacitor element having a three-dimensional structure to develop an optimal structure covered with a hydrogen barrier film for the capacitor element. In this case, an important matter is to implement a structure capable of attaining the following objects derived from a large level difference which is peculiar to a three-dimensional structure.

The first object is to obtain a focus margin in a range achievable with the performance of a stepper in a lithographic step during wiring formation performed after the formation of a capacitor elements by minimizing the level difference even after the formation of a structure covered completely with hydrogen barrier films.

The second object is to obtain a focus margin in a range achievable with the performance of a stepper in a lithographic step performed to form a mask pattern for processing a hydrogen barrier film by minimizing the level difference in the step of forming the hydrogen barrier film covering the upper portion and sidewalls of the capacitor element.

A description will be given to conventional capacitor elements with reference to the drawings.

The description will be given first to a first conventional embodiment (see, e.g., Japanese Laid-Open Patent Publication No. H 11-135736 (paragraphs 0014 through 0021 at pages 4 and 5, FIG. 1 and paragraphs 0028 through 0035 at pages 5 and 6, FIG. 8)) with reference to FIG. 20.

FIG. 20 shows a principal-portion cross-sectional view of the capacitor element having a planar structure according to the first conventional embodiment.

As shown in FIG. 20, a semiconductor substrate 101 is formed with an isolation region 102 and an active region 103. A first interlayer insulating film 104 made of BPSG is formed to cover the semiconductor substrate 101. A first hydrogen barrier film 105 made of SiN is formed on the first interlayer insulating film 104. A capacitor element 109 composed of a lower electrode 106 made of Pt/Ti, a capacitor dielectric film 107 made of $SrBi_2Ta_2O_9$ as a ferroelectric material, and an upper electrode 108 made of Pt which are formed successively in an upward direction is formed on the first hydrogen barrier film 105. The capacitor element 109 has an edge portion located inwardly of the edge portion of the first hydrogen barrier film 105.

A second hydrogen barrier film 110 made of TiN is disposed on the upper electrode 108. A third hydrogen barrier film 111 made of SiN and covering the capacitor element 109 is formed in contact relation with the first and second hydrogen barrier films 105 and 110. A second interlayer insulating film 112 made of $SiO_2$ is formed on the first interlayer insulating film 104 to cover the capacitor element 109 enclosed by the first, second, and third hydrogen barrier films 105, 110, and 111.

A first contact hole 113 reaching the upper layer of the second hydrogen barrier film 110 is formed in the second interlayer insulating film 112 and the third hydrogen barrier film 111. A second contact hole 114 reaching the active region 103 is formed in the first and second interlayer insulating films 104 and 112. A wiring layer 115 for providing connection between the capacitor element 109 and the active region 103 via the first and second contact holes 113 and 114 is formed on the second interlayer insulating film 112.

When the capacitor element 109 has the planar structure which is extremely low in level, complete coverage of the capacitor element 109 with the first hydrogen barrier film 105 disposed in the layer underlying the capacitor element 109, the second hydrogen barrier film 110 disposed in the layer overlying the capacitor element 109, and the third hydrogen barrier film 111 disposed over the upper portion and sidewalls of the capacitor element can easily be realized in the first conventional embodiment. Accordingly, the reduction of the capacitor dielectric film 107 by hydrogen generated in a fabrication step after the formation of the capacitor element 109 can be prevented so that the degradation of the characteristics of the capacitor element 109 is suppressed.

The description will be given next to a second conventional embodiment (see, e.g., Japanese Laid-Open Patent Publication No. H11-135736 (paragraphs 0014 through 0021 at pages 4 and 5, FIG. 1 and paragraphs 0028 through 0035 at pages 5 and 6, FIG. 8)) with reference to FIG. 21.

FIG. 21 shows a principal-portion cross-sectional view of the capacitor element having a projecting three-dimensional structure according to the second conventional embodiment. The same reference numerals will be retained for the components shown in FIG. 21 which are used commonly in the first conventional embodiment.

As shown in FIG. 21, the semiconductor substrate 101 is formed with the isolation region 102 and the active region 103. The first interlayer insulating film 104 made of BPSG is formed to cover the semiconductor substrate 101. The first hydrogen barrier film 105 made of SiN is formed on the first interlayer insulating film 104. A plug 116 reaching the active region 103 is formed in the first hydrogen barrier film 105 and the first interlayer insulating film 104.

The second hydrogen barrier film 117 made of TiN or TaN is formed on the first hydrogen barrier film 105 to be in contact with the upper end of the plug 116. The lower electrode 106 made of Ru is formed on the second hydrogen barrier film 117. The capacitor dielectric film 107 made of $(Ba_xSr_{1-x})TiO_3$ ($0 \leq x \leq 1$) as a high dielectric material is formed to cover the upper portion and sidewalls of the lower electrode 106 and the sidewalls of the second hydrogen barrier film 117. In addition, a third hydrogen barrier film 118 made of TiN is formed to cover the capacitor dielectric film 107 in contact relation with the first hydrogen barrier film 105. The third hydrogen barrier film 118 also functions as the upper electrode. The capacitor element 119 having the projecting three-dimensional structure composed of the lower electrode 106, the capacitor dielectric film 107, and the third hydrogen barrier film (upper electrode) 118 has thus been formed.

Although the capacitor element 119 having the three-dimensional structure with a large level difference is formed, the second conventional embodiment uses substantially the same hydrogen barrier structure as used in the case where the capacitor element 109 having the planar structure which is extremely low in level according to the first conventional embodiment is formed. Specifically, the capacitor element 119 is completely covered with the first and second hydrogen barrier films 105 and 117 disposed in the layers underlying the capacitor element 119 and with the third hydrogen barrier film 118 disposed over the upper portion of the capacitor element 119.

The description will be given next to a third conventional embodiment (see, e.g., Japanese Laid-Open Patent Publication No. 2000-286254 (paragraphs 0133 through 0139 at pages 15 and 16, FIG. 28)) with reference to FIG. 22.

FIG. 22 shows a principal-portion cross-sectional view of the capacitor element having a depressed three-dimensional configuration according to the third conventional embodiment. The depressed three-dimensional configuration has been mainstream in recent DRAMs. Since there is no statement of a hydrogen barrier film in the third conventional embodiment, the description will be given only to matters concerned with the capacitor element. The same reference numerals will be retained for the components shown in FIG. 22 which are used commonly in the first conventional embodiment.

As shown in FIG. 22, the semiconductor substrate 101 is formed with the isolation region 102 and the active regions 103. A first interlayer insulating film 120 made of SOG is formed to cover the semiconductor substrate 101. First plug 121 made of polysilicon and reaching the active regions 103 are formed in the first interlayer insulating film 120. A second interlayer insulating film 122 made of SOG is formed on the first interlayer insulating film 120. Second plugs 123 made of polysilicon and having lower ends thereof connected to the upper ends of the first plugs 121 are formed in the second interlayer insulating film 122. A third interlayer insulating film 124 made of SiN is formed on the second interlayer insulating film 122. A fourth interlayer insulating film 125 made of $SiO_2$ is formed on the third interlayer insulating film 124.

Holes 126 for exposing the upper ends of the second plugs 123 are formed in the third and fourth interlayer insulating films 124 and 125. Since the lower electrodes 127 of the capacitor elements, which will be described later, are formed along the inner walls of the holes 126, the depth of each of the holes 126 should be maximized to increase the surface area of each of the lower electrodes 127 and increase the capacitance. This requires the fourth interlayer insulating film 125 formed with the holes 126 to have a thickness of about 1.3 μm.

The lower electrodes 127 made of polysilicon are formed on the inner walls of the holes 126. A capacitor dielectric film 128 made of $Ta_2O_5$ is formed over the respective surfaces of the lower electrodes 127 and the fourth interlayer insulating film 125. An upper electrode 129 made of TiN is formed on the upper surface of the capacitor dielectric film 128. Capacitor elements 130 each composed of the depressed three-dimensional structure composed of the lower electrode 127, the capacitor dielectric film 128, and the upper electrode 129 have thus been formed.

The description will be given next to the fourth conventional embodiment (see, e.g., U.S. Pat. No. 6,380,579 (line 55 in column 1 through line 55 in column 2 at page 11, FIG. 3)) with reference to FIG. 23.

FIG. 23 is a principal-portion cross-sectional view of the capacitor element having a cylindrical three-dimensional configuration according to the fourth conventional embodiment. The cylindrical three-dimensional configuration has been mainstream in recent DRAMs. Since there is no statement of a hydrogen barrier film in the fourth conventional embodiment, the description will be given only to matters concerned with the capacitor element. The same reference numerals will be retained for the components shown in FIG. 23 which are used commonly in the first conventional embodiment.

As shown in FIG. 23, the interlayer insulating film 104 made of $SiO_2$ is formed on the semiconductor substrate 101. The plug 116 made of tungsten is formed in the interlayer insulating film 104. The lower electrode 106 serving as a storage node and having a cylindrical configuration is formed on the interlayer insulating film 104 to have a lower surface thereof in contact with the upper end of the plug 116. The lower electrode 106 is made of Pt or $RuO_2$. The capacitor dielectric film 107 made of $Ta_2O_5$, $(Ba_{1-x}Sr_x)TiO_3$, or $Pb(Zr_xTi_{1-x})O_3$ ($0 \leq x \leq 1$) is formed over the respective surfaces of the lower electrode 106 and the interlayer insulating film 104. The upper electrode 108 serving as a plate electrode is formed on the surface of the capacitor dielectric film 107. The capacitor dielectric film 107 and the upper electrode 108 cover the bottom, upper, inner side, and outer side surfaces of the lower electrode 106. Since a capacitor element 131 thus composed of the cylindrical three-dimensional structure has a large surface area, it can provide a large capacitance.

SUMMARY OF THE INVENTION

However, because a structure in which a capacitor element composed of a three-dimensional structure using a ferroelectric or high dielectric material for a capacitor dielectric film is covered completely with a hydrogen barrier film cannot easily be implemented by using the conventional capacitor elements described above, a high-performance and high-integration semiconductor memory device cannot be commercialized.

The reasons for this will be described herein below in detail.

In the capacitor element having the planar structure used in the first conventional embodiment, the height of the capacitor element is extremely small. This allows easy obtention of a focus margin in a range achievable with the performance of a stepper in a lithographic step during wiring formation, which is performed after the formation of the capacitor elements, even after the formation of the structure in which the capacitor element is covered completely with the hydrogen barrier films. This also allows easy obtention of a focus margin in a range achievable with the performance of a stepper in a lithographic step performed to form a mask pattern when the hydrogen barrier film disposed over the capacitor element and connected to the hydrogen barrier film disposed thereunder is processed.

In the capacitor element having the projecting three-dimensional structure used in the second conventional embodiment, however, the capacitor element is required to have a height of about 1 µm so that it is extremely difficult to reduce the level difference resulting from the height of the capacitor element over the entire surface of a wafer. Accordingly, it becomes extremely difficult to obtain a focus margin in a range achievable with the performance of a stepper in a lithographic step during wiring formation performed after the formation of the capacitor elements. It also becomes extremely difficult to obtain a focus margin in a range achievable with the performance of a stepper in a lithographic step performed to form a mask pattern when the hydrogen barrier film disposed over the capacitor element and connected to the hydrogen barrier film disposed thereunder is processed.

On the other hand, each of the capacitor elements having the depressed three-dimensional structure used in the third conventional embodiment is formed in the hole so that a level difference is hardly produced. In the case where the capacitor element is not covered with hydrogen barrier films, it is extremely easy to obtain a focus margin in a lithographic step during wiring formation performed after the formation of the capacitor elements.

In the third conventional embodiment, however, the structure using hydrogen barrier films is not disclosed as described above. In view of this, consideration will be given to the application of a structure in which the capacitor element disclosed in the third conventional embodiment is covered completely with hydrogen barrier films, specifically a structure in which a hydrogen barrier film disposed under the capacitor element and a hydrogen barrier film disposed to cover the upper portion or sidewalls thereof are connected under the capacitor element to the capacitor element having the depressed three-dimensional structure.

FIG. 24 is a principal-portion cross-sectional view showing an assumed structure in which the capacitor element according to the third conventional embodiment is covered with hydrogen barrier films. The same reference numerals will be retained for the components shown in FIG. 24 which are common to the components shown in FIG. 22 and the description of the components common to those shown in FIG. 22 will not be repeated.

As shown in FIG. 24, a first hydrogen barrier film 132 is disposed in the layer underlying the capacitor elements 130 each having the depressed three-dimensional structure and a second hydrogen barrier film 133 is further disposed to cover the upper portions and sidewalls of the capacitor elements 130. The second hydrogen barrier film 133 is connected to the upper surface of the first hydrogen barrier film 132.

In the case where the structure shown in FIG. 24 is used, a level difference which is not observed in the case where the hydrogen barrier films are not formed (see FIG. 23) is inevitably produced. Specifically, a level difference of about 1.3 µm corresponding to the height of the capacitor element 130 is produced. When such a large level difference is produced, it becomes extremely difficult to reduce the level difference over the entire surface of the wafer in the same manner as in the case of the second conventional embodiment. Accordingly, it becomes extremely difficult to obtain a focus margin in a range achievable with the performance of a stepper in a lithographic step during wiring formation performed after the formation of the capacitor elements. It also becomes extremely difficult to obtain a focus margin in a range achievable with the performance of a stepper in a lithographic step performed to form a mask pattern when the hydrogen barrier film disposed over the capacitor element and connected to the hydrogen barrier film disposed thereunder is processed.

In the capacitor element having the cylindrical three-dimensional configuration used in the fourth conventional embodiment also, the capacitor element is required to have a height of about 1 µm to provide a larger capacitance so that it is extremely difficult to reduce a level difference resulting from the height of the capacitor element over the entire surface of the wafer. Since there is no statement of a hydrogen barrier film in the fourth conventional embodiment, consideration will be given to the application of a structure in which the capacitor element disclosed in the fourth conventional embodiment is covered completely with hydrogen barrier films, specifically a structure in which a hydrogen barrier film disposed under the capacitor element and a hydrogen barrier film disposed to cover the upper portion or sidewalls of the capacitor element are connected under the capacitor element to the capacitor element having the cylindrical three-dimensional structure.

FIG. 25 is a principal-portion cross-sectional view showing an assumed structure in which the capacitor element according to the fourth conventional embodiment is covered with hydrogen barrier films. The same reference numerals will be retained for the components shown in FIG. 25 which are common to the components shown in FIG. 23 and the description of the components common to those shown in FIG. 23 will not be repeated.

As shown in FIG. 25, a first hydrogen barrier film 134 is disposed in the layer underlying the capacitor element 131 having the cylindrical three-dimensional structure and a second hydrogen barrier film 135 is further disposed to cover the upper portion and sidewalls of the capacitor element 131. The second hydrogen barrier film 135 is connected to the upper surface of the first hydrogen barrier film 134.

In the case where the structure shown in FIG. 25 is used, a level difference corresponding to the height of the capacitor element 131, specifically a level difference of about 1 µm is produced at the connecting portion between the first and second hydrogen barrier films 134 and 135. When such a large level difference is produced, it becomes extremely difficult to reduce the level difference over the entire surface of a wafer. Accordingly, it becomes extremely difficult to obtain a focus margin in the range achievable with the performance of a stepper in a lithographic step during wiring formation performed after the formation of the capacitor elements. In the processing of a second hydrogen barrier film disposed over the capacitor element and connected to the first hydrogen barrier film disposed thereunder also, it becomes extremely difficult to obtain a focus margin in the range achievable with the performance of a stepper in a lithographic step performed to form a mask pattern.

Thus, with the capacitor elements having the three-dimensional structures shown in the conventional embodiments, it is impossible to implement a structure covered optimally with hydrogen barrier films which can attain the objects derived from the characteristic configurations of the three-dimensional structures. This leads to the problem that a high-performance and high-integration capacitor element using a capacitor dielectric film made of a ferroelectric or high dielectric material cannot be commercialized.

In view of the foregoing, it is therefore an object of the present invention to provide a capacitor element having a structure covered with hydrogen barrier films and a fabrication method therefor without producing a level difference. The arrangement prevents the degradation of the characteristics of the capacitor dielectric film by hydrogen and implements a capacitor element having excellent characteristics and a fabrication method therefor.

To attain the object, a first capacitor element according to the present invention includes: a lower electrode; an upper electrode formed in opposing relation to the lower electrode;

and a capacitor dielectric film made of a ferroelectric material or a high dielectric material and formed between the lower electrode and the upper electrode, wherein each of the lower electrode, the capacitor dielectric film, and the upper electrode is formed in a region extending at least from within a hole provided in an interlayer insulating film having a first hydrogen barrier film disposed on an upper surface thereof toward a position above the hole and a second hydrogen barrier film in contact with the first hydrogen barrier film is disposed to cover an upper surface of the upper electrode and a side surface of a portion of the upper electrode which has been formed at the position above the hole.

In the first capacitor element, the second hydrogen barrier film covering the upper and side surfaces of the capacitor element is connected to the first hydrogen barrier film disposed in the uppermost layer of the interlayer insulating film which is positioned higher in level than the bottom surface of the capacitor element so that a large level difference as shown in the conventional embodiments is no more produced. This allows easy obtention of a focus margin in the range achievable with the performance of a stepper in a lithographic step during wiring formation performed after the formation of the capacitor elements. In the processing of the second hydrogen barrier film also, a focus margin in the range achievable with the performance of a stepper can also be obtained easily in a lithographic step performed to form a mask pattern. Since the capacitor element is covered with the first and second hydrogen barrier films, the degradation of the characteristics of the capacitor element resulting from the reduction of the capacitor dielectric film by hydrogen can be suppressed. Thus, a high-performance capacitor element having a three-dimensional structure which is large in capacitance and small in area can be implemented by a simple and easy method.

In the first capacitor element, a third hydrogen barrier film in contact with the first hydrogen barrier film is preferably disposed on a sidewall of the hole.

The arrangement allows coverage of the capacitor element with the first, second, and third hydrogen barrier films without producing a large level difference. Since the third hydrogen barrier film can particularly prevent the diffusion of hydrogen from the interlayer insulating film into the side surface of the capacitor element, the degradation of the characteristics of the capacitor element resulting from the reduction of the capacitor dielectric film by hydrogen can more reliably be suppressed.

In the first structure in which the third hydrogen barrier film in contact with the first hydrogen barrier film is disposed on the sidewall of the hole in the first capacitor element, a fifth hydrogen barrier film having an upper surface of a size not smaller than a bottom portion of the hole is preferably disposed under the hole and the fifth hydrogen barrier film and the third hydrogen barrier film are preferably in contact with each other.

The arrangement allows complete coverage of the capacitor element with the first, second, third, and fifth hydrogen barrier films. Since the fifth hydrogen barrier film can particularly prevent the diffusion of hydrogen into the capacitor element from therebelow, the degradation of the characteristics of the capacitor element resulting from the reduction of the capacitor dielectric film by hydrogen can more reliably be prevented.

Preferably, the lower-layer insulating film provided with a buried plug made of a conductive material is further formed under the interlayer insulating film and the buried plug has an upper end thereof in contact with a lower surface of the fifth hydrogen barrier film. Additionally in this case, a seventh hydrogen barrier film is preferably disposed in an uppermost layer of the buried plug in addition and the seventh hydrogen barrier film is preferably in contact with the fifth hydrogen barrier film.

Even when the plug contact providing connection between the capacitor element and the substrate is provided, the capacitor element can thus be covered completely with the hydrogen barrier films. In addition, the barrier property against the diffusion of hydrogen into the capacitor element from the plug contact can further be enhanced.

Preferably, a sixth hydrogen barrier film formed to surround the buried plug is further disposed in an uppermost layer of the lower-layer insulating film and the sixth hydrogen barrier film is in contact with the fifth hydrogen barrier film. Additionally in this case, a seventh hydrogen barrier film is preferably disposed in an uppermost layer of the buried plug and the seventh hydrogen barrier film is preferably in contact with the fifth hydrogen barrier film.

The arrangement can further enhance the barrier property against the diffusion of hydrogen into the capacitor element from therebelow. The arrangement is particularly effective in preventing the diffusion of hydrogen from the lower-layer insulating film.

In the first structure in the first capacitor element, a lower-layer insulating film provided with a buried plug made of a conductive material is preferably formed under the interlayer insulating film and the buried plug preferably has an upper end thereof in contact with a bottom portion of the hole. Additionally in this case, a seventh hydrogen barrier film may also be disposed in an uppermost layer of the buried plug and the seventh hydrogen barrier film may also be in contact with the bottom portion of the hole.

The arrangement can enhance the barrier property against the diffusion of hydrogen into the capacitor element from the plug contact.

Preferably, a sixth hydrogen barrier film formed to surround the buried plug is further disposed in an uppermost layer of the lower-layer insulating film and the sixth hydrogen barrier film is in contact with the bottom portion of the hole.

The arrangement can enhance the barrier property against the diffusion of hydrogen into the capacitor element from therebelow. The arrangement is particularly effective in preventing the diffusion of hydrogen from the lower-layer insulating film.

Preferably, a seventh hydrogen barrier film is further disposed in an uppermost layer of the buried plug and the seventh hydrogen barrier film is in contact with the bottom portion of the hole.

The arrangement can enhance the barrier property against the diffusion of hydrogen into the capacitor element from the plug contact.

In the first capacitor element, a third hydrogen barrier film in contact with the first hydrogen barrier film is preferably disposed on a sidewall of the hole and a fourth hydrogen barrier film in contact with the third hydrogen barrier film is preferably disposed on a bottom portion of the hole.

The arrangement allows complete coverage of the capacitor element with the first, second, third, and fourth hydrogen barrier films without producing a large level difference.

Since the fourth hydrogen barrier film can particularly prevent the diffusion of hydrogen into the capacitor element from therebelow, the degradation of the characteristics of the capacitor element resulting from the reduction of the capacitor dielectric film by hydrogen can more reliably be suppressed.

The second structure in which the third hydrogen barrier film in contact with the first hydrogen barrier film is disposed on the sidewall of the hole and the fourth hydrogen barrier film in contact with the third hydrogen barrier film is disposed on the bottom portion of the hole in the first capacitor element may also be provided appropriately with the following structures.

That is, in the second structure, the structure may be provided appropriately in which a lower-layer insulating film provided with a buried plug made of a conductive material is formed under the interlayer insulating film and the buried plug has an upper end thereof in contact with a bottom portion of the hole. Additionally in this case, the structure may also be provided appropriately in which a seventh hydrogen barrier film is disposed in an uppermost layer of the buried plug and the seventh hydrogen barrier film is in contact with the bottom portion of the hole. The arrangement can enhance the barrier property against the diffusion of hydrogen into the capacitor element from the plug contact. The structure may also be provided appropriately in which a sixth hydrogen barrier film formed to surround the buried plug is further disposed in an uppermost layer of the lower-layer insulating film and the sixth hydrogen barrier film is in contact with the bottom portion of the hole. The arrangement can enhance the barrier property against the diffusion of hydrogen into the capacitor element from therebelow. The arrangement is particularly effective in preventing the diffusion of hydrogen from the lower-layer insulating film. The structure may also be provided appropriately in which a seventh hydrogen barrier film is further disposed in an uppermost layer of the buried plug and the seventh hydrogen barrier film is in contact with the bottom portion of the hole. The arrangement can enhance the barrier property against the diffusion of hydrogen into the capacitor element from the plug contact.

In the second structure in the first capacitor element, a fifth hydrogen barrier film in contact with at least the fourth hydrogen barrier film is preferably disposed under the hole.

The arrangement can enhance the barrier property against the diffusion of hydrogen into the capacitor element from therebelow.

In this case, the following structures can further be provided.

That is, the structure may also be provided appropriately in which a lower-layer insulating film provided with a buried plug made of a conductive material is formed under the interlayer insulating film and the buried plug has an upper end thereof in contact with a lower surface of the fifth hydrogen barrier film. Even when the plug contact providing connection between the capacitor element and the substrate is provided, the capacitor element can thus be covered completely with the hydrogen barrier films. The structure may also be provided appropriately in which a sixth hydrogen barrier film formed to surround the buried plug is further disposed in an uppermost layer of the lower-layer insulating film and the sixth hydrogen barrier film is in contact with the fifth hydrogen barrier film. Additionally in this case, the structure may also be provided appropriately in which a seventh hydrogen barrier film is disposed in an uppermost layer of the buried plug and the seventh hydrogen barrier film is in contact with the fifth hydrogen barrier film. The arrangement can further enhance the barrier property against the diffusion of hydrogen into the capacitor element from therebelow. The arrangement is particularly effective in preventing the diffusion of hydrogen from the lower-layer insulating film. The structure may also be provided appropriately in which a seventh hydrogen barrier film is further disposed in an uppermost layer of the buried plug and the seventh hydrogen barrier film is in contact with the fifth hydrogen barrier film. The arrangement can enhance the barrier property against the diffusion of hydrogen into the capacitor element from the plug contact.

To solve the foregoing problems, a second capacitor element according to the present invention includes: a lower electrode; an upper electrode formed in opposing relation to the lower electrode; and a capacitor dielectric film made of a ferroelectric material or a high dielectric material and formed between the lower electrode and the upper electrode, wherein each of the lower electrode, the capacitor dielectric film, and the upper electrode is formed in a region extending at least from within a hole provided in an interlayer insulating film having a first hydrogen barrier film disposed on an upper surface thereof toward a position above the hole, a second hydrogen barrier film in contact with the first hydrogen barrier film is disposed to cover an upper surface of the upper electrode and a side surface of a portion of the upper electrode which has been formed at the position above the hole, a third hydrogen barrier film having an upper surface thereof extending to a position higher in level than an upper surface of the first hydrogen barrier film is disposed between a sidewall of the hole and the lower electrode, and the first hydrogen barrier film is in contact with an outer side surface of the third hydrogen barrier film.

In the second capacitor element, the second hydrogen barrier film covering the upper and side surfaces of the capacitor element is connected to the first hydrogen barrier film disposed in the uppermost layer of the interlayer insulating film which is positioned higher in level than the bottom surface of the capacitor element so that a large level difference as shown in the conventional embodiment is no more produced. This allows easy obtention of a focus margin in the range achievable with the performance of a stepper in a lithographic step during wiring formation performed after the formation of the capacitor elements. In the processing of the second hydrogen barrier film also, a focus margin in the range achievable with the performance of a stepper can also be obtained easily in a lithographic step performed to form a mask pattern. Since the capacitor element is covered with the first, second, and third hydrogen barrier films, the degradation of the characteristics of the capacitor element resulting from the reduction of the capacitor dielectric film by hydrogen diffused from above the capacitor element or sideways thereof can be suppressed. Thus, a high-performance capacitor element having a three-dimensional structure which is large in capacitance and small in area can be implemented by a simple and easy method.

In the second capacitor element, each of the lower electrode, the capacitor dielectric film, and the upper electrodes preferably extends from the position above the hole onto the upper surface of the third hydrogen barrier film along the upper and outer side surfaces of the third hydrogen barrier film and each of structures, which will be described herein below, may be provided appropriately.

The arrangement can increase the area of the capacitor element. Accordingly, it becomes possible to implement a capacitor element with a large capacitance and suppress the degradation of the characteristics of the capacitor element resulting from the reduction of the capacitor dielectric film by hydrogen.

In the second capacitor element, a fourth hydrogen barrier film in contact with the third hydrogen barrier film is disposed between a bottom portion of the hole and the lower electrode.

The arrangement allows coverage of the capacitor element with the first, second, third, and fourth hydrogen barrier films without producing a large level difference. Since the fourth hydrogen barrier film can particularly prevent the diffusion of hydrogen into the capacitor element from therebelow, the degradation of the characteristics of the capacitor element resulting from the reduction of the capacitor dielectric film by hydrogen can more reliably be suppressed.

In the first structure in which the fourth hydrogen barrier film in contact with the third hydrogen barrier film is disposed between the bottom portion of the hole and the lower electrode in the second capacitor element, a fifth hydrogen barrier film having an upper surface of a size not smaller than a bottom portion of the hole is preferably disposed under the hole and the fifth hydrogen barrier film and the third hydrogen barrier film are preferably in contact with each other.

The arrangement allows complete coverage of the capacitor element with the first, second, third, and fifth hydrogen barrier films. Since the fifth hydrogen barrier film can particularly prevent the diffusion of hydrogen into the capacitor element from therebelow, the degradation of the characteristics of the capacitor element resulting from the reduction of the capacitor dielectric film by hydrogen can more reliably be prevented.

Preferably, a lower-layer insulating film provided with a buried plug made of a conductive material is further formed under the interlayer insulating film and the buried plug has an upper end thereof in contact with a lower surface of the fifth hydrogen barrier film.

Even when the plug contact providing connection between the capacitor element and the semiconductor substrate is provided, the capacitor element can thus be covered completely with the hydrogen barrier films.

Preferably, a sixth hydrogen barrier film formed to surround the buried plug is further disposed in an uppermost layer of the lower-layer insulating film and the sixth hydrogen barrier film is in contact with the fifth hydrogen barrier film.

The arrangement can further enhance the barrier property against the diffusion of hydrogen into the capacitor element from therebelow. The arrangement is particularly effective in preventing the diffusion of hydrogen from the lower-layer insulating film.

Preferably a seventh hydrogen barrier film is further disposed in an uppermost layer of the buried plug and the seventh hydrogen barrier film is in contact with the fifth hydrogen barrier film.

The arrangement can enhance the barrier property against the diffusion of hydrogen into the capacitor element from the plug contact.

In the first structure in the second capacitor element, a lower-layer insulating film provided with a buried plug made of a conductive material is preferably formed under the interlayer insulating film and the buried plug preferably has an upper end thereof in contact with a bottom portion of the hole. Additionally in this case, a seventh hydrogen barrier film is preferably disposed in an uppermost layer of the buried plug and the seventh hydrogen barrier film is preferably in contact with the bottom portion of the hole.

The arrangement can prevent the degradation of the characteristics of the capacitor element even when the plug contact providing connection between the capacitor element and the semiconductor substrate is provided.

Preferably, a sixth hydrogen barrier film formed to surround the buried plug is further disposed in an uppermost layer of the lower-layer insulating film and the sixth hydrogen barrier film is in contact with the bottom portion of the hole.

The arrangement can enhance the barrier property against the diffusion of hydrogen into the capacitor element from therebelow.

Preferably, a seventh hydrogen barrier film is further disposed in an uppermost layer of the buried plug and the seventh hydrogen barrier film is in contact with the bottom portion of the hole.

In the second capacitor element, a lower-layer insulating film provided with a buried plug made of a conductive material is preferably formed under the interlayer insulating film and the buried plug preferably has an upper end thereof in contact with a bottom portion of the hole. In addition, a seventh hydrogen barrier film may also be disposed in an uppermost layer of the buried plug and the seventh hydrogen barrier film may also be in contact with the bottom portion of the hole.

The arrangement can prevent the degradation of the characteristics of the capacitor element even when the plug contact providing connection between the capacitor element and the semiconductor substrate is provided.

In the second structure in which the lower-layer insulating film provided with the buried plug is formed under the interlayer insulating film and the upper end of the buried plug is in contact with the bottom portion of the hole in the second capacitor element, a sixth hydrogen barrier film formed to surround the buried plug is preferably disposed in an uppermost layer of the lower-layer insulating film and the sixth hydrogen barrier film is preferably in contact with the bottom portion of the hole.

The arrangement can enhance the barrier property against the diffusion of hydrogen into the capacitor element from therebelow.

Preferably, a seventh hydrogen barrier film is further disposed in an uppermost layer of the buried plug and the seventh hydrogen barrier film is in contact with the bottom portion of the hole.

In the second capacitor element, a fifth hydrogen barrier film having an upper surface of a size not smaller than a bottom portion of the hole is preferably disposed under the hole and the fifth hydrogen barrier film and the third hydrogen barrier film are preferably in contact with each other.

The arrangement allows complete coverage of the capacitor element with the first, second, third, and fifth hydrogen barrier films. Since the fifth hydrogen barrier film can particularly prevent the diffusion of hydrogen into the capacitor element from therebelow, the degradation of the characteristics of the capacitor element resulting from the reduction of the capacitor dielectric film by hydrogen can more reliably be suppressed.

In the third structure in which the fifth hydrogen barrier film having an upper surface of a size not smaller than the size of the bottom portion of the hole is disposed under the hole and the fifth and third hydrogen barrier films are in contact in the second capacitor element, the following structures can further be provided.

That is, a lower-layer insulating film provided with a buried plug made of a conductive material is preferably formed under the interlayer insulating film and the buried plug preferably has an upper end thereof in contact with a bottom portion of the hole. Additionally in this case, the structure may also be provided appropriately in which a seventh hydrogen barrier film is disposed in an uppermost layer of the buried plug and the seventh hydrogen barrier film is in contact with the bottom portion of the hole. The arrangement can prevent the degradation of the characteristics of the capacitor element even when the plug contact providing connection between the capacitor element and the semiconductor substrate is provided. The structure may also be provided appropriately in which a sixth hydrogen barrier film formed to surround the buried plug is further disposed in an uppermost layer of the lower-layer insulating film and the sixth hydrogen barrier film is in contact with the bottom portion of the hole. The arrangement can enhance the barrier property against the diffusion of hydrogen into the capacitor element from therebelow. The structure may also be provided appropriately in which a seventh hydrogen barrier film is further disposed in an uppermost layer of the buried plug and the seventh hydrogen barrier film is in contact with the bottom portion of the hole. The structure may also be provided appropriately in which a seventh hydrogen barrier film is disposed in an uppermost layer of the buried plug and the seventh hydrogen barrier film is in contact with the bottom portion of the hole.

Each of the first and second capacitor elements having the foregoing structures may also have the following characteristics.

First, in the first or second capacitor element, when a conductive material is used for the third hydrogen barrier film which is in contact with the lower electrode, the third hydrogen barrier film can have not only the hydrogen barrier property but also the function of conducting electricity to the lower electrode.

When a conductive material is used for each of the third and fourth hydrogen barrier films which are in contact with the lower electrode, each of the third and fourth hydrogen barrier films can have not only the hydrogen barrier property but also the function of conducting electricity to the lower electrode.

Preferably, the fourth hydrogen barrier film is the film which prevents diffusion of not only hydrogen but also oxygen. The arrangement can prevent an increase in contact resistance resulting from the diffusion of oxygen into the plug contact providing connection between the lower electrode and the substrate during annealing in an oxygen atmosphere at a high temperature of 600° C. or more which is required for the crystallization of a ferroelectric or high dielectric material.

When the seventh hydrogen barrier film is in contact with the sixth hydrogen barrier film, the barrier property against the diffusion of hydrogen into the capacitor element from therebelow can be enhanced. Preferably, the first hydrogen barrier film contains any one material or a plurality of materials selected from the group consisting of SiN, SiON, $Al_2O_3$, TiAlO, TaAlO, TiSiO, and TaSiO.

Preferably, the second hydrogen barrier film contains any one material or a plurality of materials selected from the group consisting of SiN, SiON, $Al_2O_3$, TiAlO, TaAlO, TiSiO, TaSiO, TiAlN, TiAlON, TiSiN, TiSiON, TaAlN, TaAlON, TaSiN, TaSiON, Ti, and Ta.

Preferably, the third hydrogen barrier film contains any one material or a plurality of materials selected from the group consisting of SiN, SiON, $Al_2O_3$, TiAlO, TaAlO, TiSiO, TaSiO, TiAlN, TiAlON, TiSiN, TiSiON, TaAlN, TaAlON, TaSiN, TaSiON, Ti, and Ta.

Preferably, the fourth hydrogen barrier film contains any one material or a plurality of materials selected from the group consisting of SiN, SiON, $Al_2O_3$, TiAlO, TaAlO, TiSiO, TaSiO, TiAlN, TiAlON, TiSiN, TiSiON, TaAlN, TaAlON, TaSiN, TaSiON, Ti, and Ta.

Preferably, the fifth hydrogen barrier film contains any one material or a plurality of materials selected from the group consisting of SiN, SiON, $Al_2O_3$, TiAlO, TaAlO, TiSiO, TaSiO, TiAlN, TiAlON, TiSiN, TiSiON, TaAlN, TaAlON, TaSiN, TaSiON, Ti, and Ta.

Preferably, the sixth hydrogen barrier film contains any one material or a plurality of materials selected from the group consisting of SiN, SiON, $Al_2O_3$, TiAlO, TaAlO, TiSiO, and TaSiO.

Preferably, the seventh hydrogen barrier film contains any one material or a plurality of materials selected from the group consisting of TiAlN, TiSiN, TaAlN, TaSiN, Ti, and Ta.

In the first or second capacitor element, the conductive material is preferably polysilicon or tungsten.

Preferably, the capacitor dielectric film is made of $SrBi_2(Ta_xNb_{1-x})_2O_9$, $Pb(Zr_xTi_{1-x})O_3$, $(Bi_xLa_{1-x})_4Ti_3O_{12}$, $(Ba_xSr_{1-x})TiO_3$ (where $0 \leq x \leq 1$), or $Ta_2O_5$.

Preferably, the lower electrode contains a single-layer film made of any one precious metal material selected from the group consisting of Pt, Ir, and Ru or a multilayer film made of a plurality of precious metal materials selected from the group consisting of Pt, Ir, and Ru.

Preferably, the lower electrode contains a conductive oxygen barrier layer and the conductive oxygen barrier layer contains a single-layer film made of any one material selected from the group consisting of Ir, $IrO_2$, Ru, $RuO_2$, TiAlN, TaAlN, TiSiN, and TaSiN or a multilayer film made of a plurality of materials selected from the group consisting of Ir, $IrO_2$, Ru, $RuO_2$, TiAlN, TaAlN, TiSiN, and TaSiN.

Preferably, the upper electrode contains a single-layer film made of any one precious metal material selected from the group consisting of Pt, Ir, and Ru or a multilayer film made of a plurality of precious metal materials selected from the group consisting of Pt, Ir, and Ru.

By thus selecting an optimal material for the structure of the capacitor element, the capacitor element having a three-dimensional structure which is high in performance and large in capacitance can be implemented.

In the second capacitor element, a distance from an upper surface of the first hydrogen barrier film to an uppermost surface of the second hydrogen barrier film is preferably in a range of 20 nm to 200 nm.

To solve the foregoing problem, a first method for fabricating a capacitor element according to the present invention includes the steps of: forming an interlayer insulating film on a substrate; forming a first hydrogen barrier film on the interlayer insulating film;

forming a contact hole in the first hydrogen barrier film and in the interlayer insulating film; forming a second hydrogen barrier film in contact with the first hydrogen barrier film to cover sidewalls of the contact hole and a bottom portion thereof; successively forming a lower electrode, a capacitor dielectric film made of a ferroelectric material or a high dielectric material, and an upper electrode to cover the second hydrogen barrier film; and forming a third hydrogen barrier film in contact with the first hydrogen barrier film to cover an upper surface of the upper electrode and a side surface of a portion of the upper electrode which has been formed at the position above the hole.

In accordance with the first method for fabricating a capacitor element, the third hydrogen barrier film covering the upper and side surfaces of the capacitor element is connected to the first hydrogen barrier film disposed in the uppermost layer of the interlayer insulating film which is positioned higher in level than the bottom surface of the capacitor element so that a large level difference as shown in the conventional embodiments is no more produced. This allows easy obtention of a focus margin in the range achievable with the performance of a stepper in a lithographic step during wiring formation performed after the formation of the capacitor elements. In the processing of the third hydrogen barrier film also, a focus margin in the range achievable with the performance of a stepper can also be obtained easily in a lithographic step performed to form a mask pattern. Since the capacitor element is covered with the first, second, and third hydrogen barrier films, the degradation of the characteristics of the capacitor element resulting from the reduction of the capacitor dielectric film by hydrogen can be suppressed. Thus, a high-performance capacitor element having a three-dimensional structure which is large in capacitance and small in area can be implemented by a simple and easy method.

To solve the foregoing problem, a second method for fabricating a capacitor element according to the present invention includes the steps of: forming an interlayer insulating film on a substrate; forming a first hydrogen barrier film on the interlayer insulating film; forming an upper-layer insulating film on the first hydrogen barrier film; forming a contact hole in the upper-layer insulating film, in the first hydrogen barrier film, and in the interlayer insulating film; forming a second hydrogen barrier film in contact with the first hydrogen barrier film to cover a sidewall of the contact hole and a bottom portion thereof; selectively removing the upper-layer insulating film by etching to expose an upper surface of the first hydrogen barrier film and expose a portion of an outer side surface of the second hydrogen barrier film which is positioned higher in level than the first hydrogen barrier film; successively forming a lower electrode, a capacitor dielectric film made of a ferroelectric material or a high dielectric material, and an upper electrode to cover an inner side surface of the second hydrogen barrier film, a bottom surface thereof, an upper surface thereof, and the exposed outer side surface thereof; and forming a third hydrogen barrier film in contact with the first hydrogen barrier film to cover an upper surface of the upper electrode and a side surface of a portion of the upper electrode which has been formed at the position above the hole.

In accordance with the second method for fabricating a capacitor element, the third hydrogen barrier film covering the upper and side surfaces of the capacitor element is connected to the first hydrogen barrier film disposed in the uppermost layer of the interlayer insulating film which is positioned higher in level than the bottom surface of the capacitor element so that a large level difference as shown in the conventional embodiments is no more produced. This allows easy obtention of a focus margin in the range achievable with the performance of a stepper in a lithographic step during wiring formation performed after the formation of the capacitor elements. In the processing of the third hydrogen barrier film also, a focus margin in the range achievable with the performance of a stepper can also be obtained easily in a lithographic step performed to form a mask pattern. Since the capacitor element is covered with the first, second, and third hydrogen barrier films, the degradation of the characteristics of the capacitor element resulting from the reduction of the capacitor dielectric film by hydrogen can be suppressed. Thus, a high-performance capacitor element having a three-dimensional structure which is large in capacitance and small in area can be implemented by a simple and easy method.

In the second method for fabricating a capacitor element, etching may be performed appropriately such that each of the etching rate ratio between the upper-layer insulating film and the first hydrogen barrier film and the etching rate ratio between the upper-layer insulating film and the second hydrogen barrier film is 10:1 or more. This allows selective removal of the upper-layer insulating film by etching and allows the fabrication of a capacitor element covered completely with the hydrogen barrier films using a simple and easy method and without producing a large level difference.

In the second method for fabricating a capacitor element, the upper-layer insulating film is preferably made of $SiO_2$ and the etching may be wet etching using a hydrofluoric acid. This allows the fabrication of a capacitor element covered completely with the hydrogen barrier films using a simple and easy method without producing a large level difference.

In the second method for fabricating a capacitor element, the etching may be dry etching using a gas mixture of fluorine and oxygen. This allows the fabrication of a capacitor element covered completely with the hydrogen barrier films using a simple and easy method without producing a large level difference.

In the second method for fabricating a capacitor element, the step of forming the first hydrogen barrier film may appropriately include forming a hydrogen barrier material over the sidewall and bottom portion of the hole and the upper surface of the interlayer insulating film and then selectively removing the hydrogen barrier material formed on the upper surface of the interlayer insulating film by CMP or an etch-back process. This allows the formation of a hydrogen barrier film having a cylindrical configuration using a simple and easy method.

BRIEF DESCRIPTION OF THE DRAWINGS

FIGS. 12A and 12B are principal-portion plan views of the capacitor element according to the third embodiment;

DETAILED DESCRIPTION OF THE INVENTION

Figure 1:
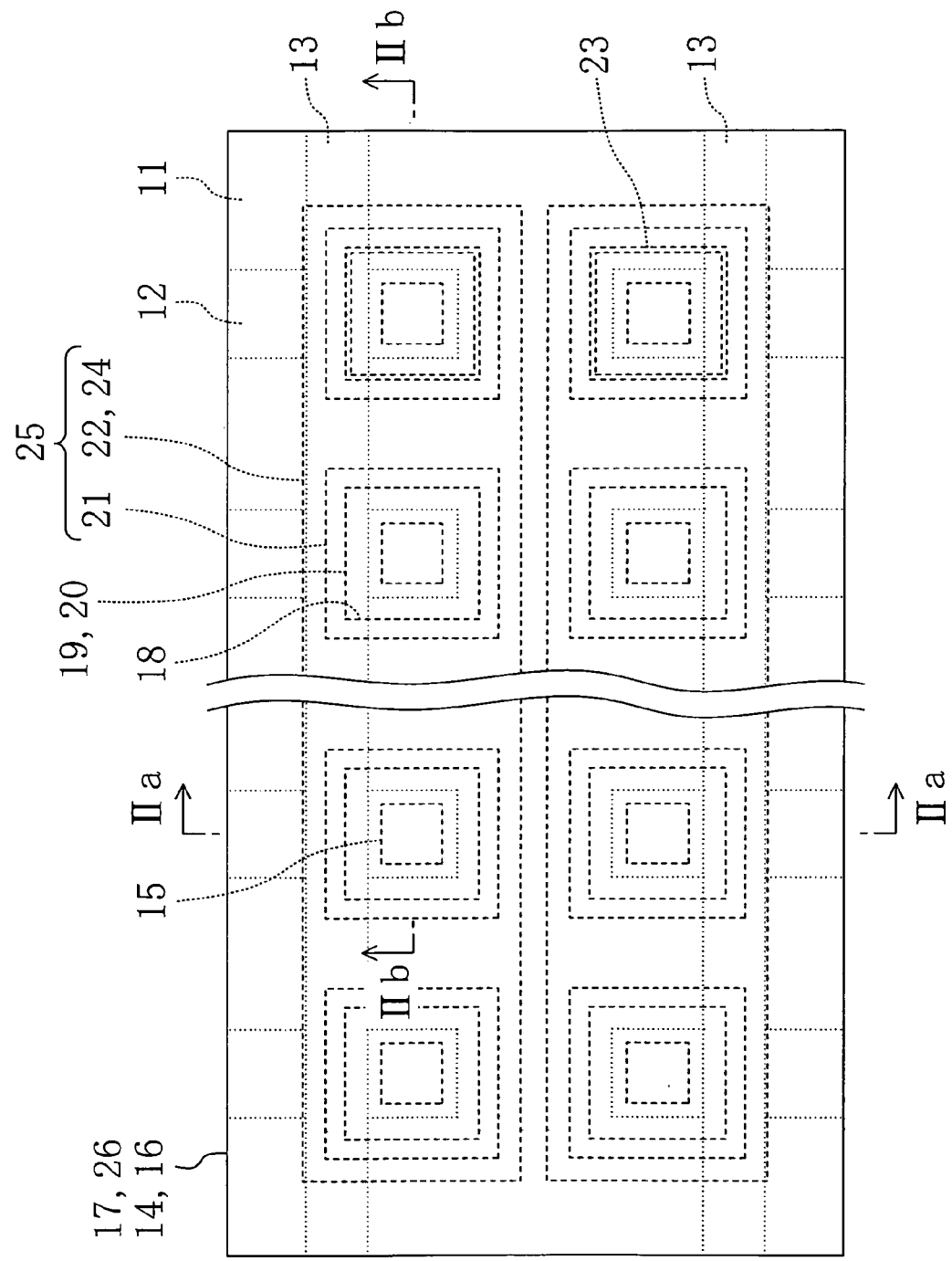
FIG. 1 is a principal-portion plan view of a capacitor element according to a first embodiment of the present invention.

Referring to the drawings, the individual embodiments of the present invention will be described herein below.

Embodiment 1

A capacitor element according to the first embodiment of the present invention will be described herein below with reference to FIGS. 1, 2A, and 2B.

FIG. 1 shows a principal-portion plan view of a semiconductor memory device using a capacitor element having a three-dimensional structure (depressed type) according to the first embodiment. FIGS. 2A and 2B show principal-portion cross-sectional views of the semiconductor memory device using the three-dimensional structure according to the first embodiment. Specifically, FIG. 2A is a principal-portion cross-sectional view taken along the line IIa-IIa of FIG. 1 and FIG. 2B is a principal-portion cross-sectional view taken along the line IIb-IIb of FIG. 1.

Figure 2A:
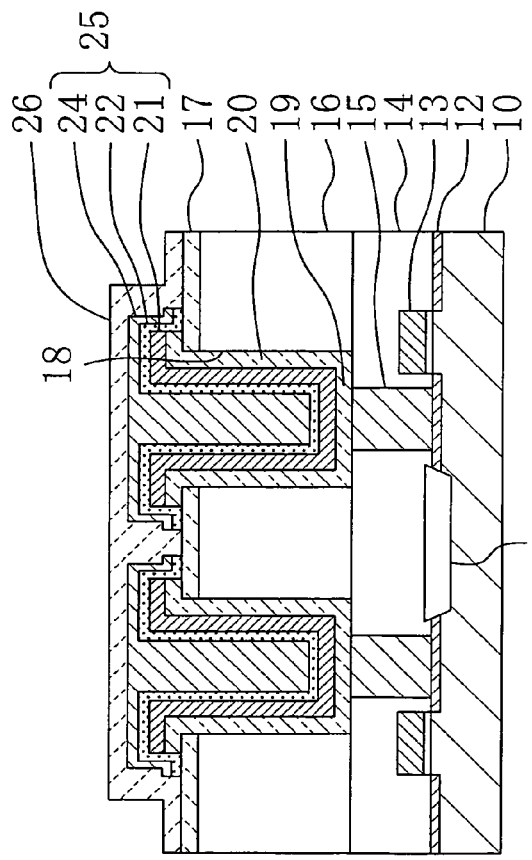
FIGS. 2A and 2B are principal-portion plan views of the capacitor element according to the first embodiment.
Figure 2B:
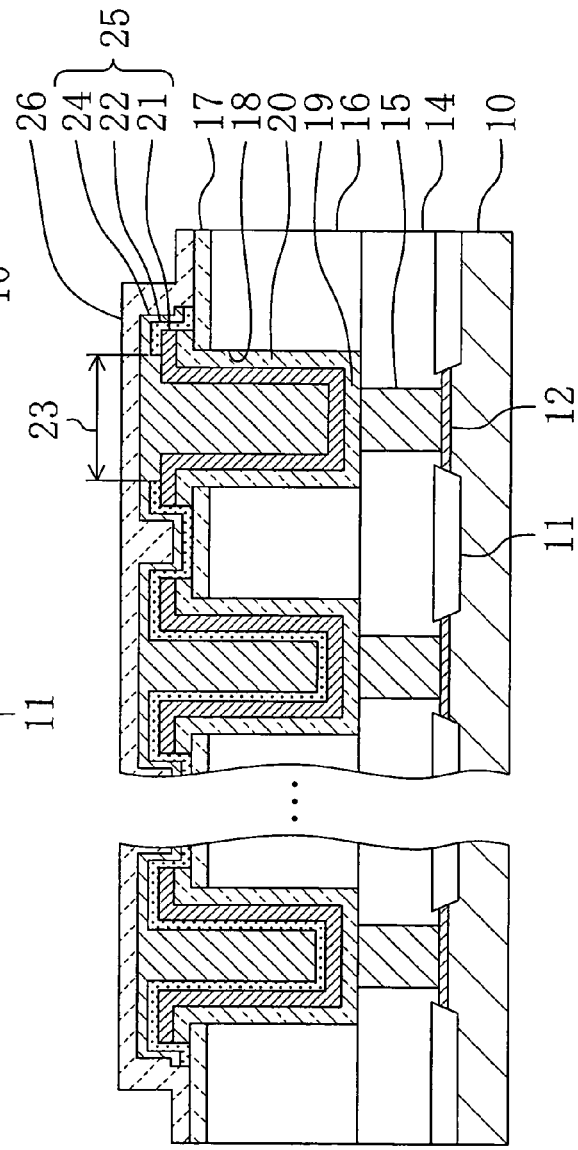

As shown in FIGS. 1, 2A, and 2B, an isolation region 11 and active regions 12 are formed on a semiconductor substrate 10 and gates 13 are further formed thereon. A lower-layer insulating film 14 made of $SiO_2$ or SiN with a thickness of 500 to 1000 nm is formed over the entire surface of the semiconductor substrate 10 having the isolation region 11 and the active regions 12 to cover the gates 13. Plug contacts 15 made of tungsten or a low-resistance polysilicon doped with an n-type impurity and having lower ends thereof in contact with the active regions 12 are formed in the lower-layer insulating film 14.

An interlayer insulating film 16 made of $SiO_2$ is formed over the lower-layer insulating film 14 and the plug contacts 15. A first hydrogen barrier film 17 made of SiN is formed on the upper surface of the interlayer insulating film 16. Holes 18 for exposing the upper ends of the plug contacts 15 are formed in the interlayer insulating film 16 and the first hydrogen barrier film 17. The capacitor elements having the three-dimensional structure, which will be described later, are formed by using the bottom portions and sidewalls of the holes 18.

To increase the capacitance of the capacitor element, it is necessary to maximize the thickness of the interlayer insulating film 16. In the present embodiment, the thickness of the interlayer insulating film 16 has been adjusted to 1 µm or more. Since it is sufficient for the first hydrogen barrier film 17 to have a minimum thickness that can prevent the diffusion of hydrogen or more, the thickness of the first hydrogen barrier film 17 has been adjusted to 10 nm or more in the present embodiment. As the diameters of the holes 18, a range of 0.2 µm to 1 µm has been assumed. In the present embodiment, the diameters of the holes 18 have been adjusted to about 0.6 µm.

Fourth hydrogen barrier films 19 made of TiAlN are disposed on the bottom portions of the holes 18 to have lower surfaces thereof in contact with the upper ends of the plug contacts 15. Third hydrogen barrier films 20 made of TiAlN are disposed on the sidewalls of the holes 18 to be in contact with the first and fourth hydrogen barrier films 17 and 19. The present embodiment has allowed the fourth and third hydrogen barrier films 19 and 20 to be formed in the same step by using the same material for the fourth and third hydrogen barrier films 19 and 20. The thickness of each of the fourth and third hydrogen barrier films 19 and 20 has been adjusted to 10 nm or more. The fourth hydrogen barrier film 19 also functions as an oxygen barrier film for preventing an increase in contact resistance caused by oxygen reaching the plug contact 15 during annealing in an atmosphere containing oxygen at a high temperature (600° C. to 800° C.), which is indispensable to the crystallization of capacitor dielectric films 22 described later.

Lower electrodes 21 are formed over the fourth and third hydrogen barrier films 19 and 20. In the present embodiment, each of the lower electrodes 21 has, e.g., a Pt/$IrO_2$/Ir multilayer structure (in a top-to-bottom stacking order). The $IrO_2$/Ir layers are oxygen barrier films for preventing an increase in contact resistance caused by oxygen reaching the plug contact 15 during annealing in an atmosphere containing oxygen at a high temperature (600° C. to 800° C.), which is indispensable to the crystallization of the capacitor dielectric films, as described above. The thickness of each of the Pt, $IrO_2$, and Ir films composing the lower electrode 21 is in a range of 10 nm to 50 nm. In the present embodiment, the side surface of the edge portion of each of the lower electrodes 21 and the side surface of the edge portion of each of the fourth hydrogen barrier films 19 are formed to have the same configuration. This achieves a reduction in the number of times of mask formation during the formation of the lower electrodes 21 and during the formation of the fourth hydrogen barrier films 19.

Each of the capacitor dielectric films 22 made of $SrBi_2(Ta_xNb_{1-x})_2O_9$ ($0 \leq x \leq 1$) is formed over the upper and side surfaces of the plurality of lower electrodes 21 and the upper surface of the first hydrogen barrier film 17. To form the capacitor dielectric films 22 to cover the lower electrodes 21 each having the three-dimensional structure, the capacitor dielectric films 22 are formed by metal organic chemical vapor deposition (MOCVD). The thicknesses of the capacitor dielectric films 22 are in a range of 12.5 nm to 100 nm.

As shown in FIG. 2B, contact holes 23 provided to expose the lower electrodes 21 are formed in the capacitor dielectric films 22. The contact holes 23 function to provide connection between upper electrodes 24, which will be described later, and the lower electrodes 21. The upper electrodes 24 made of Pt are formed to cover the upper and side surfaces of the capacitor dielectric films 22 and the side surfaces and bottom portions of the contact holes 23. Consequently, electric signals are transmitted to the upper electrodes 24 via the lower electrodes 21. The structure has the advantage of obviating the necessity to form contact holes in a second hydrogen barrier film 26, which will be described later, for covering the upper portions of the upper electrodes 24 to provide electric connection between the upper electrodes 24 and wiring formed thereabove, i.e., the necessity to remove the second hydrogen barrier film 26. Accordingly, a structure in which each of the capacitor elements is completely covered with the hydrogen barrier films can easily be implemented.

In addition, the upper electrodes 24 made of Pt have been formed to cover the upper and side surfaces of the capacitor dielectric films 22 and the insides of the contact holes 23 in opposing relation to the plurality of lower electrodes 21. The film thickness of each of the upper electrodes 24 is in a range of 10 nm to 50 nm in the regions located over the first hydrogen barrier film 17. In the present embodiment, the side surface of the edge portion of each of the upper electrodes 24 and the side surface of the edge portion of each of the capacitor dielectric films 22 are formed to have the same configuration. This achieves a reduction in the number of times of mask formation during the formation of the upper electrodes 24 and during the formation of the capacitor dielectric films 22. By thus forming the lower electrodes 21, the capacitor dielectric films 22, and the upper electrodes 24 in regions extending from within the holes 18 toward positions above the holes 18 along the inner walls of the holes 18, the capacitor elements 25 for information storage each having the depressed three-dimensional configuration are completed.

Moreover, the second hydrogen barrier film 26 made of $Al_2O_3$ or TiAlN has also been formed over the upper and side surfaces of the upper electrodes 24 and the side surfaces of the capacitor dielectric films 22. The second hydrogen barrier film 26 is in contact with the first hydrogen barrier film 17 in the regions in which the upper electrodes 24 and the capacitor dielectric films 22 are not formed.

Thus, each of the capacitor elements 25 is covered completely with the first second, third, and fourth hydrogen barrier films 17, 26, 20, and, 19.

The level difference when or after the second hydrogen barrier film 26 is formed becomes the total sum of the respective film thicknesses of the upper electrode 24, the capacitor dielectric film 22, the lower electrode 21, and the third hydrogen barrier film 20. Specifically, an extremely small level difference of about 310 nm at the maximum is produced.

Thus, the capacitor element according to the present embodiment is completely covered with the first, second, third, and fourth hydrogen barrier films. This prevents the degradation of the characteristics of the capacitor element resulting from the reduction of the capacitor dielectric films by hydrogen. In addition, even after the formation of the structure in which the capacitor element is completely covered with the hydrogen barrier films, only an extremely small level difference of about 310 nm at the maximum is produced. This allows easy obtention of a focus margin in a range achievable with the performance of a stepper in a lithographic step during wiring formation performed after the formation of the capacitor elements. Moreover, since the level difference present in the step of forming the hydrogen barrier film covering the upper portion and sidewalls of the capacitor element is also extremely small, which is about 310 nm at the maximum, a focus margin in a range achievable with the performance of a stepper in a lithographic step performed to form a mask pattern for processing the hydrogen barrier film can also be obtained easily.

Variation 1 of Embodiment 1

A capacitor element according to a first variation of the first embodiment will be described herein below with reference to FIG. 3. The same reference numerals will be retained for those of the components shown in FIG. 3 which are common to the components shown in FIGS. 2A and 2B and the description thereof will not be repeated.

Figure 3:
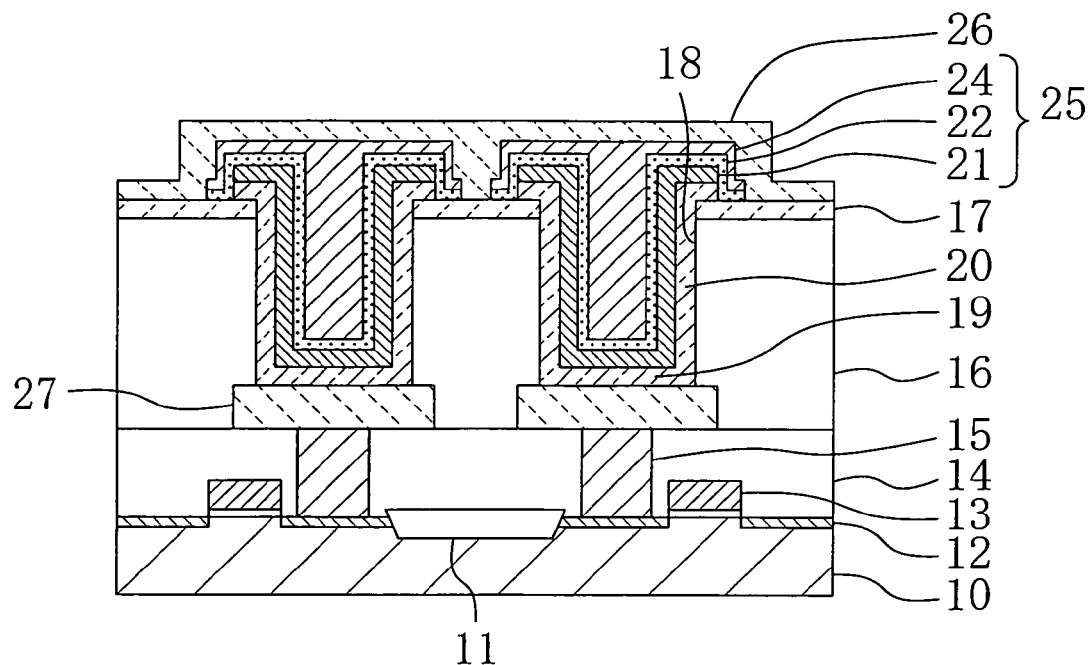
FIG. 3 is a principal-portion cross-sectional view of a capacitor element according to a first variation of the first embodiment.

FIG. 3 shows a principal-portion cross-sectional view of the capacitor element according to the first variation of the first embodiment. Herein below, the description will be given mainly to the difference between the capacitor element shown in FIG. 3 and the capacitor element shown in FIG. 2A.

As shown in FIG. 3, fifth hydrogen barrier films 27 made of TiAlN are disposed on the lower-layer insulating film 14 to cover the respective upper ends of the plug contacts 15. The fifth hydrogen barrier films 27 have upper surfaces thereof in contact with the lower surfaces of the fourth hydrogen barrier films 19 disposed on the bottom portions of the holes 18 and with the end portions of the third hydrogen barrier films 20 disposed on the sidewalls of the holes 18. As can be seen from FIG. 3, the upper surface of each of the fifth hydrogen barrier films 27 preferably has an area not less than an area occupied by the bottom portion of each of the holes 18 in terms of more reliably prohibiting an ingression of hydrogen from below the hole 18. However, the area occupied by the upper surface of each of the fifth hydrogen barrier films 27 is not limited to the case shown in FIG. 3 since the fourth hydrogen barrier films 19 are disposed on the fifth hydrogen barrier films 27.

Thus, in the capacitor element according to the first variation, the provision of the fifth hydrogen barrier film 27 allows the enhancement of a barrier property against the diffusion of hydrogen entering the capacitor element from below the hole 18. Accordingly, the degradation of the characteristics of the capacitor element resulting from the reduction of the capacitor dielectric film by hydrogen can be prevented.

The fifth hydrogen barrier film 27 also functions as an oxygen barrier film for preventing an increase in contact resistance caused by oxygen reaching the plug contact 15 during annealing in an atmosphere containing oxygen at a high temperature (600° C. to 800° C.), which is indispensable to the crystallization of the capacitor dielectric films 22. The film thickness of each of the fifth hydrogen barrier films 27 has been adjusted to a range of 10 nm to 100 nm.

Variation 2 of Embodiment 1

A capacitor element according to a second variation of the first embodiment will be described herein below with reference to FIG. 4. The same reference numerals will be retained for those of the components shown in FIG. 4 which are common to the components shown in FIGS. 2A and 2B and the description thereof will not be repeated.

Figure 4:
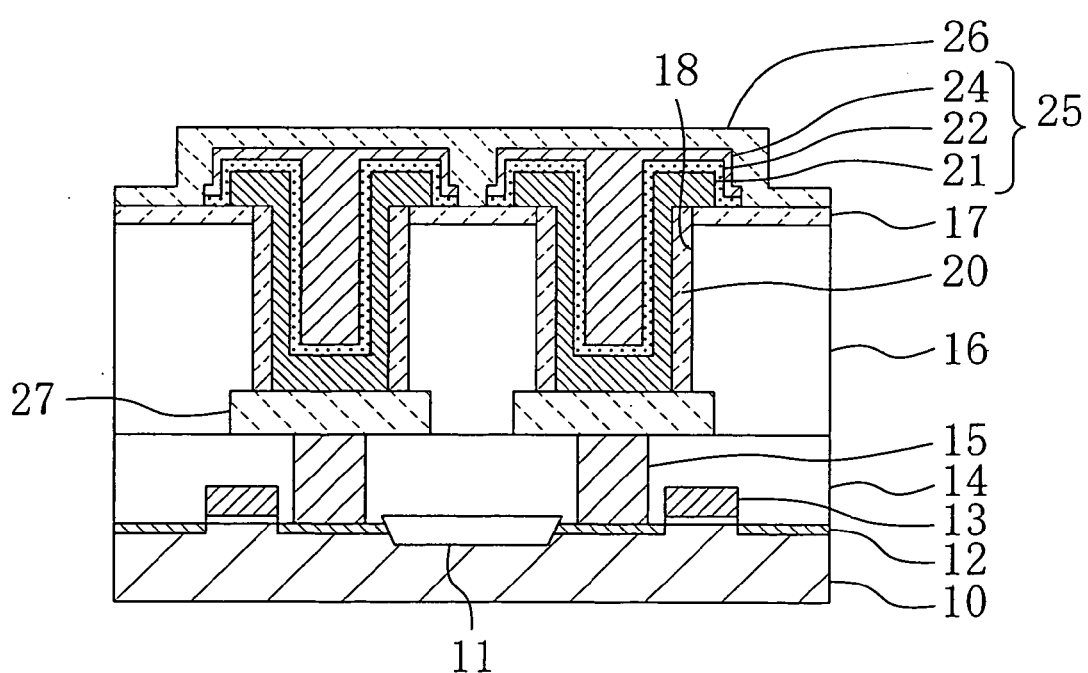
FIG. 4 is a principal-portion cross-sectional view of a capacitor element according to a second variation of the first embodiment.

FIG. 4 shows a principal-portion cross-sectional view of the capacitor element according to the second variation of the first embodiment. Herein below, the description will be given mainly to the difference between the capacitor element shown in FIG. 4 and the capacitor element shown in FIG. 2A.

As shown in FIG. 4, the fifth hydrogen barrier films 27 made of a conductive material are disposed on the lower-layer insulating film 14 to cover the upper ends of the plug contacts 15. Since the fourth hydrogen barrier films 19 are not formed on the bottom portions of the holes 18, the upper surface of each of the fifth hydrogen barrier films 27 has an area not less than the area occupied by the bottom portion of each of the holes 18 and is in contact with the lowermost surface of the lower electrode 21 and with the end portions of the third hydrogen barrier film 20. In the second variation, TiAlN is used for the fifth hydrogen barrier films 27 and the thicknesses thereof have been adjusted to a range of 10 nm to 100 nm.

Thus, the capacitor element according to the second variation has a first advantage of implementing a structure in which the capacitor element 25 is completely covered with the first, second, third, and fifth hydrogen barrier films 17, 26, 20, and 27 even in the case where the fourth hydrogen barrier films 19 shown in FIG. 2A are not formed.

A second advantage of the capacitor element according to the second variation is that an insulating material can be used for the third hydrogen barrier films 20. To achieve the higher integration of a capacitor element, it is generally necessary to minimize the diameter of each of the holes 18 and maximize the depth of the hole 18. For a film formed inside the hole 18, a material which is excellent in step coverage and capable of reducing the film thickness (preferably 50 nm or less) may be used advantageously. As a method for depositing a film excellent in step coverage, there can be listed chemical vapor deposition (CVD), atomic layer deposition (ALD), or the like. However, film deposition by CVD or ALD is extremely difficult when a conductive material represented by metal is used. By contrast, film deposition by CVD or ALD is easier when an insulating material is used. In the second variation, therefore, the use of, e.g., $Al_2O_3$ for the third hydrogen barrier films 20 allows improved step coverage and a reduction in the thickness of each of the third hydrogen barrier films 20, thereby achieving the higher integration of the capacitor element. The thicknesses of the third hydrogen barrier films 20 have been adjusted to a range of 2 nm to 20 nm.

Variation 3 of Embodiment 1

A capacitor element according to a third variation of the first embodiment will be described herein below with reference to FIGS. 5A, 5B, 6A, and 6B.

FIGS. 5A, 5B, 6A, and 6B show principal-portion cross-sectional views of the capacitor element according to the third variation of the first embodiment. The same reference numerals will be retained for those of the components shown in FIGS. 5A, 5B, 6A, and 6B which are common to the components shown in FIGS. 2A, 2B, 3, and 4 and the description thereof will not be repeated.

Because the characteristic portion of the capacitor element according to the third variation is that a sixth hydrogen barrier film 28 is disposed, the description will be given mainly to the characteristic portion herein below.

Figure 5A:
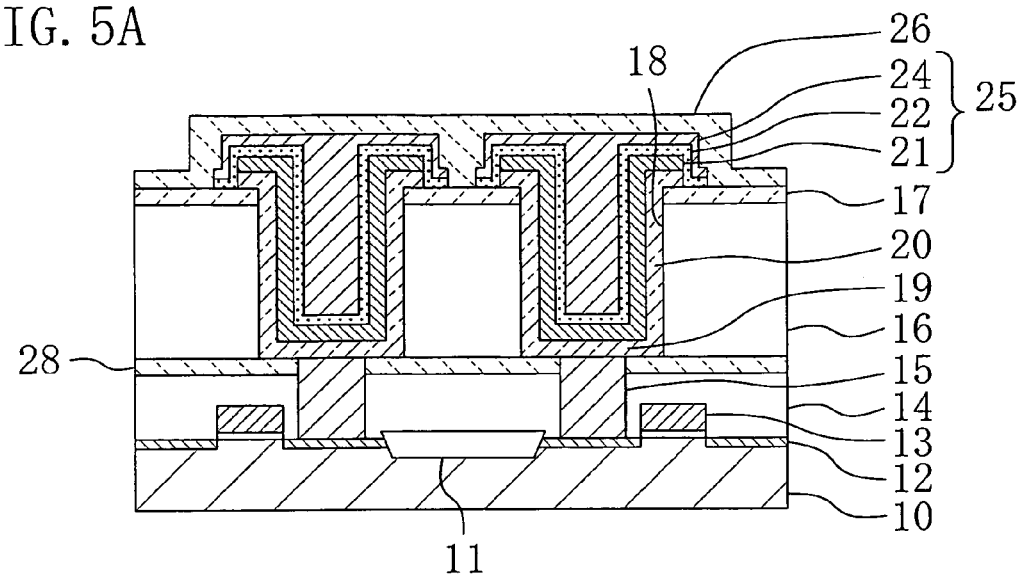
FIGS. 5A and 5B are principal-portion cross-sectional views of a capacitor element according to a third variation of the first embodiment.

First, the structure of the capacitor element according to the third variation shown in FIG. 5A is greatly different from the structure shown in FIG. 2A in that the sixth hydrogen barrier film 28 made of SiN is disposed in the uppermost layer of the lower-layer insulating film 14. The sixth hydrogen barrier film 28 has an upper surface thereof in contact with the bottom surfaces of the fourth hydrogen barrier films 19 and with the end portions of the third hydrogen barrier films 20.

Figure 5B:
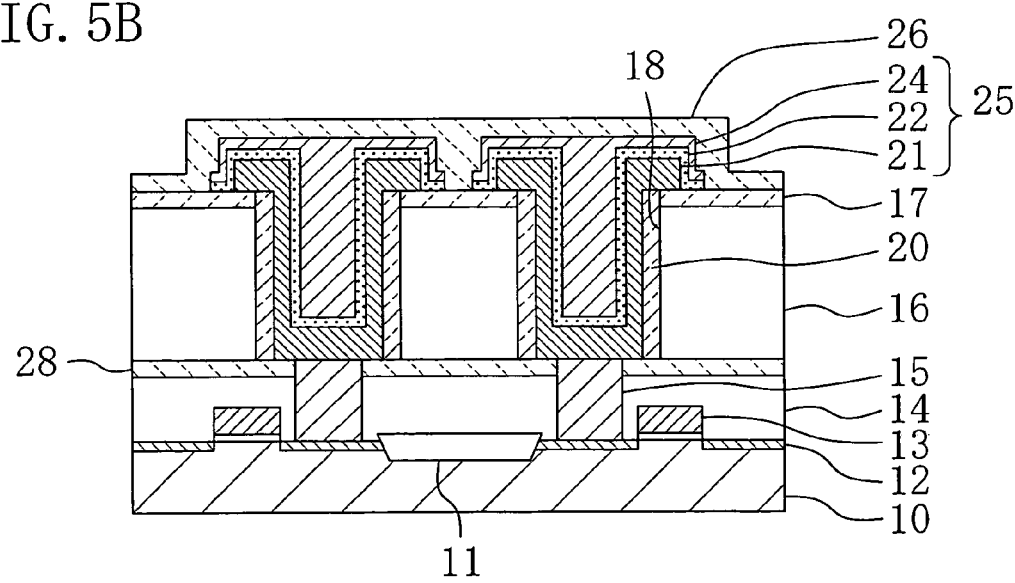

Next, the structure of the capacitor element according to the third variation shown in FIG. 5B is greatly different from the structure shown in FIG. 2B in that the fourth hydrogen barrier films 19 are not formed and the sixth hydrogen barrier film 28 made of SiN is formed in the uppermost layer of the lower-layer insulating film 14. The sixth hydrogen barrier film 28 has the upper surface thereof in contact with the bottom surfaces of the lower electrodes 21 and with the end portions of the third hydrogen barrier films 20.

Figure 6A:
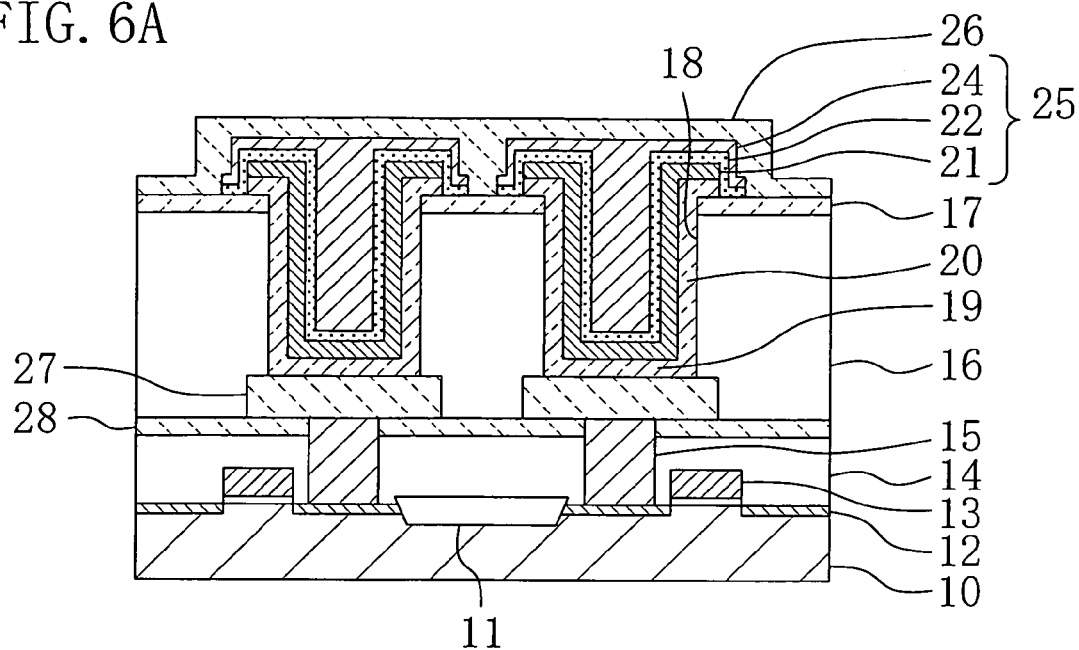
FIGS. 6A and 6B are principal-portion cross-sectional views of the capacitor element according to the third variation of the first embodiment.

Moreover, the structure of the capacitor element according to the third variation shown in FIG. 6A is greatly different from the structure shown in FIG. 3 in that the sixth hydrogen barrier film 28 made of SiN is disposed in the uppermost layer of the lower-layer insulating film 14. The sixth hydrogen barrier film 28 has the upper surface thereof in contact with the bottom surfaces of the fifth hydrogen barrier films 27. As for the size of the area occupied by the upper surface of each of the fifth hydrogen barrier films 27, it is the same as described above in the first variation.

Figure 6B:
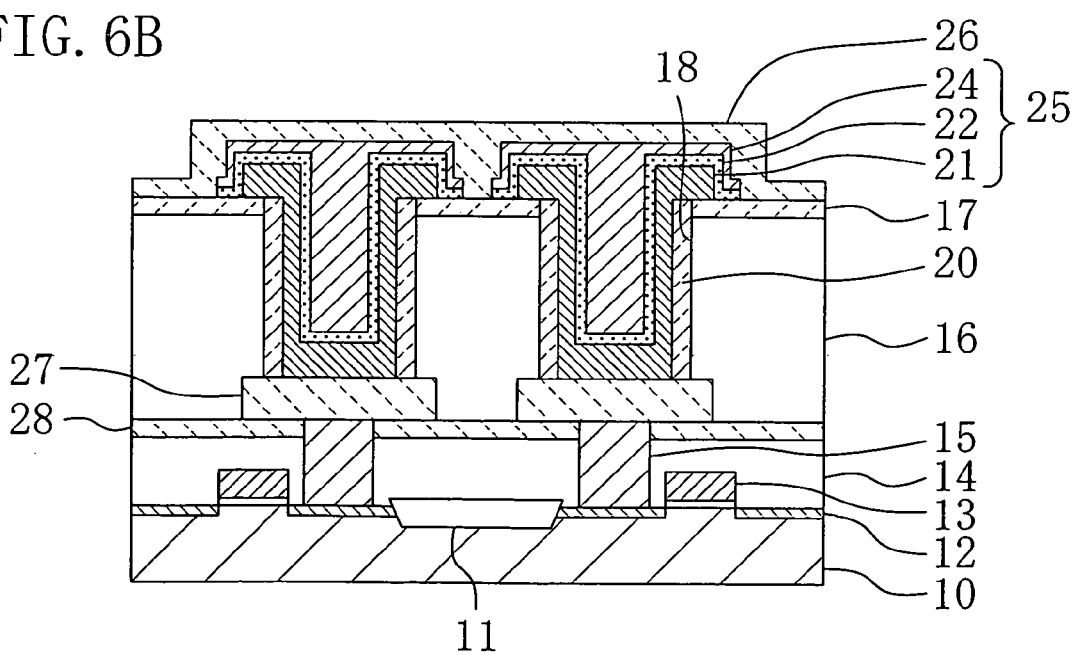

Furthermore, the structure of the capacitor element according to the third variation shown in FIG. 6B is greatly different from the structure shown in FIG. 4 in that the sixth hydrogen barrier film 28 made of SiN is disposed in the uppermost layer of the lower-layer insulating film 14. The sixth hydrogen barrier film 28 has the upper surface thereof in contact with the bottom surfaces of the fifth hydrogen barrier films 27. As for the size of the area occupied by the upper surface of each of the fifth hydrogen barrier films 27, it is the same as described above in the second variation.

Thus, the sixth hydrogen barrier film 28 shown in FIGS. 5A, 5B, 6A, and 6B does not require a new mask every time it is disposed and processed. In the capacitor elements shown in FIGS. 5A, 5B, 6A, and 6B, therefore, the barrier property against the diffusion of hydrogen entering the capacitor element from below the hole 18, particularly from the lower-layer insulating film 14 can further be enhanced. As a result, it becomes possible to prevent the degradation of the characteristics of the capacitor element 25 resulting from the reduction of the capacitor dielectric film 22 by hydrogen. In the capacitor elements shown in FIGS. 5B and 6B, the use of an insulating material for the third hydrogen barrier films 20 allows improved step coverage and a reduction in the thickness of each of the third hydrogen barrier films 20, thereby achieving the higher integration of the capacitor element in the same manner as in the second variation. In the third variation, the thickness of the sixth hydrogen barrier film 28 has been adjusted to a range of 10 nm to 150 nm.

Variation 4 of Embodiment 1

A capacitor element according to a fourth variation of the first embodiment will be described herein below with reference to FIGS. 7A, 7B, 8A, and 8B.

FIGS. 7A, 7B, 8A, and 8B show principal-portion cross-sectional views of the capacitor element according to the fourth variation of the first embodiment. The same reference numerals will be retained for those of the components shown in FIGS. 7A, 7B, 8A, and 8B which are common to the components shown in FIGS. 2A, 2B, 3, 4, 5A, 5B, 6A, and 6B and the description thereof will not be repeated.

Because the characteristic portion of the capacitor element according to the fourth variation is that seventh hydrogen barrier films 29 are disposed, the description will be given mainly to the characteristic portion herein below.

Figure 7A:
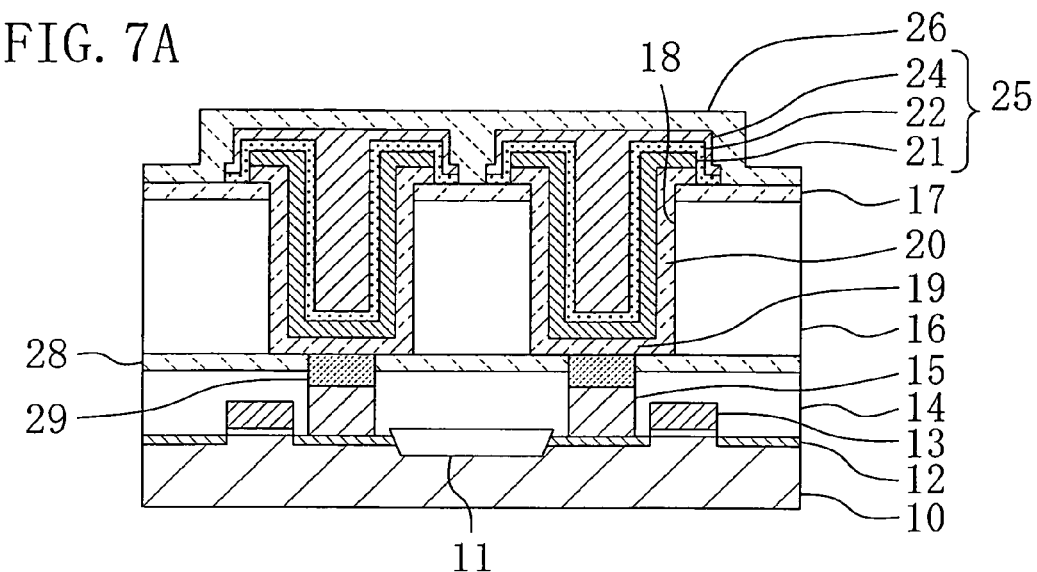
FIGS. 7A and 7B are principal-portion cross-sectional views of a capacitor element according to a fourth variation of the first embodiment.

First, the structure of the capacitor element according to the fourth variation shown in FIG. 7A is greatly different from the structure shown in FIG. 5A in that the seventh hydrogen barrier films 29 made of TiAlN are disposed in the uppermost layers of the plug contacts 15. The seventh hydrogen barrier films 29 are in contact with the sixth hydrogen barrier film 28 and with the lower surfaces of the fourth hydrogen barrier films 19.

Figure 7B:
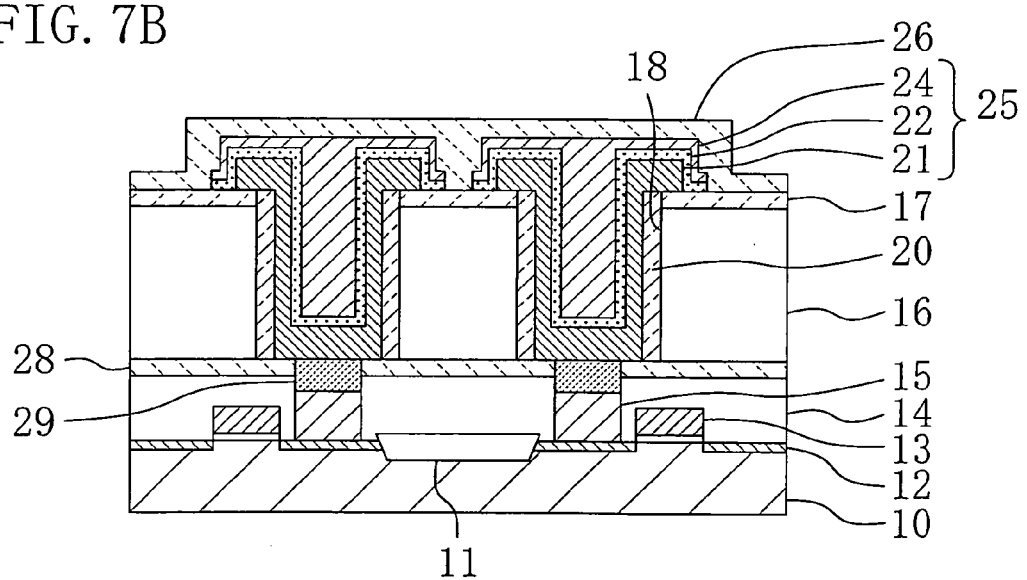

Next, the structure of the capacitor element according to the fourth variation shown in FIG. 7B is greatly different from the structure shown in FIG. 5B in that the seventh hydrogen barrier films 29 made of TiAlN are disposed in the uppermost layers of the plug contacts 15. The seventh hydrogen barrier films 29 are in contact with the sixth hydrogen barrier film 28 and with the lower surfaces of the lower electrodes 21.

Figure 8A:
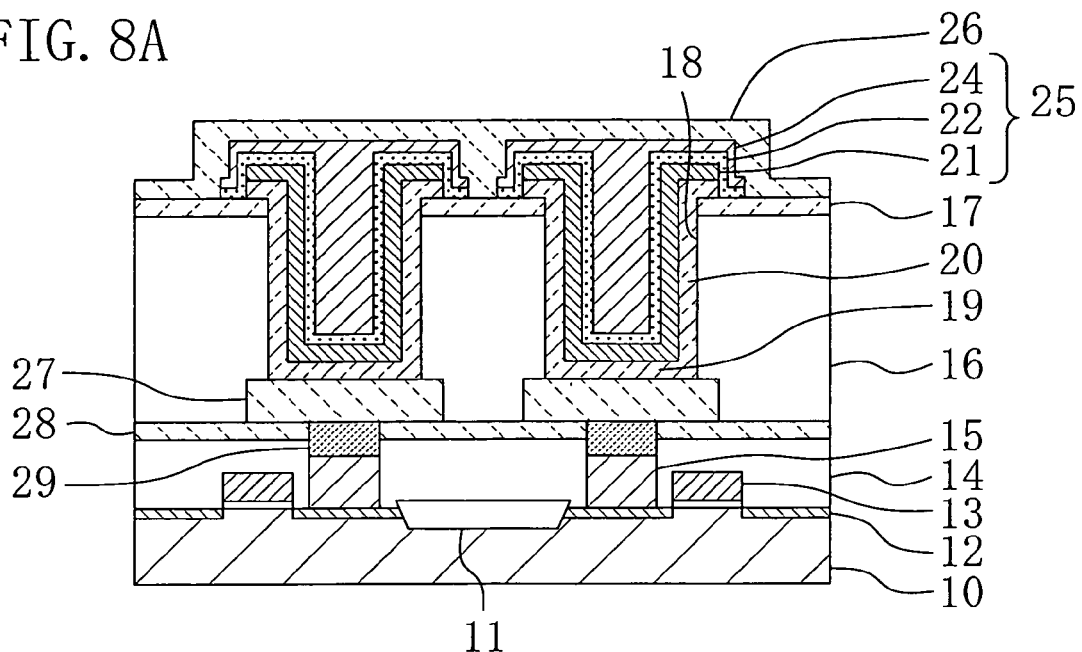
FIGS. 8A and 8B are principal-portion cross-sectional views of the capacitor element according to the fourth variation of the first embodiment.

Moreover, the structure of the capacitor element according to the fourth variation shown in FIG. 8A is greatly different from the structure shown in FIG. 6A in that the seventh hydrogen barrier films 29 made of TiAlN are disposed in the uppermost layers of the plug contacts 15. The seventh hydrogen barrier films 29 are in contact with the sixth hydrogen barrier film 28 and with the lower surfaces of the fifth hydrogen barrier films 27.

Figure 8B:
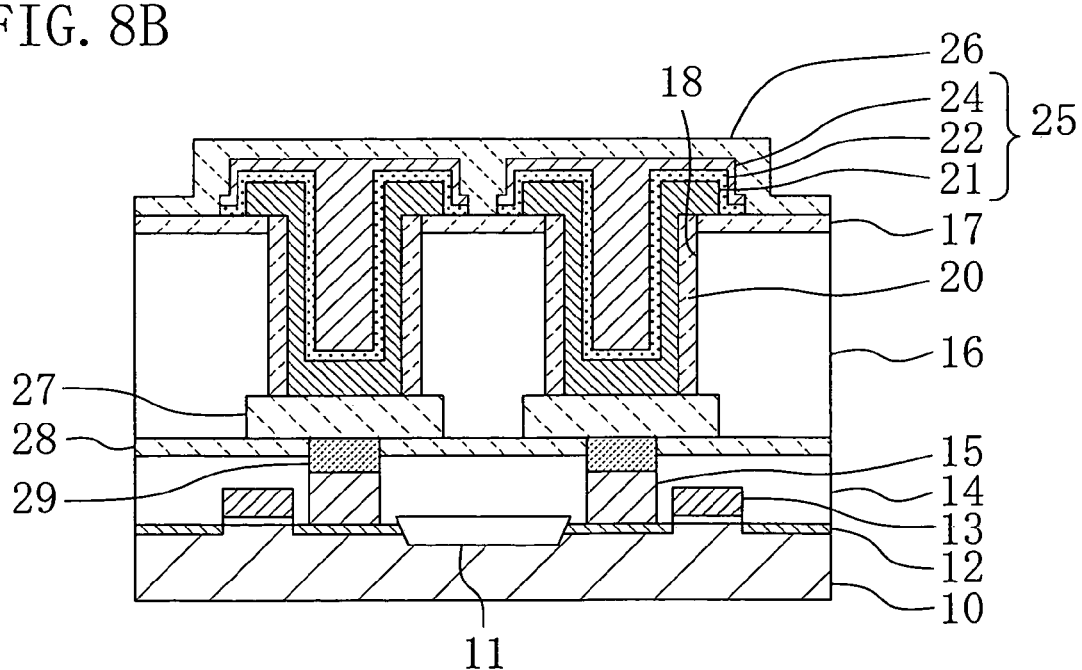

Furthermore, the structure of the capacitor element according to the fourth variation shown in FIG. 8B is greatly different from the structure shown in FIG. 6B in that the seventh hydrogen barrier films 29 made of TiAlN are disposed in the uppermost layers of the plug contacts 15. The seventh hydrogen barrier films 29 are in contact with the sixth hydrogen barrier film 28 and with the lower surfaces of the fifth hydrogen barrier films 27.

Thus, in the capacitor elements shown in FIGS. 7A, 7B, 8A, and 8B, the seventh hydrogen barrier films 29 are further disposed in the uppermost layers of the plug contacts 15 so that the barrier property against the diffusion of hydrogen entering the capacitor element from the plug contacts 15 can further be enhanced. As a result, it becomes possible to prevent the degradation of the characteristics of the capacitor element 25 resulting from the reduction of the capacitor dielectric film 22 by hydrogen. In the capacitor elements shown in FIGS. 7B and 8B, the use of an insulating material for the third hydrogen barrier films 20 allows improved step coverage and a reduction in the thickness of each of the third hydrogen barrier films 20, thereby achieving the higher integration of the capacitor element as described above. In the fourth variation, the thicknesses of the seventh hydrogen barrier films 29 have been adjusted to a range of 10 nm to 150 nm.

It will easily be appreciated that the structure in which the sixth hydrogen barrier film 28 is not disposed can also be used in FIGS. 7A, 7B, 8A, and 8B, though it is not depicted.

Embodiment 2

A capacitor element according to the second embodiment of the present invention will be described herein below with reference to FIGS. 9A to 9C, 10A, and 10B.

FIGS. 9A to 9C and FIGS. 10A and 10B show cross-sectional views illustrating the process steps of a method for fabricating a capacitor element according to the second embodiment. Since the method for fabricating the capacitor element according to the second embodiment is a method for fabricating each of the capacitor elements described above in the first embodiment, the same reference numerals will be retained for those of the components shown in FIGS. 9A to 9C, 10A, and 10B which are common to the components of each of the capacitor elements described above in the first embodiment.

Figure 9A:
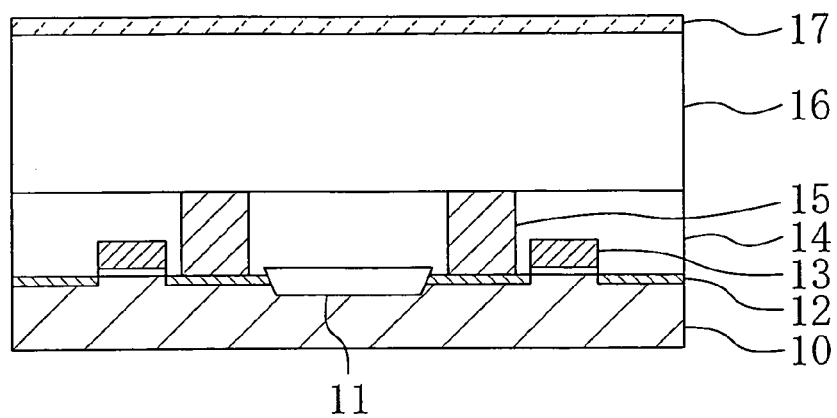
FIGS. 9A to 9C are principal-portion cross-sectional views illustrating the process steps of a method for fabricating a capacitor element according to a second embodiment of the present invention.

As shown in FIG. 9A, the isolation region 11 and the active regions 12 are formed on the semiconductor substrate 10 and the gates 13 are further formed thereon.

Next, $SiO_2$ or SiN is deposited by CVD to cover the entire surface of the semiconductor substrate 10 and then planarized by CMP (Chemical Mechanical Polishing) to form the lower-layer insulating film 14 with a thickness of 500 to 1000 nm.

Next, the contact holes for exposing the active regions 3 are formed in the lower-layer insulating film 14. Then, tungsten or low-resistance polysilicon doped with an n-type impurity is deposited by CVD over the entire surface of the lower-layer insulating film 14 including the insides of the contact holes. Thereafter, the tungsten or low-resistance polysilicon doped with an n-type impurity that has been deposited on the lower-layer insulating film 14 is removed by CMP to form the plug contacts 15 (each with a diameter of 0.2 μm or less).

Next, the interlayer insulating film 16 made of $SiO_2$ with a thickness of 1 μm or more is formed by CVD over the lower-layer insulating film 14 and the plug contacts 15. Then, the first hydrogen barrier film 17 made of SiN is formed to cover the upper surface of the interlayer insulating film 16. Since it is sufficient for the first hydrogen barrier film 17 to have a minimum thickness that can prevent the diffusion of hydrogen or more, the thickness of the first hydrogen barrier film 17 may be adjusted appropriately to 10 nm or more.

Figure 9B:
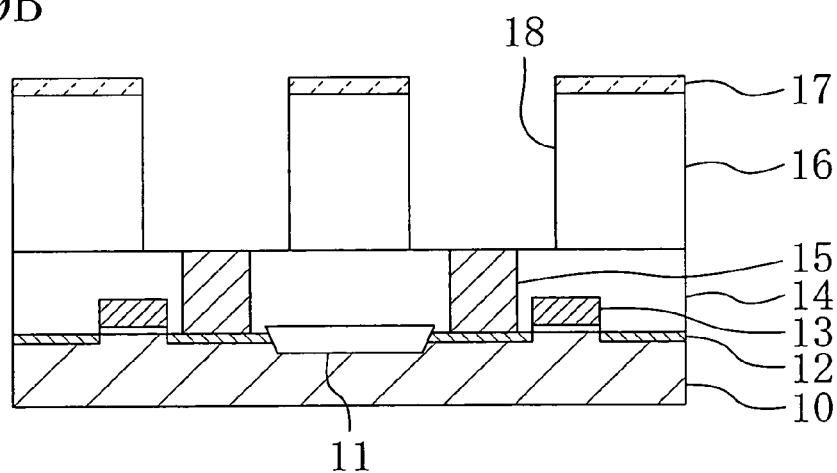

Next, as shown in FIG. 9B, dry etching is performed with respect to the interlayer insulating film 16 and the first hydrogen barrier film 17 to form the holes 18 for exposing the upper ends of the plug contacts 15. As the diameters of the holes 18, a range of 0.2 μm to 1 μm has been assumed. In the present embodiment, the diameters of the holes 18 have been adjusted to about 0.6 μm.

Figure 9C:
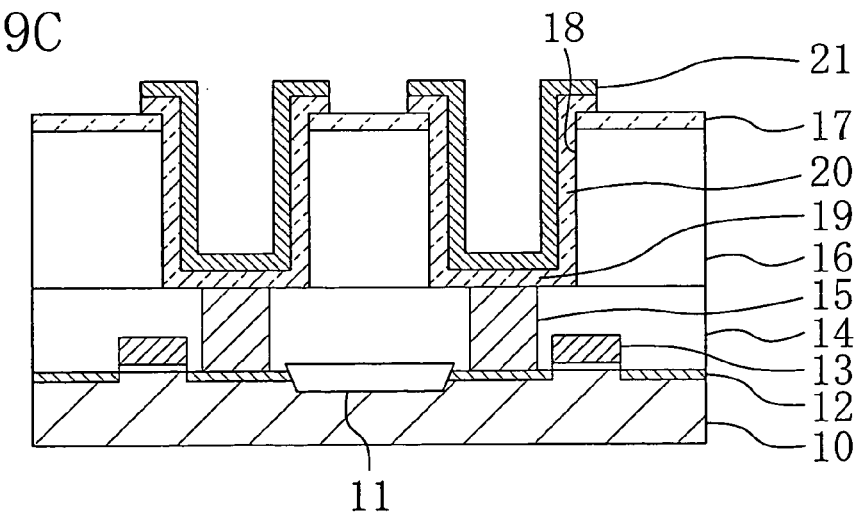

As shown in FIG. 9C, a hydrogen barrier material made of TiAlN is deposited by sputtering or CVD on the entire surface of the first hydrogen barrier film 17 to cover the bottom portions and sidewalls of the holes 18. Then, an electrode material composed of Pt/$IrO_2$/Ir multiple layers (in a top-to-bottom stacking order) is formed by sputtering or CVD on the hydrogen barrier material. Then, dry etching using a gas containing chlorine is performed to process each of the electrode material and the hydrogen barrier material into a desired configuration, thereby forming the fourth and third hydrogen barrier films 19 and 20 and the lower electrodes 21. Consequently, the fourth hydrogen barrier films 19 in contact with the upper ends of the plug contacts 15 are disposed on the bottom portions of the holes 18, while the third hydrogen barrier films 20 in contact with the first and fourth hydrogen barrier films 17 and 19 are disposed on the sidewalls of the holes 18. The thickness of each of the fourth and third hydrogen barrier films 19 and 20 has been adjusted to 10 nm or more. Although the present embodiment has described the case where the fourth and third hydrogen barrier films 19 and 20 can be formed in the same step by using the same material for the fourth and third hydrogen barrier films 19 and 20, the fourth and third hydrogen barrier films 19 and 20 may also be formed in different steps.

The fourth hydrogen barrier films 19 also function as the oxygen barrier films for preventing an increase in contact resistance caused by oxygen reaching the plug contact 15 during annealing in an atmosphere containing oxygen at a high temperature (600° C. to 800° C.), which is indispensable to the crystallization of the capacitor dielectric films 22 described later.

On the other hand, the $IrO_2$/Ir layers contained in the lower electrodes 21 are oxygen barrier films for preventing an increase in contact resistance caused by oxygen reaching the plug contact 15 during annealing in an atmosphere containing oxygen at a high temperature (600° C. to 800° C.), which is indispensable to the crystallization of the capacitor dielectric films, as described above. The thicknesses of the Pt, $IrO_2$, and Ir films composing the lower electrodes 21 are in a range of 10 nm to 50 nm.

In the present embodiment, the edge portion of each of the lower electrodes 21 and the edge portion of each of the hydrogen barrier films consisting of the fourth and third hydrogen barrier films 19 and 20 are formed to have the same configuration. This achieves a reduction in the number of times of mask formation.

Figure 10A:
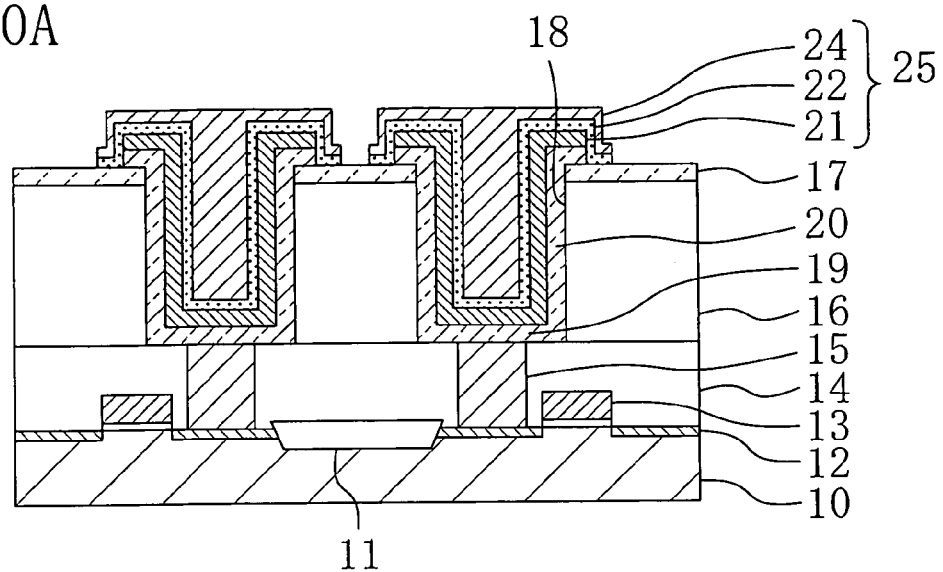
FIGS. 10A and 10B are principal-portion cross-sectional views illustrating the process steps of the method for fabricating the capacitor element according to the second embodiment.

As shown in FIG. 10A, a dielectric thin film made of $SrBi_2(Ta_xNb_{1-x})_2O_9$ ($0 \leq x \leq 1$) is formed over the upper and side surfaces of the plurality of lower electrodes 21 and the upper surface of the first hydrogen barrier film 17. To cover the lower electrodes 21 each having the three-dimensional structure, the dielectric thin film is formed by metal organic chemical vapor deposition (MOCVD). The thickness of the dielectric thin film is in a range of 12.5 nm to 100 nm. After the deposition of the dielectric thin film, a thermal process in an atmosphere containing oxygen at a high temperature ranging from 600° C. to 800° C. is performed for crystallization. The thermal process is performed in a furnace or an RTA (Rapid Thermal Anneal) system.

Figure 10B:
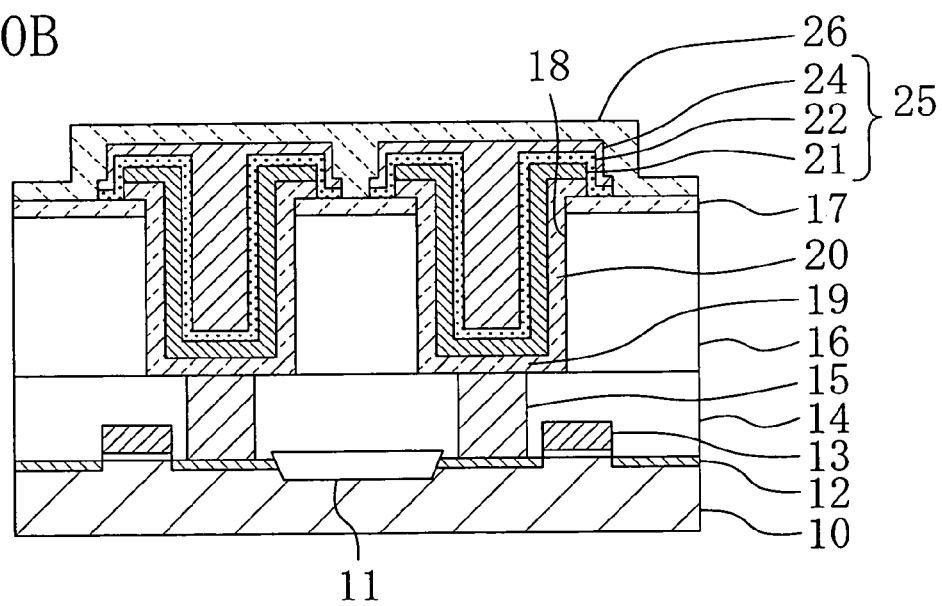

As shown in FIG. 2B, the contact holes 23 for exposing the lower electrodes 21 are formed by performing etching with respect to the dielectric thin film, though they are not shown in FIGS. 10A and 10B. In this case, dry etching using a gas containing fluorine is performed. The contact holes 23 function to provide connection between the upper and lower electrodes 24 and 21, which will be described later. This allows electric signals to be transmitted to the upper electrodes 24 via the lower electrodes 21.

Next, an electrode material made of Pt is deposited to cover the upper and side surfaces of the dielectric thin film and the side surfaces and bottom portions of the contact holes 23. Then, dry etching using a gas containing chlorine or fluorine is performed to process each of the electrode material and the dielectric thin film into a desired configuration, thereby forming the capacitor dielectric films 22 and the upper electrodes 24. Each of the upper electrodes 24 is formed to oppose the plurality of lower electrodes 21. The thicknesses of the upper electrodes 24 are in a range of 10 nm to 50 nm.

By thus forming the lower electrodes 21, the capacitor dielectric films 22, and the upper electrodes 23 in regions extending from within the holes 18 toward positions above the holes 18, the capacitor elements 25 for information storage each having the depressed three-dimensional configuration are completed.

In the present embodiment, the edge portion of each of the upper electrodes 24 and the edge portion of each of the capacitor dielectric films 22 are formed to have the same configuration. This achieves a reduction in the number of times of mask formation.

The processing of the electrode material into a desired configuration using dry etching allows the first hydrogen barrier film 17 to be exposed in the regions in which the upper electrodes 24 and the capacitor dielectric films 22 are not formed.

As shown in FIG. 10B, the second hydrogen barrier film 26 made of $Al_2O_3$ or TiAlN is formed by sputtering or CVD over the upper and side surfaces of the upper electrodes 24 and the side surfaces of the capacitor dielectric films 22. The second hydrogen barrier film 26 is inevitably in contact with the first hydrogen barrier film 17 in the regions in which the upper electrodes 24 and the capacitor dielectric films 22 are not formed. Consequently, each of the capacitor elements 25 is completely covered with the first, second, third, and fourth hydrogen barrier films 17, 26, 20, and 19. This prevents the degradation of the characteristics of the capacitor element resulting from the reduction of the capacitor dielectric film by hydrogen.

Even after the formation of the structure in which the capacitor element is completely covered with the hydrogen barrier films, a large level difference as observed in the conventional embodiments is not produced. This allows easy obtention of a focus margin in a range achievable with the performance of a stepper in a lithographic step during wiring formation performed after the formation of the capacitor elements 25. Moreover, since the level difference present in the step of forming the second hydrogen barrier film 26 covering the upper portion and sidewalls of the capacitor element 25 is also extremely small, a focus margin in a range achievable with the performance of a stepper in a lithographic step performed to form a mask pattern for processing the hydrogen barrier film 26 can also be obtained easily.

Variation 1 of Embodiment 2

A method for fabricating the capacitor element according to a first variation of the second embodiment will be described herein below with reference to FIGS. 3, 9A to 9C, 10A, and 10B. Because the method for fabricating the capacitor element according to the first variation of the second embodiment is a method for fabricating the capacitor element shown in FIG. 3 and is characterized in that the fifth hydrogen barrier films 27 are disposed, the description will be given mainly to the characteristic portion herein below.

As shown in FIG. 3, the steps prior to and inclusive of the step of forming the plug contacts 15 are the same as in the description given above with reference to FIG. 9A.

Next, the hydrogen barrier material made of TiAlN is deposited entirely over the lower-layer insulating film 14 and the plug contacts 15. Then, the hydrogen barrier material is processed into a desired configuration by dry etching using a gas containing chlorine to form the fifth hydrogen barrier films 27 each having a thickness in a range of 10 to 100 nm.

Next, an insulating film made of $SiO_2$ is deposited on the lower-layer insulating film 14 to cover the fifth hydrogen barrier films 27. Then, the insulating film is planarized by CMP to form the interlayer insulating film 16. The thickness of the interlayer insulating film 16 is controlled to be 1 µm or more over the fifth hydrogen barrier films 27.

Next, the first hydrogen barrier film 17 made of SiN is formed by CVD on the interlayer insulating film 16. Since it is sufficient for the first hydrogen barrier film 17 to have a minimum thickness that can prevent the diffusion of hydrogen or more, the thickness of the first hydrogen barrier film 17 is adjusted to 10 nm or more.

The subsequent steps are the same as in FIGS. 9B, 9C, 10A, and 10B described above.

Thus, the provision of the fifth hydrogen barrier films 27 allows the enhancement of the barrier property against the diffusion of hydrogen into the capacitor elements 25 from therebelow.

Variation 2 of Embodiment 2

A method for fabricating the capacitor element according to a second variation of the second embodiment will be described herein below with reference to FIGS. 4, 9A to 9C, 10A, and 10B. The method for fabricating the capacitor element according to the second variation of the second embodiment is a method for fabricating the capacitor element shown in FIG. 4 and is characterized in that only the third hydrogen barrier films 20 disposed on the sidewalls of the holes 18 are formed and the fifth hydrogen barrier films 27 are disposed. Since the method for disposing the fifth hydrogen barrier films 27 has been described above in the first variation, the description will be given mainly to a method for disposing only the third hydrogen barrier films 20 on the sidewalls of the holes 18 herein below.

As shown in FIG. 4, the steps prior to and inclusive of the step of forming the plug contacts 15 are the same as in the description given above with reference to FIG. 9A.

Next, the hydrogen barrier material made of TiAlN is deposited entirely over the lower-layer insulating film 14 and the plug contacts 15. Then, the hydrogen barrier material is processed into a desired configuration by dry etching using a gas containing chlorine to form the fifth hydrogen barrier films 27 each having a thickness in a range of 10 to 100 nm.

As shown in FIG. 4, the steps prior to and inclusive of the step of forming the plug contacts 15 are the same as in the description given above with reference to FIG. 9A. In addition, the steps prior to and inclusive of the step of forming the fifth and first hydrogen barrier films 27 and 17 are the same as described above in the first variation of the second embodiment. Further, the step of forming the holes 18 is the same as the step shown in FIG. 9B described above.

Next, an insulating hydrogen barrier material such as SiN or $Al_2O_3$ or the hydrogen barrier material made of TiAlN is deposited on the entire surface of the first hydrogen barrier film 17 by sputtering or CVD to cover the bottom portions and sidewalls of the holes 18.

Next, an etch-back process is performed by anisotropic dry etching with respect to the entire surface of the substrate, thereby forming the third hydrogen barrier films 20 only on the sidewalls of the holes 18. The dry etching process uses a gas containing fluorine or chlorine.

The structure in which only the third hydrogen barrier films 20 are disposed on the sidewalls of the holes 18 and the fourth hydrogen barrier films 19 are not disposed on the bottom portions of the holes 18 offers the advantage of allowing the use of the insulating hydrogen barrier material for the third hydrogen barrier films 20. In other words, the range of choices among materials to be used for the third hydrogen barrier films 20 can be widened advantageously.

Next, the electrode material composed of $Pt/IrO_2/Ir$ multiple layers (in a top-to-bottom stacking order) is formed by sputtering or CVD over the entire surface of the substrate. Then, the electrode material is processed into a desired configuration by dry etching using a gas containing chlorine, thereby forming the lower electrodes 21.

The subsequent steps are the same as in the description given above with reference to FIGS. 10A and 10B.

Variation 3 of Embodiment 2

A method for fabricating the capacitor element according to a third variation of the second embodiment will be described herein below with reference to FIGS. 5A, 5B, 6A, 6B, 9A to 9C, 10A, and 10B. The method for fabricating the capacitor element according to the third variation of the second embodiment is a method for fabricating the capacitor element shown in FIGS. 5A, 5B, 6A, and 6B. In contrast to the first and second variations described above, the third variation is characterized in that the sixth hydrogen barrier film 28 is disposed so that the description will be given mainly to a method for disposing the sixth hydrogen barrier film 28 herein below.

As shown in FIGS. 5A, 5B, 6A, and 6B, the isolation region 11 and the active regions 12 are formed on the semiconductor substrate 10 and the gates 13 are further formed thereon.

Next, $SiO_2$ or SiN is deposited to cover the entire surface of the semiconductor substrate 10 by CVD and then planarized by CMP (Chemical Mechanical Polishing) to form the lower-layer insulating film 14 having a thickness of 500 to 1000 nm.

Next, the sixth hydrogen barrier film 28 made of SiN, $Al_2O_3$, or TiAlO is deposited on the lower-layer insulating film 14 by CVD or sputtering. The thickness of the sixth hydrogen barrier film 28 is in a range of 10 to 150 nm.

Next, the contact holes connecting to the active regions 12 are formed in the sixth hydrogen barrier film 28 and the lower-layer insulating film 14 by dry etching.

Next, tungsten or low-resistance polysilicon doped with an n-type impurity is deposited on the entire surface of the sixth hydrogen barrier film 28 including the insides of the contact holes by CVD. Then, the tungsten or low-resistance polysilicon doped with an n-type impurity that has been deposited on the sixth hydrogen barrier film 28 is removed by CMP to form the plug contacts 15.

In the case of forming the capacitor elements shown in FIG. 5A, the interlayer insulating film 16 and the first hydrogen barrier film 17 are deposited subsequently over the sixth hydrogen barrier film 28 and the plug contacts 15 in the same manner as in the step shown in FIG. 9A. As for the subsequent steps, they are the same as shown in FIGS. 9B, 9C, 10A, and 10B.

In the case of forming the capacitor elements shown in FIG. 5B, the interlayer insulating film 16 and the first hydrogen barrier film 17 are deposited over the sixth hydrogen barrier film 28 and the plug contacts 15 in the same manner as in the step shown in FIG. 9A. Thereafter, the holes 18 are formed in the same manner as described above in the second variation and then the third hydrogen barrier films 20 are disposed on the sidewalls of the holes 18. As for the subsequent steps, they are the same as shown in FIGS. 9B, 9C, 10A, and 10B.

In the case of forming the capacitor elements shown in FIG. 6A, the fifth hydrogen barrier films 27 in contact with the upper ends of the plug contacts 15 are formed over the sixth hydrogen barrier film 28 and the plug contacts 15 in the same manner as described above in the first variation. As for the subsequent steps, they may be performed appropriately in the same manner as described above in the first variation.

In the case of forming the capacitor elements shown in FIG. 6B, the fifth hydrogen barrier films 27 in contact with the upper ends of the plug contacts 15 are formed over the sixth hydrogen barrier film 28 and the plug contacts 15 in the same manner as described above in the second variation. As for the subsequent steps, they may be performed appropriately in the same manner as described above in the second variation.

By thus providing the sixth hydrogen barrier film 28, the barrier property against the diffusion of hydrogen into the capacitor elements 25 from therebelow can be enhanced.

Variation 4 of Embodiment 2

A method for fabricating the capacitor element according to a fourth variation of the second embodiment will be described herein below with reference to FIGS. 7A, 7B, 8A, 8B, 9A to 9C, 10A, and 10B. The method for fabricating the capacitor element according to the fourth variation of the second embodiment is a method for fabricating the capacitor element shown in FIGS. 7A, 7B, 8A, and 8B. In contrast to the first to third variations described above, the fourth variation is characterized in that the seventh hydrogen barrier films 29 are disposed so that the description will be given mainly to a method for disposing the seventh hydrogen barrier films 29 herein below.

As shown in FIGS. 7A, 7B, 8A, and 8B, the isolation region 11 and the active regions 12 are formed on the semiconductor substrate 10 and the gates 13 are further formed thereon.

Next, $SiO_2$ or SiN is deposited to cover the entire surface of the semiconductor substrate 10 by CVD and then planarized by CMP (Chemical Mechanical Polishing) to form the lower-layer insulating film 14 having a thickness of 500 to 1000 nm.

Next, the sixth hydrogen barrier film 28 made of SiN, $Al_2O_3$, or TiAlO is deposited on the lower-layer insulating film 14 by CVD or sputtering. The thickness of the sixth hydrogen barrier film 28 is in a range of 10 to 150 nm.

Next, the contact holes connecting to the active regions 12 are formed in the sixth hydrogen barrier film 28 and the lower-layer insulating film 14 by dry etching.

Next, tungsten or low-resistance polysilicon doped with an n-type impurity is deposited on the entire surface of the sixth hydrogen barrier film 28 including the insides of the contact holes by CVD. Then, the tungsten or low-resistance polysilicon doped with an n-type impurity that has been deposited on the sixth hydrogen barrier film 28 is removed by CMP to form the plug contacts 15.

Next, a dry etching process is performed to etch back the tungsten or the low-resistance polysilicon inside each of the plug contacts 15, thereby forming recesses. The etch-back process uses a gas containing fluorine. The depth of each of the recesses is in a range of 20 to 100 nm.

Next, the hydrogen barrier material made of TiAlN with a thickness of 10 to 150 nm is deposited on the entire surface of the substrate to be buried in the recesses formed in the plug contacts 15.

Next, the portions of the hydrogen barrier material which have been deposited outside the recesses are removed by CMP or an etch-back process to form the seventh hydrogen barrier films 29 only in the recesses.

In the case of forming the capacitor elements shown in FIG. 7A, the interlayer insulating film 16 and the first hydrogen barrier film 17 are deposited subsequently over the sixth hydrogen barrier film 28 and the plug contacts 15 in the same manner as in the step shown in FIG. 9A. As for the subsequent steps, they are the same as shown in FIGS. 9B, 9C, 10A, and 10B.

In the case of forming the capacitor elements shown in FIG. 7B, the interlayer insulating film 16 and the first hydrogen barrier film 17 are deposited over the sixth hydrogen barrier film 28 and the plug contacts 15 in the same manner as in the step shown in FIG. 9A. Thereafter, the holes 18 are formed in the same manner as described above in the second variation and then the third hydrogen barrier films 20 are disposed on the sidewalls of the holes 18. As for the subsequent steps, they are the same as shown in FIGS. 9B, 9C, 10A, and 10B.

In the case of forming the capacitor elements shown in FIG. 8A, the fifth hydrogen barrier films 27 in contact with the upper surfaces of the seventh hydrogen barrier films 29 are formed over the sixth hydrogen barrier film 28 and the seventh hydrogen barrier films 29 in the same manner as described above in the first variation. As for the subsequent steps, they may be performed appropriately in the same manner as described above in the first variation.

In the case of forming the capacitor elements shown in FIG. 8B, the fifth hydrogen barrier films 27 in contact with the upper surfaces of the seventh hydrogen barrier films 29 are formed over the sixth hydrogen barrier film 28 and the seventh hydrogen barrier films 29 in the same manner as described above in the second variation. As for the subsequent steps, they may be performed appropriately in the same manner as described above in the second variation.

By thus providing the seventh hydrogen barrier films 29, the barrier property against the diffusion of hydrogen into the capacitor elements 25 from therebelow can be enhanced.

Embodiment 3

A capacitor element according to the third embodiment of the present invention will be described herein below with reference to FIG. 11 to FIGS. 17A and 17B.

Figure 11:
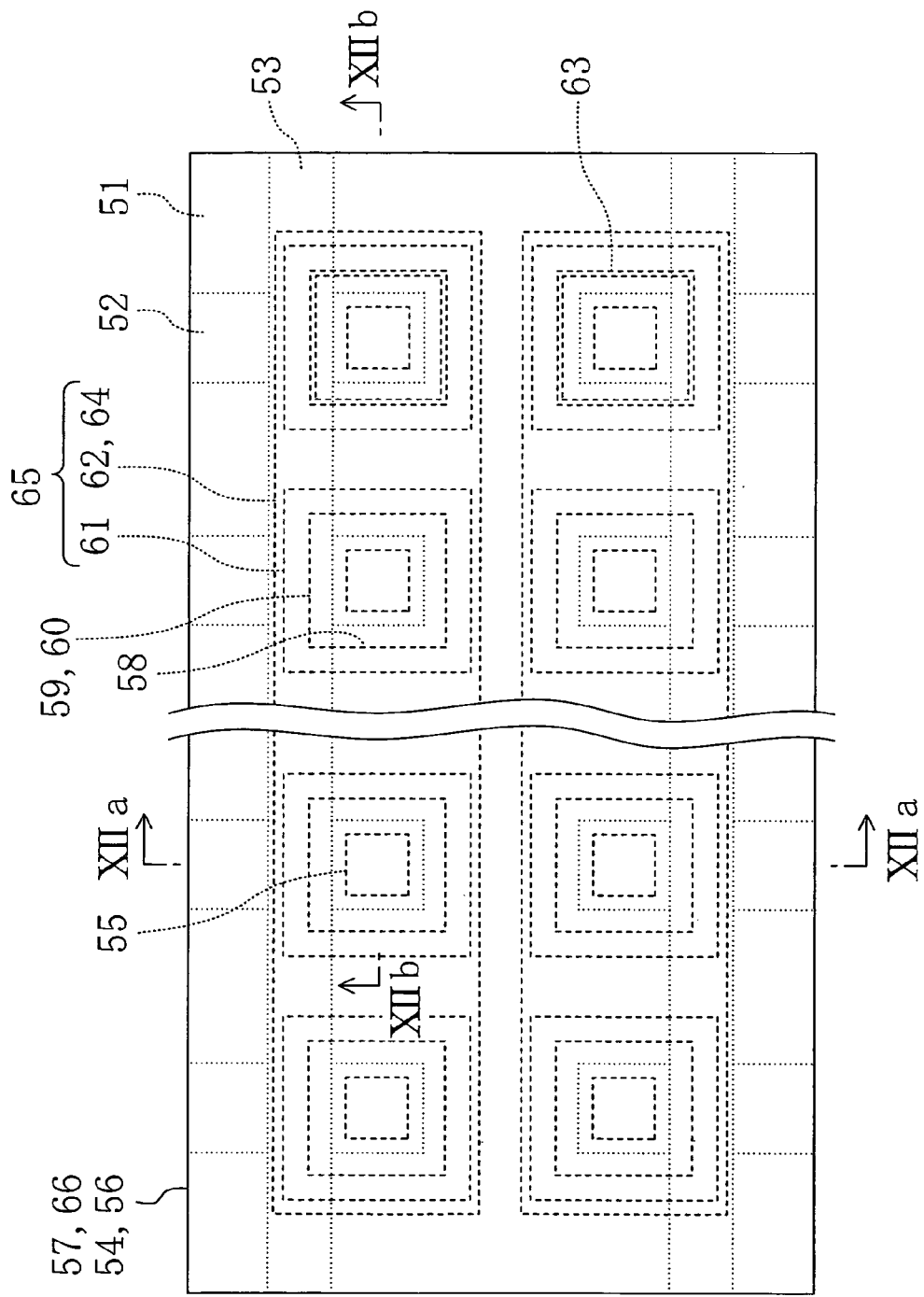
FIG. 11 is a principal-portion plan view of a capacitor element according to a third embodiment of the present invention.

FIG. 11 shows a principal-portion plan view of a semiconductor memory device using a capacitor element having a three-dimensional structure (generally called cylindrical type) according to the third embodiment. FIGS. 12A and 12B show principal-portion cross-sectional views of the semiconductor memory device using a three-dimensional structure according to the third embodiment. Specifically, FIG. 12A is a principal-portion cross-sectional view taken along the line XIIa-XIIa of FIG. 11 and FIG. 12B is a principal-portion cross-sectional view taken along the line XIIb-XIIb of FIG. 11.

As shown in FIGS. 11, 12A, and 12B, an isolation region 51 and active regions 52 are formed on a semiconductor substrate 50 and gates 53 are further formed thereon. A lower-layer insulating film 54 made of $SiO_2$ or SiN with a thickness of 500 to 1000 nm is formed over the entire surface of the semiconductor substrate 50 having the isolation region 51 and the active regions 52 to cover the gates 53. Plug contacts 55 made of tungsten or a low-resistance polysilicon doped with an n-type impurity and having lower ends thereof in contact with the active regions 52 are formed in the lower-layer insulating film 54.

An interlayer insulating film 56 made of $SiO_2$ with a thickness of 300 to 1000 nm is formed over the lower-layer insulating film 54 and the plug contacts 55. A first hydrogen barrier film 57 made of SiN is formed on the upper surface of the interlayer insulating film 56. Since it is sufficient for the first hydrogen barrier film 57 to have a minimum thickness that can prevent the diffusion of hydrogen or more, the thickness of the first hydrogen barrier film 57 has been adjusted to 10 nm or more in the present embodiment.

Holes 58 for exposing the upper ends of the plug contacts 55 are formed in the interlayer insulating film 56 and the first hydrogen barrier film 57. Fourth hydrogen barrier films 59 made of conductive TiAlN are disposed on the bottom portions of the holes 58 to have lower surfaces thereof in contact with the upper ends of the plug contacts 55. In addition, third hydrogen barrier films 60 similarly made of TiAlN and each having a cylindrical configuration are disposed on the sidewalls of the holes 58 to have outer side surfaces thereof in contact with the first hydrogen barrier film 57. As a result, the upper surface of each of the third hydrogen barrier films 60 is positioned higher in level than the upper surface of the first hydrogen barrier film 57 and has a configuration protruding upwardly from the upper surface of the first hydrogen barrier film 57. The third hydrogen barrier films 60 are also in contact with the fourth hydrogen barrier films 59. In the present embodiment, the distance from the upper surface of the first hydrogen barrier film 57 to the upper surface of each of the third hydrogen barrier films 60 has been adjusted to a range of 20 nm to 200 nm. Since it is sufficient for each of the third and fourth hydrogen barrier films 59 and 60 to have a minimum thickness that can prevent the diffusion of hydrogen or more, the thickness thereof has been adjusted to 10 nm or more in the present embodiment. To provide a sufficient capacitance, the height (distance from the lower surface located at the bottom portion of each of the holes 58 to the upper surface) of each of the third hydrogen barrier films 60 has been adjusted to 0.5 μm or more. The present embodiment has allowed the fourth and third hydrogen barrier films 59 and 60 to be formed in the same step by using the same material for the fourth and third hydrogen barrier films 59 and 60.

Each of the third and fourth hydrogen barrier films 59 and 60 also functions as an oxygen barrier film for preventing an increase in contact resistance caused by oxygen reaching the plug contact 55 during annealing in an atmosphere containing oxygen at a high temperature (600° C. to 800° C.), which is indispensable to the crystallization of capacitor dielectric films 62 described later.

Lower electrodes 61 are formed over the surfaces of the third and fourth hydrogen barrier films 59 and 60 and the first hydrogen barrier film 57. In the present embodiment, each of the lower electrodes 61 has, e.g., a Pt/IrO$_2$/Ir multilayer structure (in a top-to-bottom stacking order). The IrO$_2$/Ir layers are oxygen barrier films for preventing an increase in contact resistance caused by oxygen reaching the plug contact 55 during annealing in an atmosphere containing oxygen at a high temperature (600° C. to 800° C.), which is inevitable to the crystallization of the capacitor dielectric films, as described above. The thickness of each of the Pt, IrO$_2$, and Ir films composing the lower electrode 61 is in a range of 10 nm to 50 nm.

Each of the capacitor dielectric films 62 made of SrBi$_2$(Ta$_x$Nb$_{1-x}$)$_2$O$_9$ (0≦x≦1) is formed over the upper and side surfaces of the plurality of lower electrodes 61 and the upper surface of the first hydrogen barrier film 57. To form the capacitor dielectric films 62 to cover the lower electrodes 61 each having the three-dimensional structure, the capacitor dielectric films 62 are formed by metal organic chemical vapor deposition (MOCVD). The thicknesses of the capacitor dielectric films 62 are in a range of 12.5 nm to 100 nm.

As shown in FIG. 12B, contact holes 63 provided to expose the lower electrodes 61 are formed in the capacitor dielectric films 62. The contact holes 63 function to provide connection between upper electrodes 64, which will be described later, and the lower electrodes 61. The upper electrodes 64 made of Pt are formed to cover the upper and side surfaces of the capacitor dielectric films 62 and the side surfaces and bottom portions of the contact holes 63. Consequently, electric signals are transmitted to the upper electrodes 64 via the lower electrodes 61. The structure has the advantage of obviating the necessity to form contact holes in a second hydrogen barrier film 66, which will be described later, for covering the upper portions of the upper electrodes 64 to provide electric connection between the upper electrodes 64 and wiring formed thereabove, i.e., the necessity to remove the second hydrogen barrier film 66. Accordingly, a structure in which each of the capacitor elements is completely covered with the hydrogen barrier films can easily be implemented.

In addition, the upper electrodes 64 made of Pt have been formed to cover the upper and side surfaces of the capacitor dielectric films 62 and the insides of the contact holes 63 in opposing relation to the plurality of lower electrodes 61. The film thickness of each of the upper electrodes 64 is in a range of 10 nm to 50 nm in the regions located over the third hydrogen barrier film 60. In the present embodiment, the side surface of the edge portion of each of the upper electrodes 64 and the side surface of the edge portion of each of the capacitor dielectric films 62 are formed to have the same configuration. This achieves a reduction in the number of times of mask formation during the formation of the upper electrodes 64 and during the formation of the capacitor dielectric films 62. By thus forming the lower electrodes 61, the capacitor dielectric films 62, and the upper electrodes 64 in regions extending from within the holes 58 toward positions above the holes 18 along the inner walls of the holes 58, the capacitor elements 65 for information storage each having the cylindrical three-dimensional configuration are completed.

Moreover, the second hydrogen barrier film 66 made of Al$_2$O$_3$ or TiAlN has also been formed to cover the upper and side portions of the capacitor elements 65 which are positioned higher in level than the first hydrogen barrier film 57. The second hydrogen barrier film 66 is in contact with the first hydrogen barrier film 57 in the regions in which the upper electrodes 64 and the capacitor dielectric films 62 are not formed.

Thus, each of the capacitor elements 65 is covered completely with the first, second, third, and fourth hydrogen barrier films 57, 66, 60, and 59. Accordingly, the level difference when or after the second hydrogen barrier film 66 is formed becomes the total sum of the respective film thicknesses of the upper electrode 64, the capacitor dielectric film 62, and the lower electrode 61 and the distance from the upper surface of the first hydrogen barrier film 57 to the upper surface of each of the third hydrogen barrier films 60. Specifically, an extremely small level difference of about 500 nm at the maximum is produced.

Consequently, the capacitor element 65 is completely covered with the first, second, third, and fourth hydrogen barrier films 57, 66, 60, and 59.

As described above, the level difference produced in the case where the second hydrogen barrier film 66 is formed is about 500 nm at the maximum so that the level difference is extremely small compared with the case where the first hydrogen barrier film 57 is disposed directly on the lower-layer insulating film 54.

Thus, the capacitor element according to the present embodiment is completely covered with the first, second, third, and fourth hydrogen barrier films. This prevents the degradation of the characteristics of the capacitor element resulting from the reduction of the capacitor dielectric films by hydrogen. In addition, even after the formation of the structure in which the capacitor element is completely covered with the hydrogen barrier films, only an extremely small level difference is produced. This allows easy obtention of a focus margin in a range achievable with the performance of a stepper in a lithographic step during wiring formation performed after the formation of the capacitor elements. Moreover, since the level difference present in the step of forming the hydrogen barrier film covering the upper portion and sidewalls of the capacitor element is also extremely small, a focus margin in a range achievable with the performance of a stepper in a lithographic step performed to form a mask pattern for processing the hydrogen barrier film can also be obtained easily.

Variation 1 of Embodiment 3

A capacitor element according to a first variation of the third embodiment will be described herein below with reference to FIG. 13A. The same reference numerals will be retained for those of the components shown in FIG. 13A which are common to the components shown in FIGS. 12A and 12B and the description thereof will not be repeated.

Figure 13A:
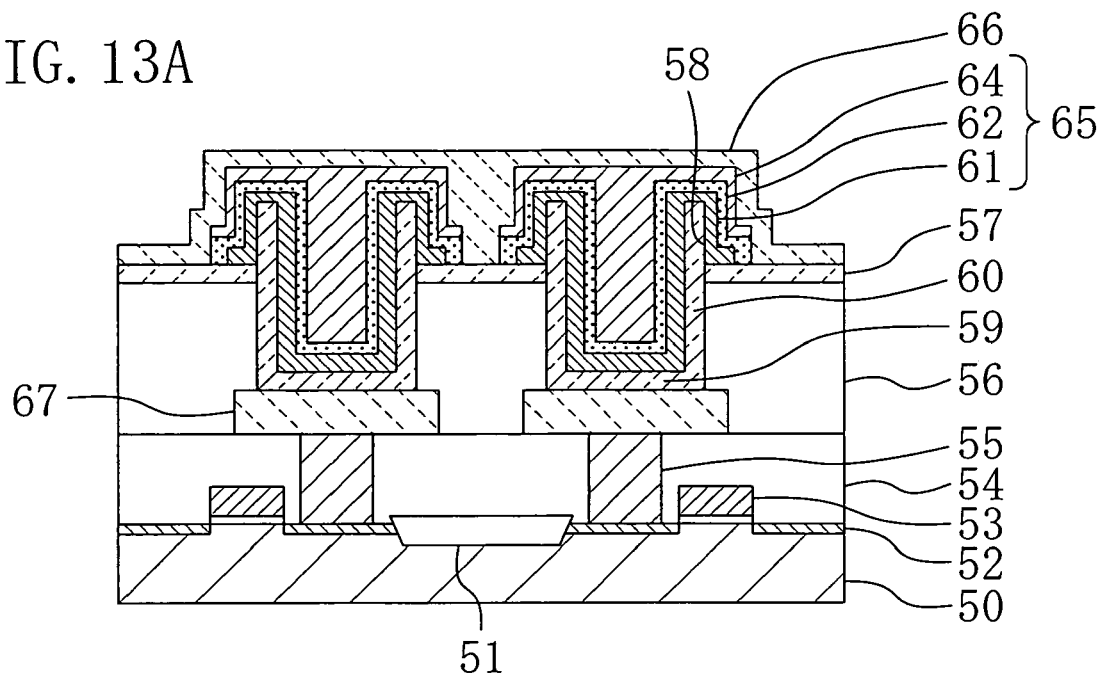
FIG. 13A is a principal-portion cross-sectional view of a capacitor element according to a first variation of the third embodiment and FIG. 13B is a principal-portion cross-sectional view of a capacitor element according to a second variation of the third embodiment.

FIG. 13A shows a principal-portion cross-sectional view of the capacitor element according to the first variation of the second embodiment. Herein below, the description will be given mainly to the difference between the capacitor element shown in FIG. 13A and the capacitor element shown in FIG. 12A.

As shown in FIG. 13A, fifth hydrogen barrier films 67 made of TiAlN are disposed on the lower-layer insulating film 54 to cover the respective upper ends of the plug contacts 55. The fifth hydrogen barrier films 67 have upper surfaces thereof in contact with the lower surfaces of the fourth hydrogen barrier films 59 disposed on the bottom portions of the holes 58 and with the end portions of the third hydrogen barrier films 60 disposed on the sidewalls of the holes 58. As can be seen from FIG. 13A, the upper surface of each of the fifth hydrogen barrier films 67 preferably has an area not less than an area occupied by the bottom portion of each of the holes 58 in terms of more reliably prohibiting an ingression of hydrogen from below the hole 58. However, the area occupied by the upper surface of each of the fifth hydrogen barrier films 67 is not limited to the case shown in FIG. 13A since the fourth hydrogen barrier films 59 are disposed on the fifth hydrogen barrier films 67.

Thus, in the capacitor element according to the first variation, the provision of the fifth hydrogen barrier films 67 allows the enhancement of a barrier property against the diffusion of hydrogen entering the capacitor element from below the hole 58. Accordingly, the degradation of the characteristics of the capacitor element resulting from the reduction of the capacitor dielectric film by hydrogen can be prevented.

The fifth hydrogen barrier film 67 also functions as an oxygen barrier film for preventing an increase in contact resistance caused by oxygen reaching the plug contact 55 during annealing in an atmosphere containing oxygen at a high temperature (600° C. to 800° C.), which is indispensable to the crystallization of a capacitor dielectric films 62. The film thickness of each of the fifth hydrogen barrier films 67 has been adjusted to a range of 10 nm to 100 mm.

Variation 2 of Embodiment 3

A capacitor element according to a second variation of the third embodiment will be described herein below with reference to FIG. 13B. The same reference numerals will be retained for those of the components shown in FIG. 13B which are common to the components shown in FIGS. 12A and 12B and the description thereof will not be repeated.

Figure 13B:
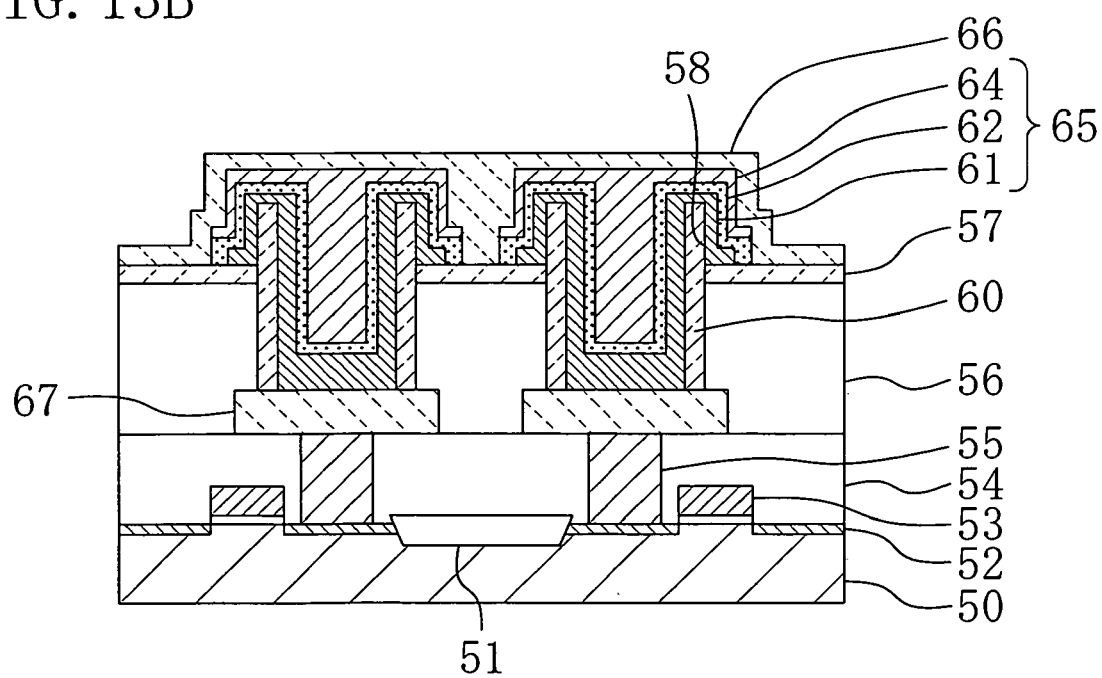

FIG. 13B shows a principal-portion cross-sectional view of the capacitor element according to the second variation of the third embodiment. Herein below, the description will be given mainly to the difference between the capacitor element shown in FIG. 13B and the capacitor element shown in FIG. 12A.

As shown in FIG. 13B, the fifth hydrogen barrier films 67 made of a conductive material are disposed on the lower-layer insulating film 54 to cover the upper ends of the plug contacts 55. Since the fourth hydrogen barrier films 59 are not formed on the bottom portions of the holes 58, the upper surface of each of the fifth hydrogen barrier films 67 has an area not less than the area occupied by the bottom portion of each of the holes 58 and is in contact with the lowermost surface of the lower electrode 61 and with the end portion of the third hydrogen barrier film 60. In the second variation, TiAlN is used for the fifth hydrogen barrier films 67 and the thicknesses thereof have been adjusted to a range of 10 nm to 100 mm.

Thus, the capacitor element according to the second variation has a first advantage of implementing a structure in which the capacitor element 65 is completely covered with the first, second, third, and fifth hydrogen barrier films 57, 66, 60, and 67 even in the case where the fourth hydrogen barrier films 59 shown in FIG. 12A are not formed.

A second advantage of the capacitor element according to the second variation is that an insulating material can be used for the third hydrogen barrier films 60. To achieve the high integration of a capacitor element, it is generally necessary to minimize the diameter of each of the holes 58 and maximize the depth of the hole 58. For a film formed inside the hole 58, a material which is excellent in step coverage and capable of reducing the film thickness (preferably 50 nm or less) may be used advantageously. As a method for depositing a film excellent in step coverage, there can be listed chemical vapor deposition (CVD), atomic layer deposition (ALD), or the like. However, film deposition by CVD or ALD is extremely difficult when a conductive material represented by metal is used. By contrast, film deposition by CVD or ALD is easier when an insulating material is used. In the second variation, therefore, the use of, e.g., $Al_2O_3$ for the third hydrogen barrier films 60 allows improved step coverage and a reduction in the thickness of each of the third hydrogen barrier films 60, thereby achieving the higher integration of the capacitor element. The thicknesses of the third hydrogen barrier films 60 have been adjusted to a range of 2 nm to 20 nm.

Variation 3 of Embodiment 3

A capacitor element according to a third variation of the third embodiment will be described herein below with reference to FIGS. 14A, 14B, 15A, and 15B.

FIGS. 14A, 14B, 15A, and 15B show principal-portion cross-sectional views of the capacitor element according to the third variation of the third embodiment. The same reference numerals will be retained for those of the components shown in FIGS. 14A, 14B, 15A, and 15B which are common to the components shown in FIGS. 12A, 12B, 13A, and 13B and the description thereof will not be repeated.

Because the characteristic portion of the capacitor element according to the third variation is that a sixth hydrogen barrier film 68 is disposed, the description will be given mainly to the characteristic portion herein below.

Figure 14A:
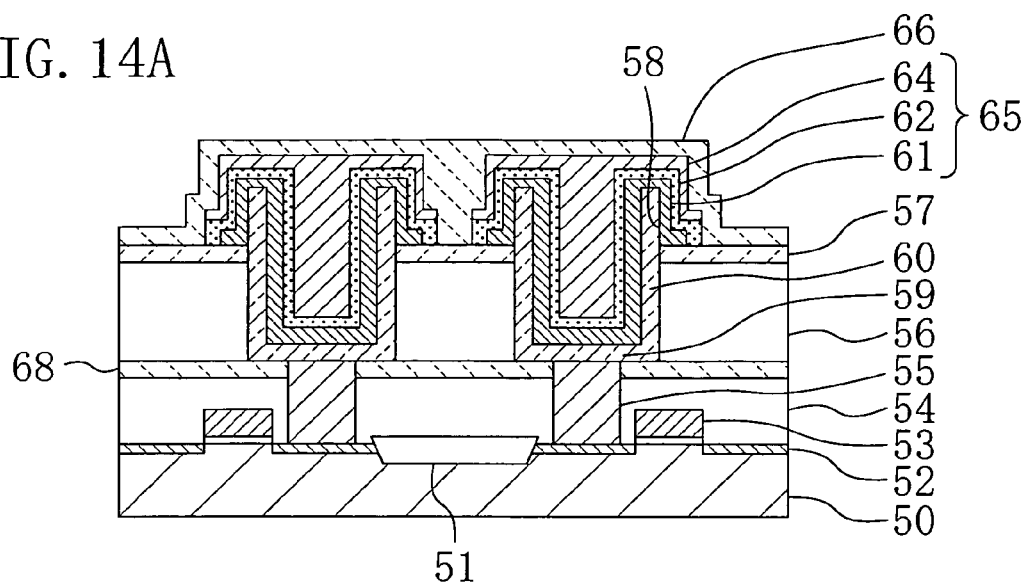
FIGS. 14A and 14B are principal-portion cross-sectional views of a capacitor element according to a third variation of the third embodiment.

First, the structure of the capacitor element according to the third variation shown in FIG. 14A is greatly different from the structure shown in FIG. 12A in that the sixth hydrogen barrier film 68 made of SiN is disposed in the uppermost layer of the lower-layer insulating film 54. The sixth hydrogen barrier film 68 has an upper surface thereof in contact with the bottom surfaces of the fourth hydrogen barrier films 59 and with the end portions of the third hydrogen barrier films 60.

Figure 14B:
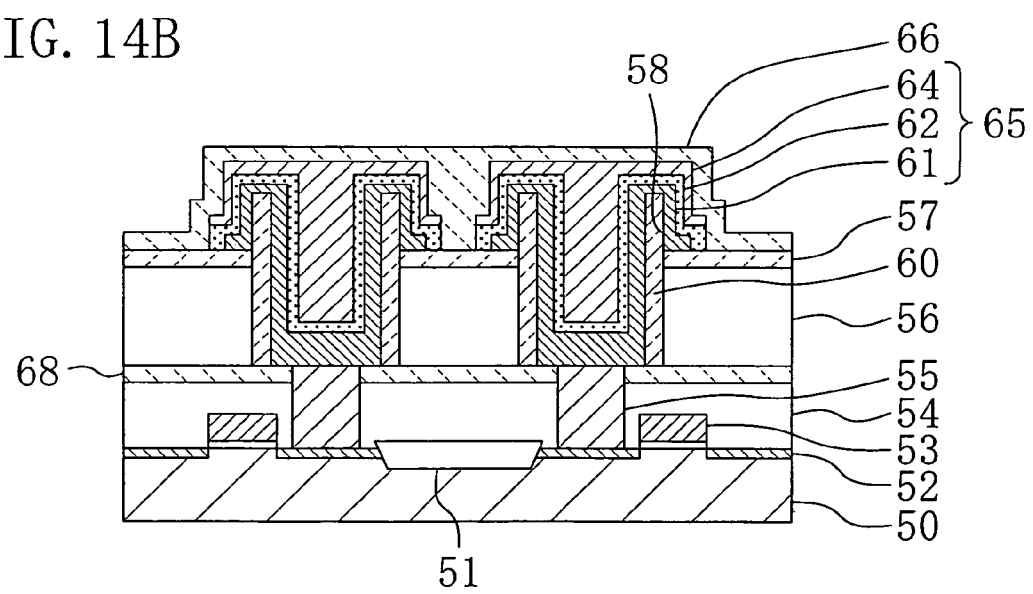

Next, the structure of the capacitor element according to the third variation shown in FIG. 14B is greatly different from the structure shown in FIG. 12B in that the fourth hydrogen barrier films 59 are not formed and the sixth hydrogen barrier film 68 made of SiN is formed in the uppermost layer of the lower-layer insulating film 54. The sixth hydrogen barrier film 68 has the upper surface thereof in contact with the bottom surfaces of the lower electrodes 61 and with the end portions of the third hydrogen barrier films 60.

Figure 15A:
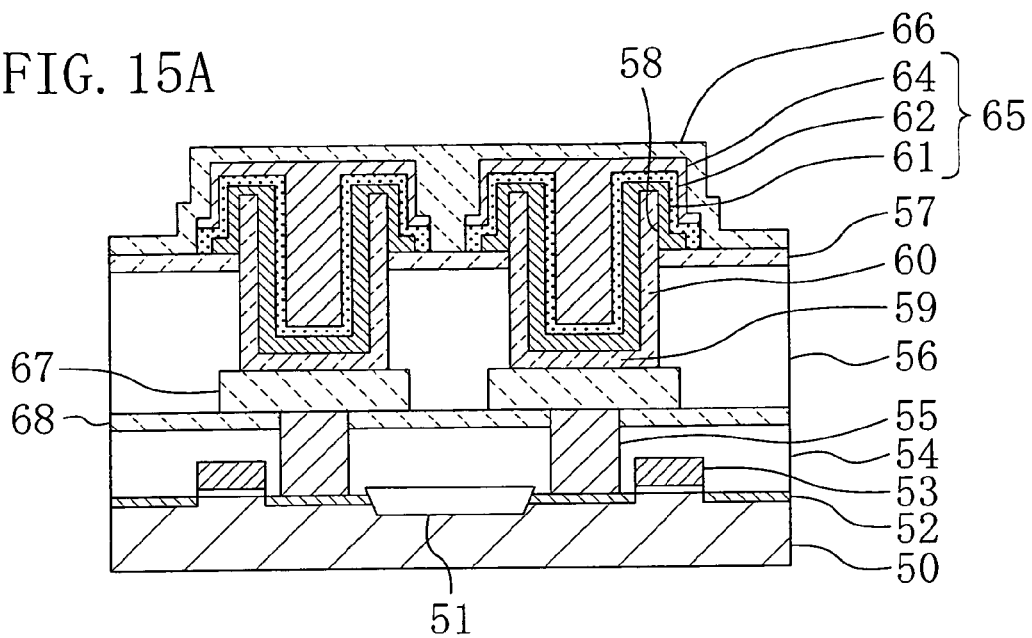
FIGS. 15A and 15B are principal-portion cross-sectional views of the capacitor element according to the third variation of the third embodiment.

Moreover, the structure of the capacitor element according to the third variation shown in FIG. 15A is greatly different from the structure shown in FIG. 13A in that the sixth hydrogen barrier film 68 made of SiN is disposed in the uppermost layer of the lower-layer insulating film 54. The sixth hydrogen barrier film 68 has the upper surface thereof in contact with the bottom surfaces of the fifth hydrogen barrier films 67. As for the size of the area occupied by the upper surface of each of the fifth hydrogen barrier films 67, it is the same as described above in the first variation.

Figure 15B:
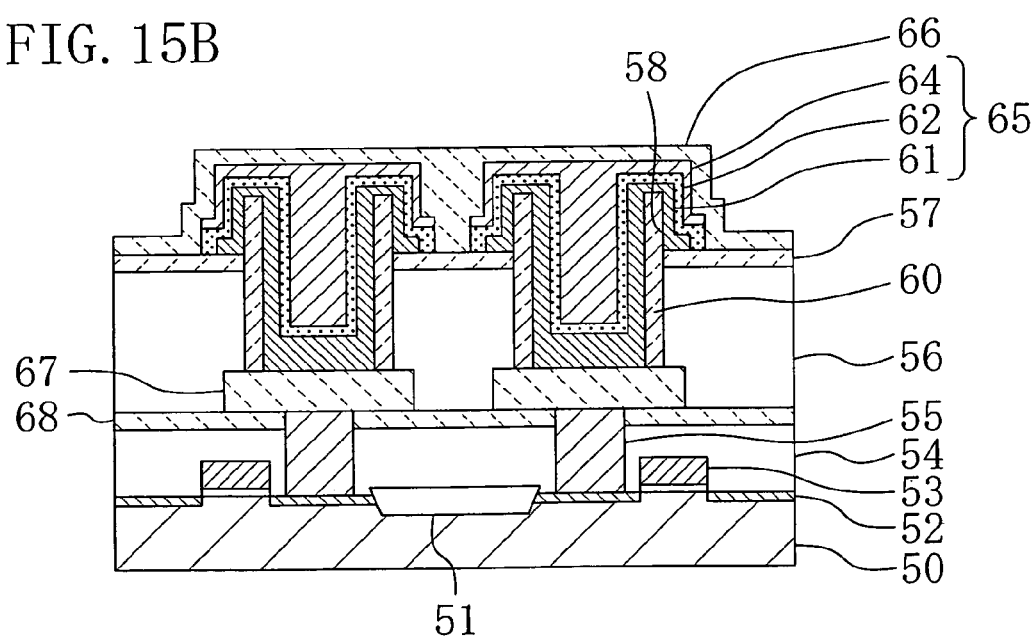

Furthermore, the structure of the capacitor element according to the third variation shown in FIG. 15B is greatly different from the structure shown in FIG. 13B in that the sixth hydrogen barrier film 68 made of SiN is disposed in the uppermost layer of the lower-layer insulating film 54. The sixth hydrogen barrier film 68 has the upper surface thereof in contact with the bottom surfaces of the fifth hydrogen barrier films 67. As for the size of the area occupied by the upper surface of each of the fifth hydrogen barrier films 67, it is the same as described above in the second variation.

Thus, the sixth hydrogen barrier film 68 shown in FIGS. 14A, 14B, 15A, and 15B does not require a new mask every time it is disposed and processed. In the capacitor elements shown in FIGS. 14A, 14B, 15A, and 15B, therefore, the barrier property against the diffusion of hydrogen entering the capacitor element from below the hole 58, particularly from the lower-layer insulating film 54 can further be enhanced. As a result, it becomes possible to prevent the degradation of the characteristics of the capacitor element 65 resulting from the reduction of the capacitor dielectric film 62 by hydrogen. In the capacitor elements shown in FIGS. 14B and 15B, the use of an insulating material for the third hydrogen barrier films 60 allows improved step coverage and a reduction in the thickness of each of the third hydrogen barrier films 60, thereby achieving the higher integration of the capacitor element in the same manner as in the second variation. In the third variation, the thickness of the sixth hydrogen barrier film 68 has been adjusted to a range of 10 nm to 150 nm.

Variation 4 of Embodiment 3

A capacitor element according to a fourth variation of the third embodiment will be described herein below with reference to FIGS. 16A, 16B, 17A, and 17B.

FIGS. 16A, 16B, 17A, and 17B show principal-portion cross-sectional views of the capacitor element according to the fourth variation of the third embodiment. The same reference numerals will be retained for those of the components shown in FIGS. 16A, 16B, 17A, and 17B which are common to the components shown in FIGS. 12A, 12B, 13A, 13B, 14A, 14B, 15A, and 15B and the description thereof will not be repeated.

Because the characteristic portion of the capacitor element according to the fourth variation is that seventh hydrogen barrier films 69 are disposed, the description will be given mainly to the characteristic portion herein below.

Figure 16A:
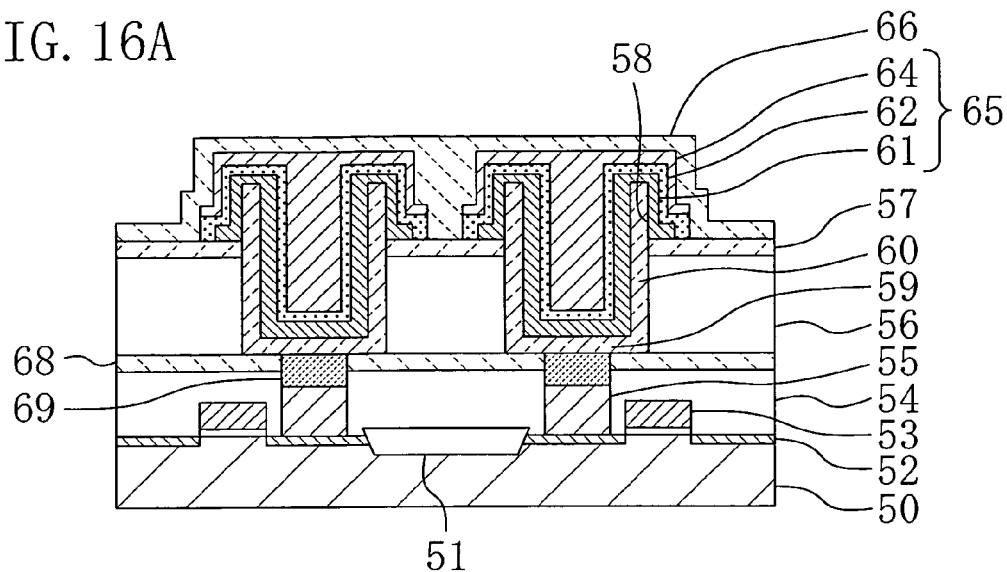
FIGS. 16A and 16B are principal-portion cross-sectional views of a capacitor element according to a fourth variation of the third embodiment.

First, the structure of the capacitor element according to the fourth variation shown in FIG. 16A is greatly different from the structure shown in FIG. 14A in that the seventh hydrogen barrier films 69 made of TiAlN are disposed in the uppermost layers of the plug contacts 55. The seventh hydrogen barrier films 69 are in contact with the sixth hydrogen barrier film 68 and with the lower surfaces of the fourth hydrogen barrier films 59.

Figure 16B:
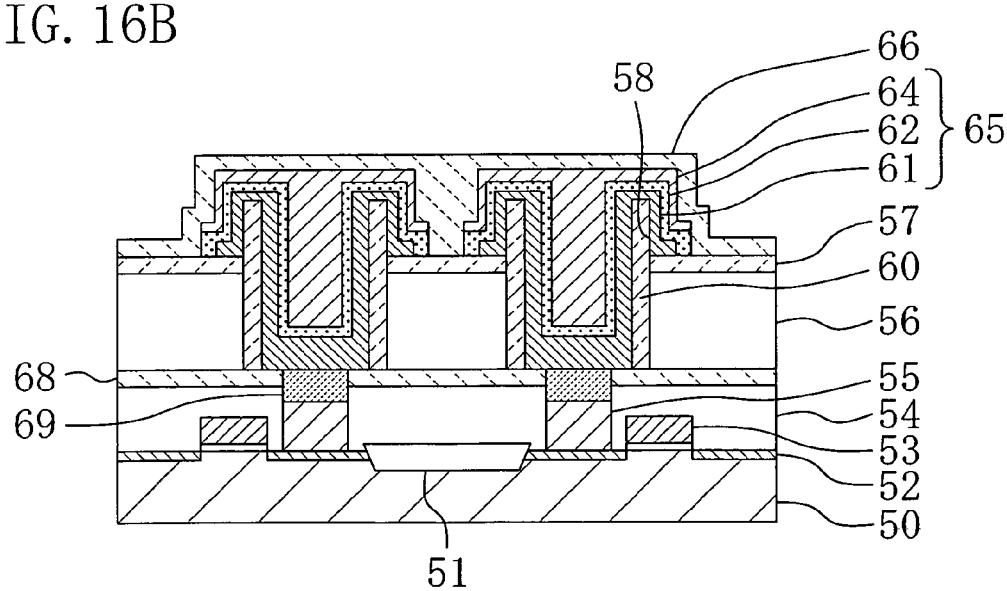

Next, the structure of the capacitor element according to the fourth variation shown in FIG. 16B is greatly different from the structure shown in FIG. 14B in that the seventh hydrogen barrier films 69 made of TiAlN are disposed in the uppermost layers of the plug contacts 55. The seventh hydrogen barrier films 69 are in contact with the sixth hydrogen barrier film 68 and with the lower surfaces of the lower electrodes 61.

Figure 17A:
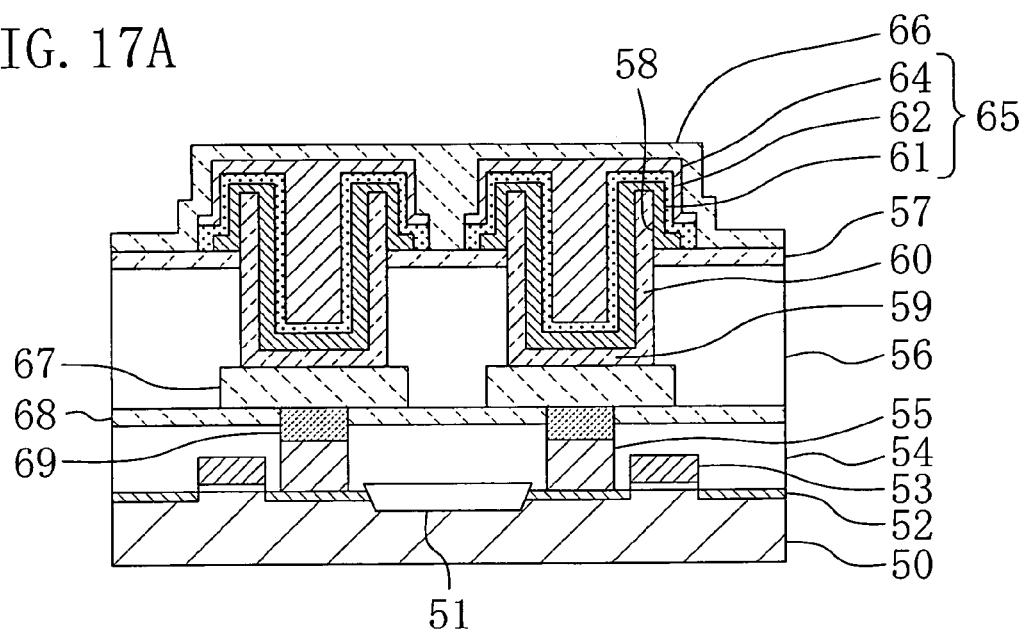
FIGS. 17A and 17B are principal-portion cross-sectional views of the capacitor element according to the fourth variation of the third embodiment.

Moreover, the structure of the capacitor element according to the fourth variation shown in FIG. 17A is greatly different from the structure shown in FIG. 15A in that the seventh hydrogen barrier films 69 made of TiAlN are disposed in the uppermost layers of the plug contacts 55. The seventh hydrogen barrier films 69 are in contact with the sixth hydrogen barrier film 68 and with the lower surfaces of the fifth hydrogen barrier films 67.

Figure 17B:
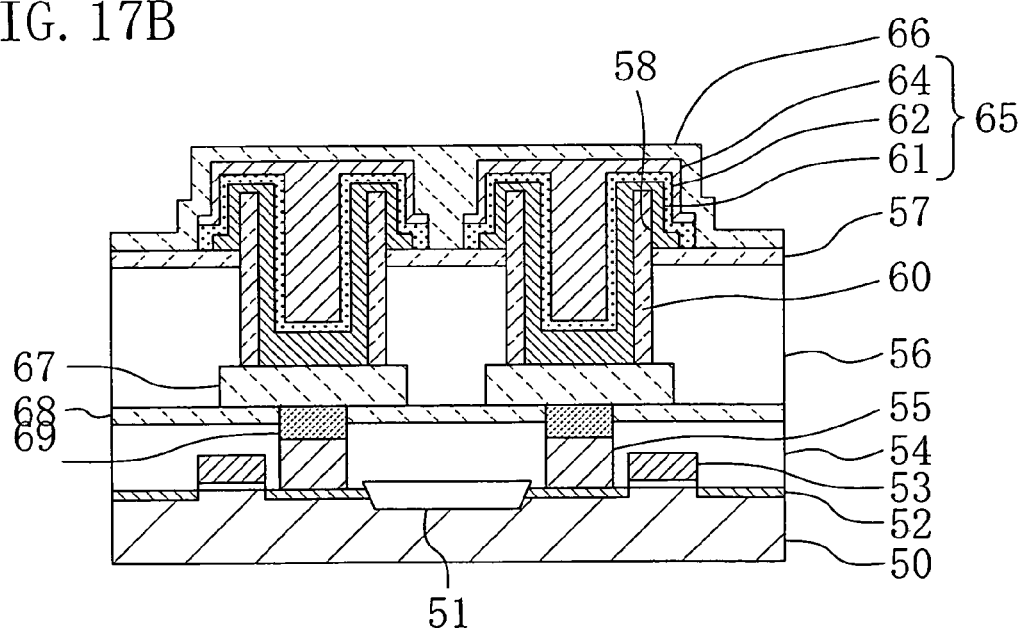

Furthermore, the structure of the capacitor element according to the fourth variation shown in FIG. 17B is greatly different from the structure shown in FIG. 15B in that the seventh hydrogen barrier films 69 made of TiAlN are disposed in the uppermost layers of the plug contacts 55. The seventh hydrogen barrier films 69 are in contact with the sixth hydrogen barrier film 68 and with the lower surfaces of the fifth hydrogen barrier films 67.

Thus, in the capacitor element shown in shown in FIGS. 16A, 16B, 17A, and 17B, the seventh hydrogen barrier films 69 are disposed in the uppermost layers of the plug contacts 55 so that the barrier property against the diffusion of hydrogen entering the capacitor element from the plug contacts 55 can further be enhanced. As a result, it becomes possible to prevent the degradation of the characteristics of the capacitor element 65 resulting from the reduction of the capacitor dielectric film 62 by hydrogen. In the capacitor elements shown in FIGS. 16B and 17B, the use of an insulating material for the third hydrogen barrier films 60 allows improved step coverage and a reduction in the thickness of each of the third hydrogen barrier films 60, thereby achieving the higher integration of the capacitor element as described above. In the fourth variation, the thicknesses of the seventh hydrogen barrier films 69 have been adjusted to a range of 10 nm to 150 nm.

It will easily be appreciated that the structure in which the sixth hydrogen barrier film 68 is not disposed can also be used in FIGS. 16A, 16B, 17A, and 17B, though it is not depicted.

Embodiment 4

A capacitor element according to the fourth embodiment of the present invention will be described herein below with reference to FIGS. 18A to 18C and FIGS. 19A to 19C.

FIGS. 18A to 18C and FIGS. 19A to 19C show cross-sectional views illustrating the process steps of a method for fabricating a capacitor element according to the fourth embodiment. Since the method for fabricating the capacitor element according to the fourth embodiment is a method for fabricating each of the capacitor elements described above in the third embodiment, the same reference numerals will be retained for those of the components shown in FIGS. 18A to 18C and FIGS. 19A to 19C which are common to the components of each of the capacitor elements described above in the third embodiment.

Figure 18A:
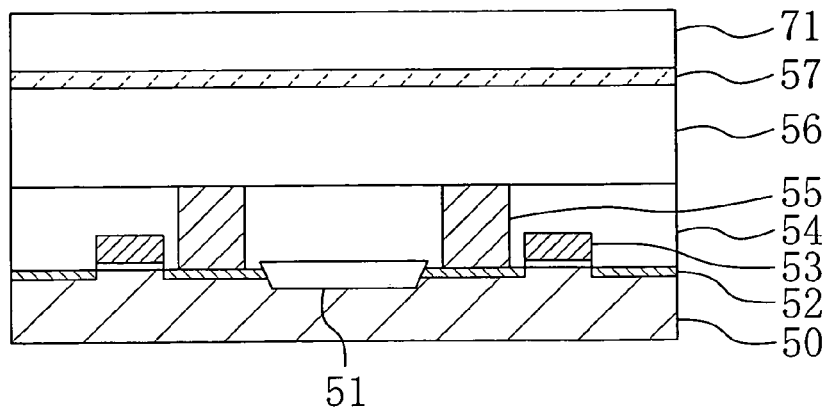
FIGS. 18A to 18C are principal-portion cross-sectional views illustrating the process steps of a method for fabricating a capacitor element according to a fourth embodiment of the present invention.

As shown in FIG. 18A, the isolation regions 51 and the active regions 52 are formed on the semiconductor substrate 50 and the gates 53 are further formed thereon.

Next, $SiO_2$ or SiN is deposited by CVD to cover the entire surface of the semiconductor substrate 50 and then planarized by CMP to form the lower-layer insulating film 54 with a thickness of 500 to 1000 nm.

Next, the contact holes for exposing the active regions 52 are formed in the lower-layer insulating film 54. Then, tungsten or low-resistance polysilicon doped with an n-type impurity is deposited by CVD over the entire surface of the lower-layer insulating film 54 including the insides of the contact holes. Thereafter, the tungsten or the low-resistance polysilicon doped with an n-type impurity that has been deposited on the upper surface of the lower-layer insulating film 54 is removed by CMP to form the plug contacts 55 (each with a diameter of 0.2 μm or less).

Next, the interlayer insulating film 56 made of $SiO_2$ is deposited by CVD over the lower-layer insulating film 54 and the plug contacts 55. Then, the first hydrogen barrier film 57 made of SiN with a thickness of 10 nm or more is deposited by CVD to cover the upper surface of the interlayer insulating film 56. Further, an upper-layer insulating film 71 made of $SiO_2$ with a thickness of 20 to 200 nm is deposited by CVD on the first hydrogen barrier film 57. The thickness of the upper-layer insulating film 71 corresponds to the distance from the upper surface of the first hydrogen barrier film 57 to the upper surface of each of the third hydrogen barrier films 60, which will be described later.

Figure 18B:
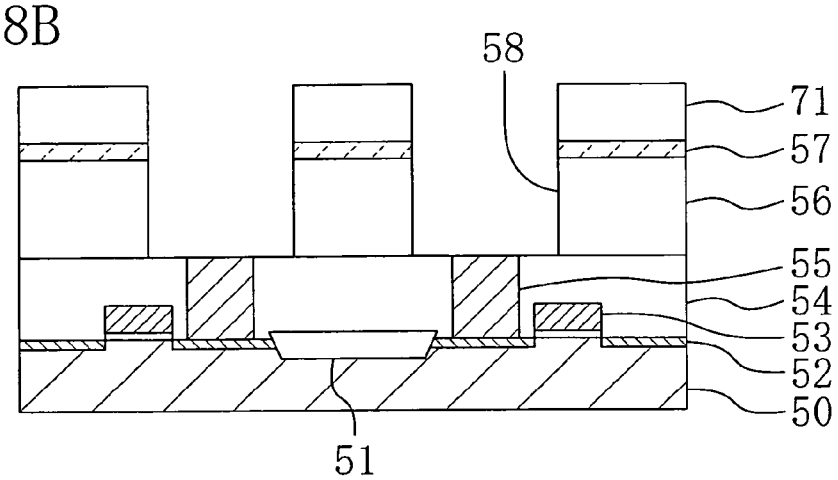

Next, as shown in FIG. 18B, the holes 58 (each having a diameter of 0.2 to 1 μm) for exposing the upper ends of the plug contacts 55 are formed by dry etching in the upper-layer insulating film 71, the first hydrogen barrier film 57, and the interlayer insulating film 56.

Figure 18C:
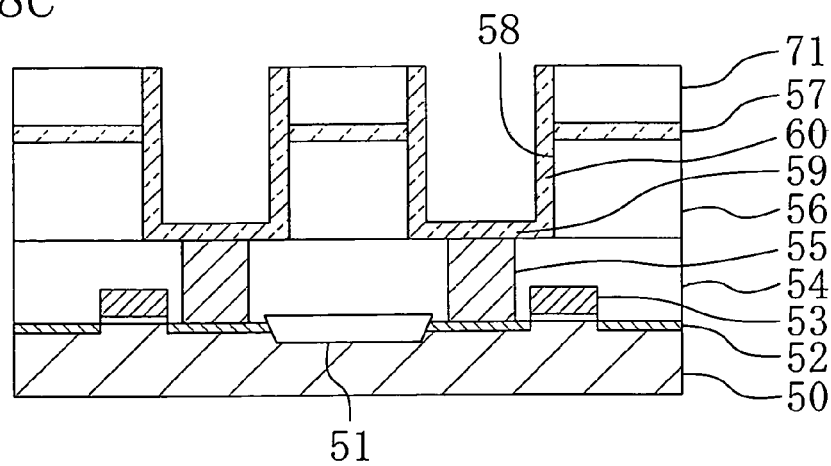

As shown in FIG. 18C, a hydrogen barrier material made of conductive TiAlN with a thickness of 10 nm or more is deposited by sputtering or CVD over the inner walls and bottom portions of the holes 58 and the upper-layer insulating film 71. Then, the hydrogen barrier material on the upper-layer insulating film 71 is removed by CMP or an etch-back process to form the third hydrogen barrier films 60 disposed on the inner walls of the holes 58 and having a thickness of 10 nm or more and the fourth hydrogen barrier films 59 disposed on the bottom portions of the holes 58 and having a thickness of 10 nm or more. The third hydrogen barrier films 60 are in contact with the first hydrogen barrier film 57 exposed at the inner walls of the holes 58, while the fourth hydrogen barrier films 59 are in contact with the plug contacts 55 exposed at the bottom portions of the holes 58. Although the present embodiment has described the case where the fourth and third hydrogen barrier films 59 and 60 are made of the same material and can be formed in the same step, they may also be formed in different steps.

Figure 19A:
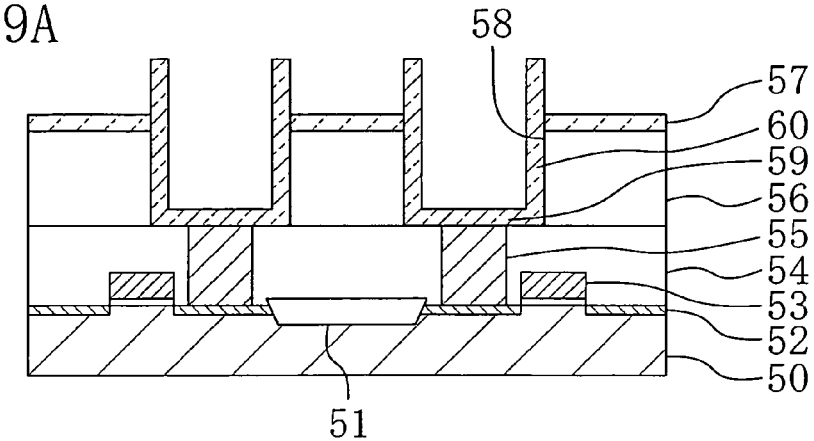
FIGS. 19A to 19C are principal-portion cross-sectional views illustrating the process steps of the method for fabricating the capacitor element according to the fourth embodiment.

Next, as shown in FIG. 19A, only the upper-layer insulating film 71 is selectively removed, whereby the formation of the third hydrogen barrier films 60 each having a cylindrical configuration is completed. As a method for selectively removing only the upper-layer insulating film 71, there is used a process in which the etching rate ratio between the upper-layer insulating film 71 and the first hydrogen barrier film 57 is 10:1 or more and the etching rate ratio between the upper-layer insulating film 71 and the third hydrogen barrier films 60 is 10:1 or more. Specifically, wet etching using a hydrofluoric acid, dry etching using a gas mixture of fluorine and oxygen, or the like is used.

Figure 19B:
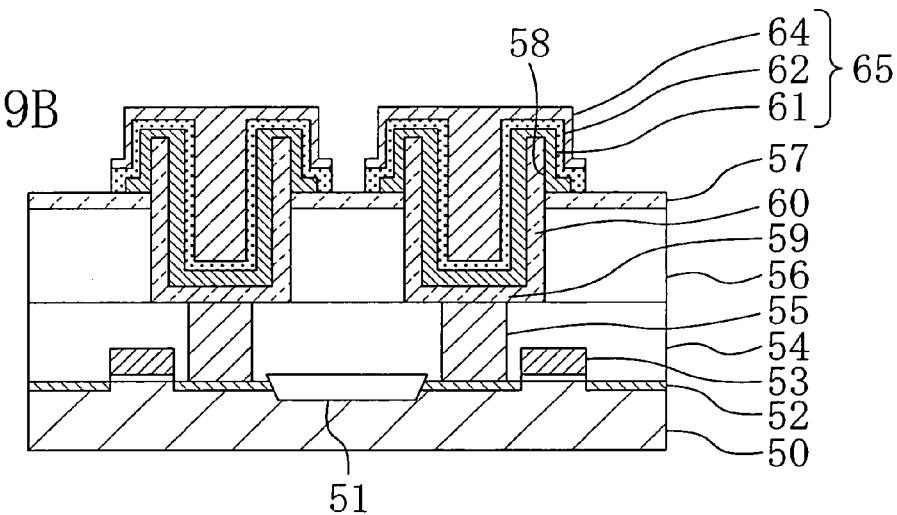

Next, as shown in FIG. 19B, an electrode material composed of Pt/IrO$_2$/Ir multiple layers (in a top-to-bottom stacking order) is formed by sputtering or CVD over the surfaces of the third hydrogen barrier films 60 and the first hydrogen barrier film 57. Then, the electrode material is processed into a desired configuration by dry etching using a gas containing chlorine, thereby forming the lower electrodes 61. In the dry etching, it is necessary to prevent the first hydrogen barrier film 57 from being completely removed when the processing of the electrode material is completed and the first hydrogen barrier film 57 is exposed. The IrO$_2$/Ir layers contained in the lower electrodes 61 are oxygen barrier films for preventing an increase in contact resistance caused by oxygen reaching the plug contact 55 during annealing in an atmosphere containing oxygen at a high temperature (600° C. to 800° C.), which is indispensable to the crystallization of the capacitor dielectric films, as described above. The thicknesses of the Pt, IrO$_2$, and Ir films composing the lower electrodes 61 are in a range of 10 nm to 50 nm.

Next, a dielectric thin film made of SrBi$_2$(Ta$_x$Nb$_{1-x}$)$_2$O$_9$ (0≦x≦1) is formed over the upper and side surfaces of the plurality of lower electrodes 61 and the upper surfaces of the first hydrogen barrier film 57. To cover the lower electrodes 61 each having the cylindrical three-dimensional structure, the dielectric thin film is formed by metal organic chemical vapor deposition (MOCVD). The thickness of the dielectric thin film is in a range of 12.5 nm to 100 nm. After the deposition of the dielectric thin film, a thermal process in an atmosphere containing oxygen at a high temperature ranging from 600° C. to 800° C. is performed for crystallization. The thermal process is performed in a furnace or an RTA (Rapid Thermal Anneal) system.

Figure 19C:
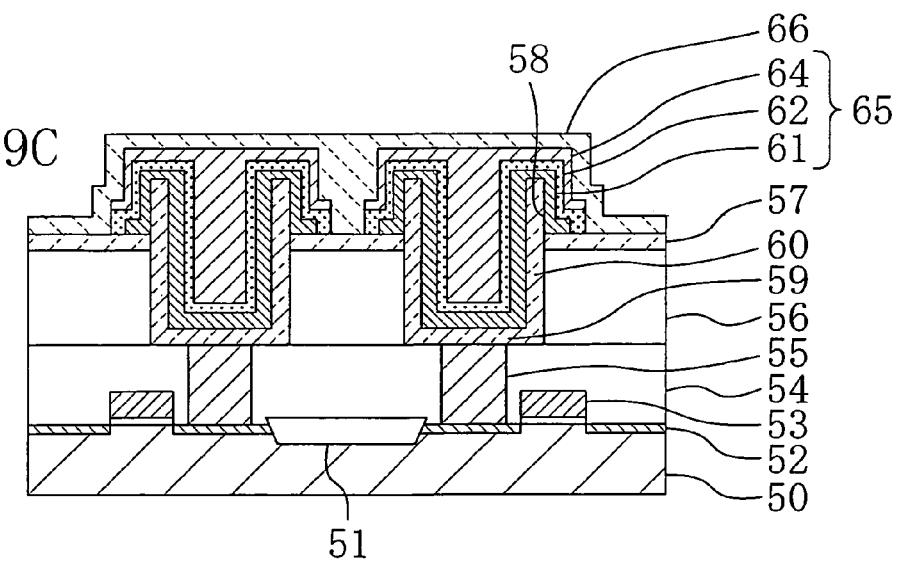
Figure 20:
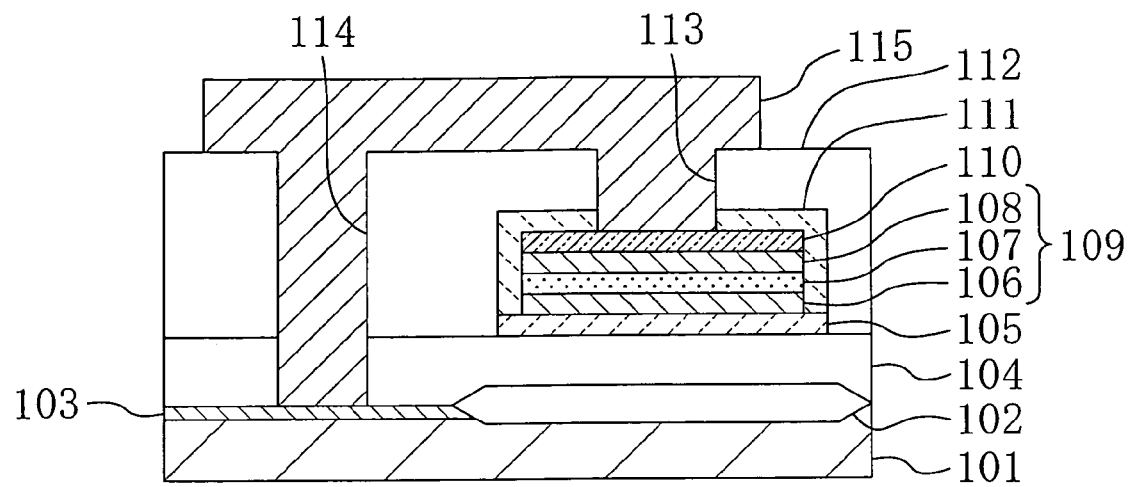
FIG. 20 is a principal-portion cross-sectional view of a capacitor element according to a first conventional embodiment.
Figure 21:
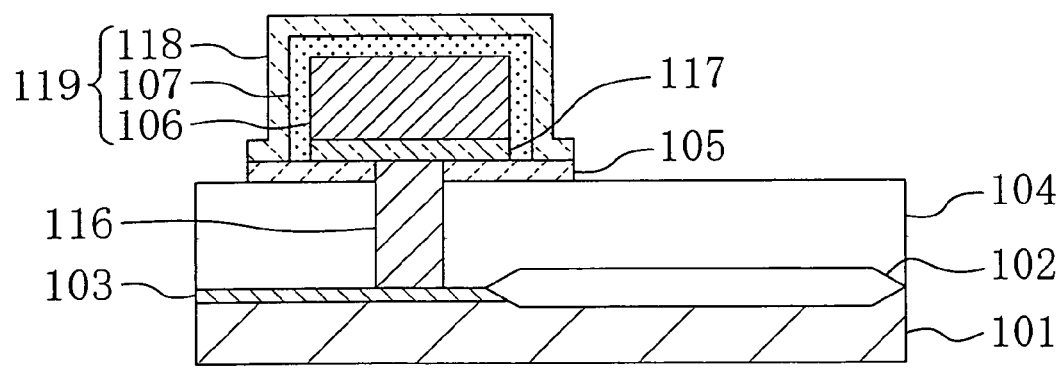
FIG. 21 is a principal-portion cross-sectional view of a capacitor element according to a second conventional embodiment.
Figure 22:
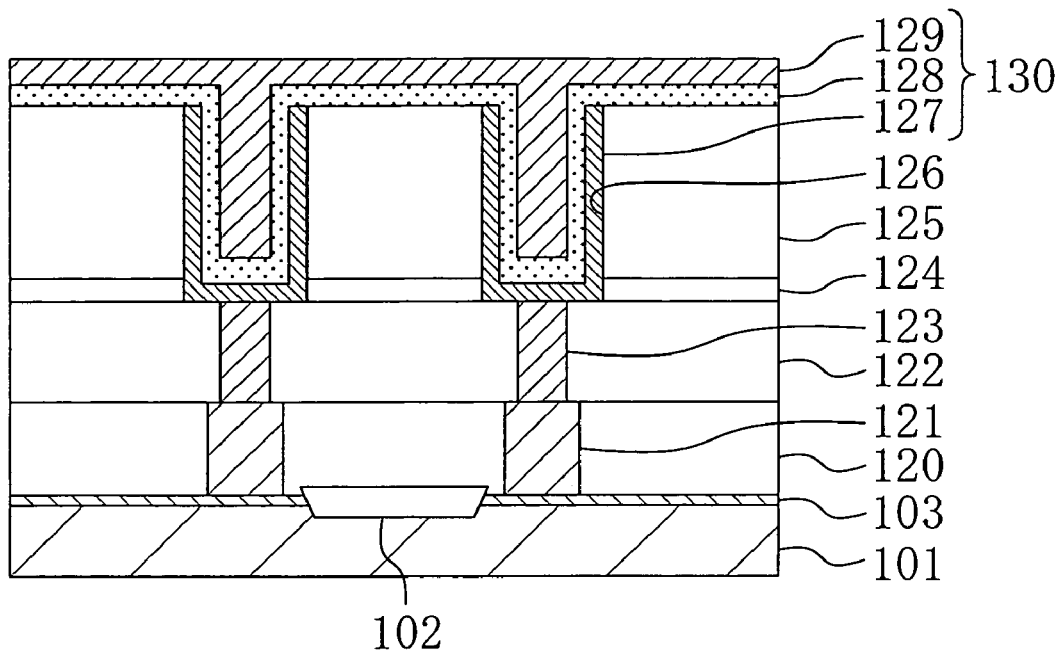
FIG. 22 is a principal-portion cross-sectional view of a capacitor element according to a third conventional embodiment.
Figure 23:
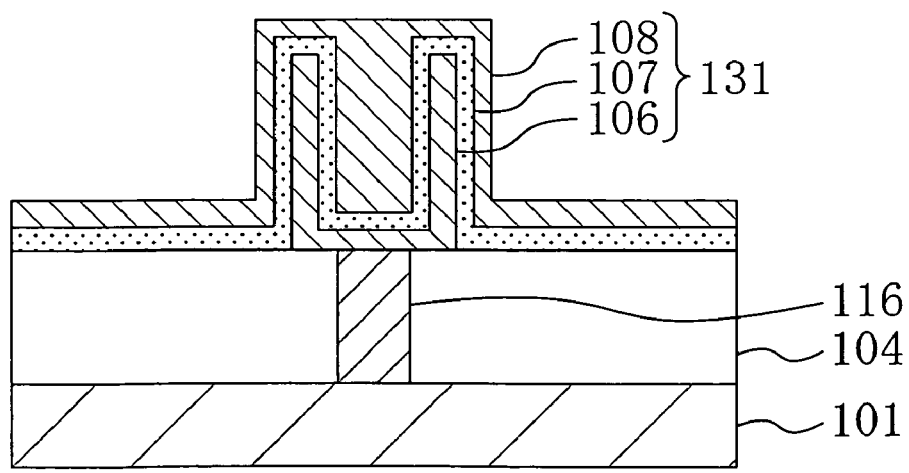
FIG. 23 is a cross-sectional view of a principal portion of a capacitor element according to a fourth conventional embodiment.
Figure 24:
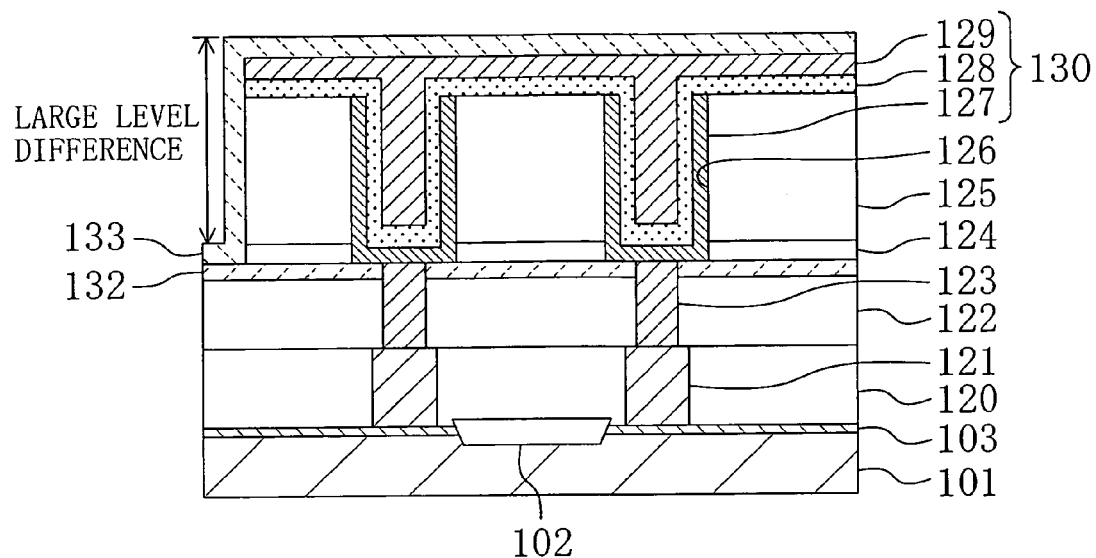
FIG. 24 is a principal-portion cross-sectional view showing a structure in which the capacitor element according to the third conventional embodiment is covered with hydrogen barrier films.
Figure 25:
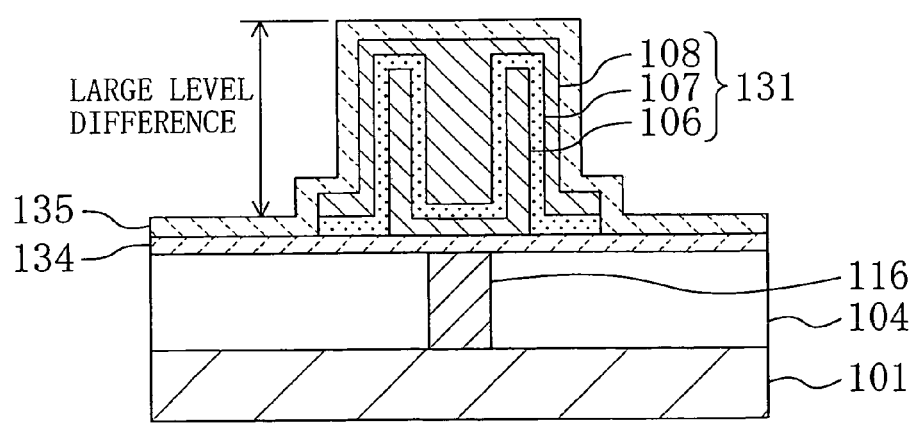
FIG. 25 is a principal-portion cross-sectional view showing a structure in which the capacitor element according to the fourth conventional embodiment is covered with hydrogen barrier films.

As shown in FIG. 12B, the contact holes 63 for exposing the lower electrodes 61 are formed by performing etching with respect to the dielectric thin film, though they are not shown in FIGS. 19A to 19C. In this case, dry etching using a gas containing fluorine is performed. The contact holes 63 function to provide connection between the upper and lower electrodes 64 and 61, which will be described later. This allows electric signals to be transmitted to the upper electrodes 64 via the lower electrodes 61.

Next, an electrode material made of Pt is deposited to cover the upper and side surfaces of the dielectric thin film and the sidewalls and bottom portions of the contact holes 63. Then, dry etching using a gas containing chlorine or fluorine is performed to process each of the electrode material and the dielectric thin film into a desired configuration, thereby forming the capacitor dielectric films 62 and the upper electrodes 64.

The thicknesses of the upper electrodes 64 are in a range of 10 nm to 50 nm. In the dry etching, it is necessary to prevent the first hydrogen barrier film 57 from being completely removed when the processing of the electrode material and the dielectric thin film is completed and the first hydrogen barrier film 57 is exposed. Thus, the capacitor elements 65 for information storage each composed of the lower electrode 61, the capacitor dielectric film 62, and the upper electrode 64 and having the cylindrical three-dimensional configuration is completed.

Next, the second hydrogen barrier film 66 made of Al$_2$O$_3$ or TiAlN is formed by CVD or sputtering to cover the upper surface and sidewalls of each of the capacitor elements 65 positioned higher in level than the first hydrogen barrier film 57. The second hydrogen barrier film 66 is inevitably in contact with the first hydrogen barrier film 57 in the regions in which the upper electrodes 64 and the capacitor dielectric films 62 are not formed. Consequently, each of the capacitor elements 65 is completely covered with the first, second, third, and fourth hydrogen barrier films 57, 66, 60, and 59. This prevents the degradation of the characteristics of the capacitor elements resulting from the reduction of the capacitor dielectric films 62 by hydrogen.

Even after the formation of the structure in which the capacitor element is completely covered with the hydrogen barrier films, a large level difference as observed in the conventional embodiments is not produced. This allows easy obtention of a focus margin in a range achievable with the performance of a stepper in a lithographic step during wiring formation performed after the formation of the capacitor elements 65. Moreover, since the level differences present in the step of forming the second hydrogen barrier film 66 covering the upper portion and sidewalls of the capacitor element 65 is also extremely small, a focus margin in a range achievable with the performance of a stepper in a lithographic step performed to form a mask pattern for processing the hydrogen barrier film 66 can also be obtained easily.

Variation 1 of Embodiment 4

A method for fabricating the capacitor element according to a first variation of the fourth embodiment will be described herein below with reference to FIGS. 13A, 18A to 18C, and 19A to 19C. Because the method for fabricating the capacitor element according to the first variation of the fourth embodiment is a method for fabricating the capacitor element shown in FIG. 13A and is characterized in that the fifth hydrogen barrier films 67 are disposed, the description will be given mainly to the characteristic portion herein below.

As shown in FIG. 13A, the steps prior to and inclusive of the step of forming the plug contacts 55 are the same as in the description given above with reference to FIG. 18A.

Next, the hydrogen barrier material made of TiAlN is deposited entirely over the lower-layer insulating film 54 and the plug contacts 55. Then, the hydrogen barrier material is processed into a desired configuration by dry etching using a gas containing chlorine to form the fifth hydrogen barrier films 67 each having a thickness in a range of 10 to 100 nm.

Next, an insulating film made of $SiO_2$ is deposited on the lower-layer insulating film 54 to cover the fifth hydrogen barrier films 67. Then, the insulating film is planarized by CMP to form the interlayer insulating film 56. The thickness of the interlayer insulating film 56 is controlled to be 300 to 1000 nm over the fifth hydrogen barrier films 67.

Next, the first hydrogen barrier film 57 made of SiN is formed by CVD on the interlayer insulating film 56. Since it is sufficient for the first hydrogen barrier film 57 to have a minimum thickness that can prevent the diffusion of hydrogen or more, the thickness of the first hydrogen barrier film 57 is adjusted to 10 nm or more. Then, the upper-layer insulating film 71 (with a thickness of 20 nm to 200 nm) is further formed by CVD on the first hydrogen barrier film 57.

The subsequent steps are the same as in FIGS. 18B, 18C, and 19A to 19C described above.

Thus, the provision of the fifth hydrogen barrier films 67 allows the enhancement of the barrier property against the diffusion of hydrogen into the capacitor elements 65 from therebelow.

Variation 2 of Embodiment 4

A method for fabricating the capacitor element according to a second variation of the fourth embodiment will be described herein below with reference to FIGS. 13B, 18A to 18C, and 19A to 19C. The method for fabricating the capacitor element according to the second variation of the fourth embodiment is a method for fabricating the capacitor element shown in FIG. 13B and is characterized in that only the third hydrogen barrier films 60 disposed on the sidewalls of the holes 58 are formed and the fifth hydrogen barrier films 67 are disposed. Since the method for disposing the fifth hydrogen barrier films 67 has been described above in the first variation, the description will be given mainly to a method for disposing only the third hydrogen barrier films 60 on the sidewalls of the holes 58 herein below.

As shown in FIG. 13B, the steps prior to and inclusive of the step of forming the plug contacts 55 are the same as in the description given above with reference to FIG. 18A.

Next, the hydrogen barrier material made of TiAlN is deposited entirely over the lower-layer insulating film 54 and the plug contacts 55. Then, the hydrogen barrier material is processed into a desired configuration by dry etching using a gas containing chlorine to form the fifth hydrogen barrier films 67 each having a thickness in a range of 10 to 100 nm.

As shown in FIG. 13B, the steps prior to and inclusive of the step of forming the plug contacts 55 are the same as in the description given above with reference to FIG. 18A. In addition, the steps prior to and inclusive of the step of forming the fifth and first hydrogen barrier films 67 and 57 and the upper-layer insulating film 71 are the same as described above in the first variation of the fourth embodiment. Further, the step of forming the holes 58 is the same as the step shown in FIG. 18B described above.

Next, an insulating hydrogen barrier material such as SiN or $Al_2O_3$ or the hydrogen barrier material made of TiAlN is deposited on the entire surface of the upper-layer insulating film 71 by sputtering or CVD to cover the bottom portions and sidewalls of the holes 58.

Next, an etch-back process is performed by anisotropic dry etching with respect to the entire surface of the substrate, thereby forming the third hydrogen barrier films 60 only on the sidewalls of the holes 58. The dry etching process uses a gas containing fluorine or chlorine.

The structure in which only the third hydrogen barrier films 60 are disposed on the sidewalls of the holes 58 and the fourth hydrogen barrier films 59 are not disposed on the bottom portions of the holes 58 offers the advantage of allowing the use of the insulating hydrogen barrier material for the third hydrogen barrier films 60. In other words, the range of choices among materials to be used for the third hydrogen barrier films 60 can be widened advantageously.

The subsequent steps are the same as in the description given above with reference to FIGS. 19A to 19C.

Variation 3 of Embodiment 4

A method for fabricating the capacitor element according to a third variation of the fourth embodiment will be described herein below with reference to FIGS. 14A, 14B, 15A, 15B, 18A to 18C, and 19A to 19C. The method for fabricating the capacitor element according to the third variation of the fourth embodiment is a method for fabricating the capacitor element shown in FIGS. 14A, 14B, 15A, and 15B. In contrast to the first and second variations described above, the third variation is characterized in that the sixth hydrogen barrier film 68 is disposed so that the description will be given mainly to a method for disposing the sixth hydrogen barrier film 68 herein below.

As shown in FIGS. 14A, 14B, 15A, and 15B, the isolation region 51 and the active regions 52 are formed on the semiconductor substrate 50 and the gates 53 are further formed thereon.

Next, $SiO_2$ or SiN is deposited to cover the entire surface of the semiconductor substrate 50 by CVD and then planarized by CMP (Chemical Mechanical Polishing) to form the lower-layer insulating film 54 having a thickness of 500 to 1000 nm.

Next, the sixth hydrogen barrier film 68 made of SiN, $Al_2O_3$, or TiAlO is deposited on the lower-layer insulating film 54 by CVD or sputtering. The thickness of the sixth hydrogen barrier film 68 is in a range of 10 to 150 mm.

Next, the contact holes connecting to the active regions 52 are formed in the sixth hydrogen barrier film 68 and the lower-layer insulating film 54 by dry etching.

Next, tungsten or low-resistance polysilicon doped with an n-type impurity is deposited on the entire surface of the sixth hydrogen barrier film 68 including the insides of the contact holes by CVD. Then, the tungsten or low-resistance polysilicon doped with an n-type impurity that has been deposited on the sixth hydrogen barrier film 68 is removed by CMP to form the plug contacts 55.

In the case of forming the capacitor elements shown in FIG. 14A, the interlayer insulating film 56, the first hydrogen barrier film 57, and the upper-layer insulating film 71 are deposited subsequently over the sixth hydrogen barrier film 68 and the plug contacts 55 in the same manner as in the step shown in FIG. 18A. As for the subsequent steps, they are the same as shown in FIGS. 18B, 18C, 19A to 19C.

In the case of forming the capacitor elements shown in FIG. 14B, the interlayer insulating film 56, the first hydrogen barrier film 57, and the upper-layer insulating film 71 are deposited over the sixth hydrogen barrier film 68 and the plug contacts 55 in the same manner as in the step shown in FIG. 18A. Thereafter, the holes 58 are formed in the same manner as described above in the second variation and then the third hydrogen barrier films 60 are disposed on the sidewalls of the holes 58. As for the subsequent steps, they are the same as shown in FIGS. 19A to 19C.

In the case of forming the capacitor elements shown in FIG. 15A, the fifth hydrogen barrier films 67 in contact with the upper ends of the plug contacts 55 are formed over the sixth hydrogen barrier film 68 and the plug contacts 55 in the same manner as described above in the first variation. As for the subsequent steps, they may be performed appropriately in the same manner as described above in the first variation.

In the case of forming the capacitor elements shown in FIG. 15B, the fifth hydrogen barrier films 67 in contact with the upper ends of the plug contacts 55 are formed over the sixth hydrogen barrier film 68 and the plug contacts 55 in the same manner as described above in the second variation. As for the subsequent steps, they may be performed appropriately in the same manner as described above in the second variation.

By thus providing the sixth hydrogen barrier film 68, the barrier property against the diffusion of hydrogen into the capacitor elements 65 from therebelow can be enhanced.

Variation 4 of Embodiment 4

A method for fabricating the capacitor element according to a fourth variation of the fourth embodiment will be described herein below with reference to FIGS. 16A, 16B, 17A, 17B, 18A to 18C, and 19 to 19C. The method for fabricating the capacitor element according to the fourth variation of the fourth embodiment is a method for fabricating the capacitor element shown in FIGS. 16A, 16B, 17A, and 17B. In contrast to the first to third variations described above, the fourth variation is characterized in that the seventh hydrogen barrier films 69 are disposed so that the description will be given mainly to a method for disposing the seventh hydrogen barrier films 69 herein below.

As shown in FIGS. 16A, 16B, 17A, and 17B, the isolation region 51 and the active regions 52 are formed on the semiconductor substrate 50 and the gates 53 are further formed thereon.

Next, SiO$_2$ or SiN is deposited to cover the entire surface of the semiconductor substrate 50 by CVD and then planarized by CMP (Chemical Mechanical Polishing) to form the lower-layer insulating film 54 each having a thickness of 500 to 1000 nm.

Next, the sixth hydrogen barrier film 68 made of SiN, Al$_2$O$_3$, or TiAlO is deposited on the lower-layer insulating film 54 by CVD or sputtering. The thickness of the sixth hydrogen barrier film 68 is in a range of 10 to 150 nm.

Next, the contact holes connecting to the active regions 52 are formed in the sixth hydrogen barrier film 68 and the lower-layer insulating film 54 by dry etching.

Next, tungsten or low-resistance polysilicon doped with an n-type impurity is deposited on the entire surface of the sixth hydrogen barrier film 68 including the insides of the contact holes by CVD. Then, the tungsten or low-resistance polysilicon doped with an n-type impurity that has been deposited on the sixth hydrogen barrier film 68 is removed by CMP to form the plug contacts 55.

Next, a dry etching process is performed to etch back the tungsten or the low-resistance polysilicon inside each of the plug contacts 55, thereby forming recesses. The etch-back process uses a gas containing fluorine. The depth of each of the recesses is in a range of 20 to 100 nm.

Next, the hydrogen barrier material made of TiAlN with a thickness of 10 to 150 nm is deposited on the entire surface of the substrate to be buried in the recesses formed in the plug contacts 55.

Next, the portions of the hydrogen barrier material which have been deposited outside the recesses are removed by CMP or an etch-back process to form the seventh hydrogen barrier films 69 only in the recesses.

In the case of forming the capacitor elements shown in FIG. 16A, the interlayer insulating film 56, the first hydrogen barrier film 57, and the upper-layer insulating film 71 are deposited subsequently over the sixth hydrogen barrier film 68 and the plug contacts 55 in the same manner as in the step shown in FIG. 18A. As for the subsequent steps, they are the same as shown in FIGS. 18B, 18C, and 19A to 19C.

In the case of forming the capacitor elements shown in FIG. 16B, the interlayer insulating film 56, the first hydrogen barrier film 57, and the upper-layer insulating film 71 are deposited over the sixth hydrogen barrier film 68 and the plug contacts 55 in the same manner as in the step shown in FIG. 18A. Thereafter, the holes 58 are formed in the same manner as described above in the second variation and then the third hydrogen barrier films 60 are disposed on the sidewalls of the holes 58. As for the subsequent steps, they are the same as shown in FIGS. 19A to 19C.

In the case of forming the capacitor elements shown in FIG. 17A, the fifth hydrogen barrier films 67 in contact with the upper surfaces of the seventh hydrogen barrier films 69 are formed over the sixth hydrogen barrier film 68 and the seventh hydrogen barrier films 69 in the same manner as described above in the first variation. As for the subsequent steps, they may be performed appropriately in the same manner as described above in the first variation.

In the case of forming the capacitor elements shown in FIG. 17B, the fifth hydrogen barrier films 67 in contact with the upper surfaces of the seventh hydrogen barrier films 69 are formed over the sixth hydrogen barrier film 68 and the seventh hydrogen barrier films 69 in the same manner as described above in the second variation. As for the subsequent steps, they may be performed appropriately in the same manner as described above in the second variation.

Thus, the present invention is useful for the capacitor element having a three-dimensional structure using a ferroelectric material or a high dielectric material for the capacitor dielectric film thereof and the fabrication method therefor.

What is claimed is:

1. A capacitor element comprising:

an interlayer insulating film formed over a substrate;

a first hydrogen barrier film formed on the interlayer insulating film, wherein a hole is formed in the interlayer insulating film and the first hydrogen barrier film;

a capacitor element comprising a lower electrode, a capacitor dielectric film of a ferroelectric material or a high dielectric material and an upper electrode, each of which being formed in a region extending from within the hole toward a position above the first hydrogen barrier film; and a second hydrogen barrier film formed over the capacitor element and the first hydrogen barrier film, wherein the second hydrogen barrier film is in contact with the first hydrogen barrier film in a periphery of the capacitor element, while covering the entire top surface of the capacitor element;

wherein the first hydrogen barrier film is formed of an insulating material different from that of the interlayer insulating film; and wherein an edge portion of the capacitor dielectric film is in contact with the first hydrogen barrier film.

2. The capacitor element of claim 1, wherein a third hydrogen barrier film in contact with the first hydrogen barrier film is disposed on a sidewall of the hole.

3. The capacitor element of claim 2, wherein
a fifth hydrogen barrier film having an upper surface of a size not smaller than a bottom portion of the hole is disposed under the hole and
the fifth hydrogen barrier film and the third hydrogen barrier film are in contact with each other.

4. The capacitor element of claim 3, wherein
a lower-layer insulating film provided with a buried plug made of a conductive material is formed under the interlayer insulating film and
the buried plug has an upper end thereof in contact with a lower surface of the fifth hydrogen barrier film.

5. The capacitor element of claim 4, wherein
a sixth hydrogen barrier film formed to surround the buried plug is disposed in an uppermost layer of the lower-layer insulating film and
the sixth hydrogen barrier film is in contact with the fifth hydrogen barrier film.

6. The capacitor element of claim 5, wherein
a seventh hydrogen barrier film is disposed in an uppermost layer of the buried plug and
the seventh hydrogen barrier film is in contact with the fifth hydrogen barrier film.

7. The capacitor element of claim 4, wherein
a seventh hydrogen barrier film is disposed in an uppermost layer of the buried plug and
the seventh hydrogen barrier film is in contact with the fifth hydrogen barrier film.

8. The capacitor element of claim 2, wherein
a lower-layer insulating film provided with a buried plug made of a conductive material is formed under the interlayer insulating film and
the buried plug has an upper end thereof in contact with a bottom portion of the hole.

9. The capacitor element of claim 8, wherein
a sixth hydrogen barrier film formed to surround the buried plug is disposed in an uppermost layer of the lower-layer insulating film and
the sixth hydrogen barrier film is in contact with the bottom portion of the hole.

10. The capacitor element of claim 9, wherein
a seventh hydrogen barrier film is disposed in an uppermost layer of the buried plug and
the seventh hydrogen barrier film is in contact with the bottom portion of the hole.

11. The capacitor element of claim 8, wherein
a seventh hydrogen barrier film is disposed in an uppermost layer of the buried plug and
the seventh hydrogen barrier film is in contact with the bottom portion of the hole.

12. The capacitor element of claim 1, wherein
a third hydrogen barrier film in contact with the first hydrogen barrier film is disposed on a sidewall of the hole, and
a fourth hydrogen barrier film in contact with the third hydrogen barrier film is disposed on a bottom portion of the hole.

13. The capacitor element of claim 12, wherein a fifth hydrogen barrier film in contact with at least the fourth hydrogen barrier film is disposed under the hole.

14. A capacitor element comprising:
an interlayer insulating film formed over a substrate;
a first hydrogen barrier film of SiN formed on the interlayer insulating film, wherein a hole is formed in the interlayer insulating film and the first hydrogen barrier film;
a capacitor element comprising a lower electrode, a capacitor dielectric film of a ferroelectric material or a high dielectric material and an upper electrode, each of which being formed in a region extending from within the hole toward a position above the first hydrogen barrier film; and
a second hydrogen barrier film formed over the capacitor element and the first hydrogen barrier film, wherein the second hydrogen barrier film is in contact with the first hydrogen barrier film;
wherein the interlaYer insulating film is formed of a material different from that of the first hydrogen barrier film; and
wherein an edge portion of the capacitor dielectric film is in contact with the first hydrogen barrier film.

15. The capacitor element of claim 14, wherein a third hydrogen barrier film in contact with the first hydrogen barrier film is disposed on a sidewall of the hole.

16. The capacitor element of claim 15, wherein
a lower-layer insulating film provided with a buried plug made of a conductive material is formed under the interlayer insulating film and
the buried plug has an upper end thereof in contact with a bottom portion of the hole.

17. The capacitor element of claim 14, wherein
a third hydrogen barrier film in contact with the first hydrogen barrier film is disposed on a sidewall of the hole, and
a fourth hydrogen barrier film in contact with the third hydrogen barrier film is disposed on a bottom portion of the hole.

* * * * *